United States Patent
Barbato

(10) Patent No.: US 10,510,768 B2
(45) Date of Patent: Dec. 17, 2019

(54) 3D MEMORY DEVICE WITH U-SHAPED MEMORY CELL STRINGS

(71) Applicant: Sabrina Barbato, Turate (IT)

(72) Inventor: Sabrina Barbato, Turate (IT)

(73) Assignee: Trinandable S.r.l., Milan (IT)

( * ) Notice: Subject to any disclaimer, the term of this patent is extended or adjusted under 35 U.S.C. 154(b) by 0 days.

(21) Appl. No.: 15/991,181

(22) Filed: May 29, 2018

(65) Prior Publication Data

US 2018/0350832 A1     Dec. 6, 2018

(30) Foreign Application Priority Data

Jun. 6, 2017 (IT) .......................... 102017000061469

(51) Int. Cl.
*G11C 15/02* (2006.01)
*H01L 27/11582* (2017.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC ......... H01L 27/11582; H01L 27/11519; H01L 27/11568; H01L 27/11565;
(Continued)

(56) References Cited

U.S. PATENT DOCUMENTS 9,218,874 B1   12/2015  Koh et al.
9,391,087 B2 *  7/2016  Shibata ................... G11C 8/14
(Continued)

*Primary Examiner* — Tha-O H Bui
(74) *Attorney, Agent, or Firm* — Janeway Patent Law, PLLC; John M. Janeway

(57) ABSTRACT

A 3D memory device comprises: a substrate; a plurality of U-shaped memory cells strings each including a first, bit line-side string portion or pillar, a second, source line-side string portion or pillar and a buried string portion formed in the substrate and connected to a first end of the first string portion and to a first end of the second string portion, the U-shaped memory cells strings including stacks of memory cells along the first and second string portions. Bit line selectors are arranged at a second end of the first string portions opposed to the first end, for the selective connection to respective bit lines; source line selectors are arranged at a second end of the second string portions opposed to the first end, for the selective connection to respective source lines. There are first groups of first string portions, wherein in each first group the first string portions are aligned along a first direction to form a respective first row of first string portions; there are second groups of second string portions, wherein in each second group the second string portions are aligned along the first direction to form a respective second row of second string portions. The first rows of first string portions and the second rows of second string portions follow one another, alternately or in pairs, along a second direction transversal to the first direction. First rows of first string portions and/or second rows of second string portions consecutive along said second direction are spaced apart from each other a respective distance. Between a first row of first string portions and a second row of second string portions being consecutive along the second direction and spaced apart a distance equal to or less than a minimum distance allowed by the resolution of the manufacturing technology a respective slit is formed that extends in a third direction, orthogonal to the first and second directions, from the second end down to the substrate, the slit, interrupting layers forming the bit line selectors and the source line selectors and control gates of the memory cells of the memory cells stacks, with dimension, along the second direction, less than, equal to or higher than the minimum (Continued)

distance, and walls of the slit lying in planes parallel to the first and third directions delimit the first and second string portions.

8 Claims, 55 Drawing Sheets

(51) Int. Cl.
*H01L 27/11556* (2017.01)
*H01L 27/1157* (2017.01)
*H01L 27/11519* (2017.01)
*H01L 27/11524* (2017.01)
*H01L 27/11565* (2017.01)
*H01L 27/11526* (2017.01)
*H01L 27/11548* (2017.01)
*H01L 27/11573* (2017.01)
*H01L 27/11575* (2017.01)
*G11C 16/24* (2006.01)
*G11C 16/04* (2006.01)

(52) U.S. Cl.
CPC .. *H01L 27/11524* (2013.01); *H01L 27/11526* (2013.01); *H01L 27/11548* (2013.01); *H01L 27/11556* (2013.01); *H01L 27/11565* (2013.01); *H01L 27/11573* (2013.01); *H01L 27/11575* (2013.01); *G11C 16/0483* (2013.01); *G11C 16/24* (2013.01)

(58) Field of Classification Search
CPC ......... H01L 27/11551; H01L 27/11524; H01L 27/11578; H01L 27/1157; H01L 27/11556; G11C 16/0483; G11C 16/24
USPC .......................................................... 365/51
See application file for complete search history.

(56) References Cited

U.S. PATENT DOCUMENTS

| | | |
|---|---|---|
| 9,406,693 B1* | 8/2016 | Pang ................ H01L 27/11582 |
| 2009/0296476 A1 | 12/2009 | Shin et al. |
| 2013/0100741 A1 | 4/2013 | Choi et al. |
| 2013/0107628 A1* | 5/2013 | Dong ................ G11C 16/0483 365/185.17 |
| 2013/0153978 A1 | 6/2013 | Lee et al. |
| 2014/0264525 A1 | 9/2014 | Takahashi et al. |
| 2014/0273373 A1 | 9/2014 | Makala et al. |
| 2014/0293695 A1 | 10/2014 | Kono |
| 2015/0017771 A1 | 1/2015 | Lee et al. |
| 2016/0020221 A1 | 1/2016 | Oh et al. |
| 2017/0069731 A1* | 3/2017 | Kim ................ H01L 27/11556 |
| 2017/0293436 A1* | 10/2017 | Sethuraman .......... G06F 3/0613 |

\* cited by examiner

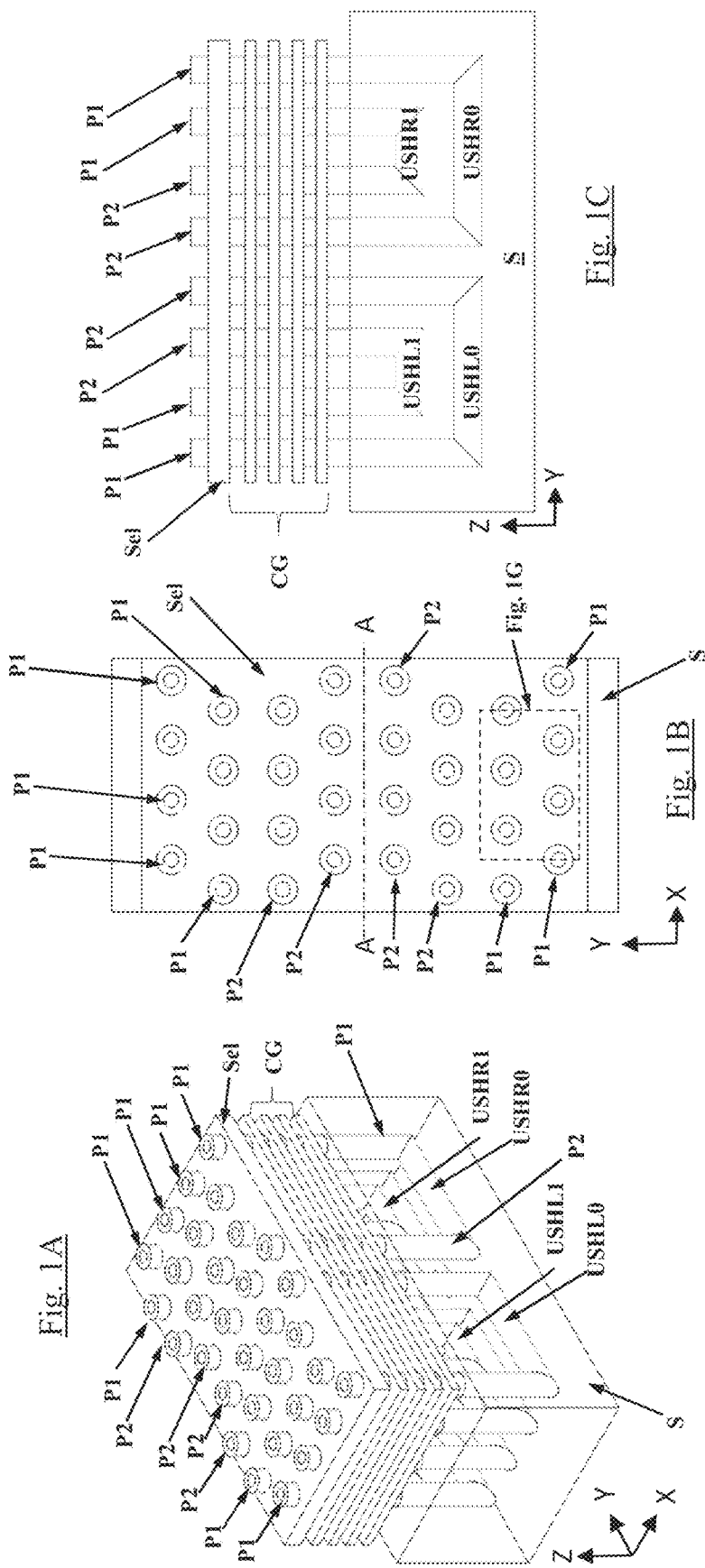

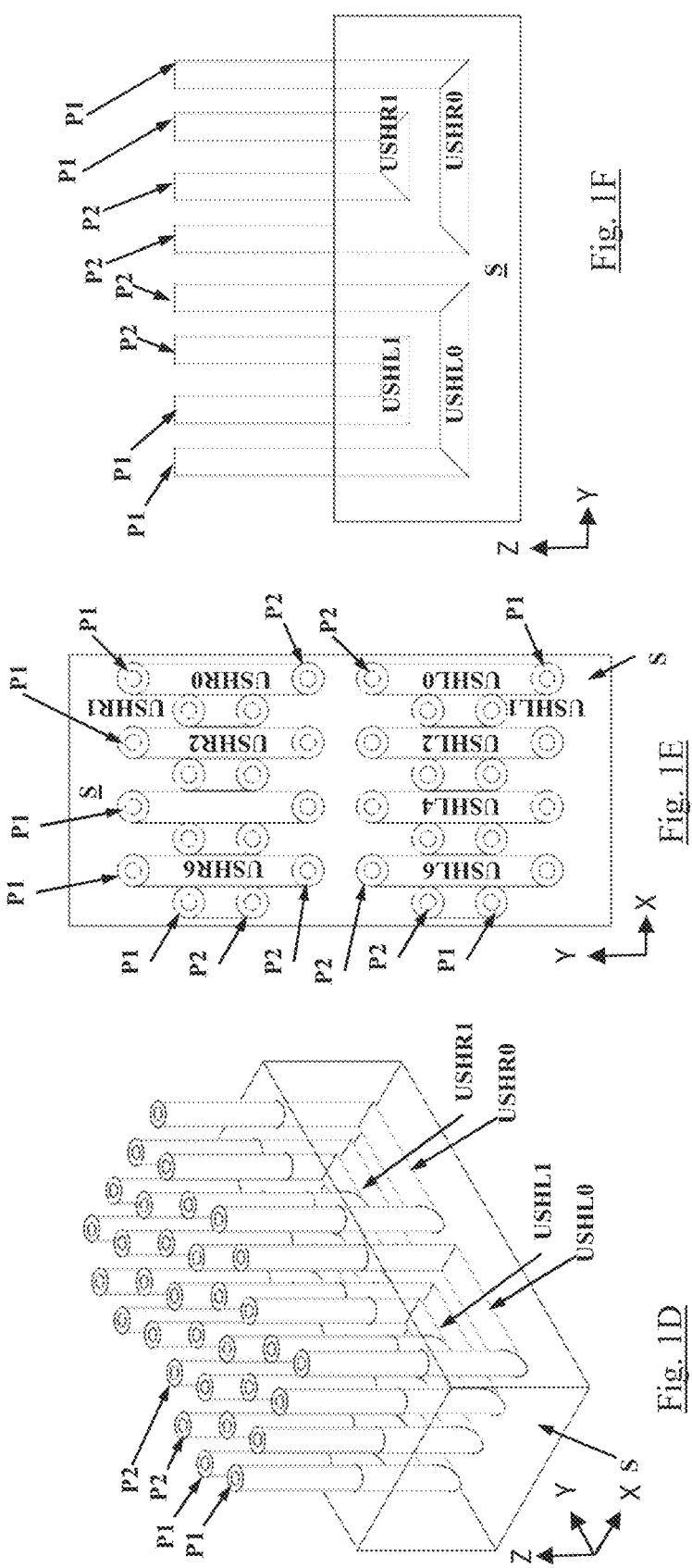

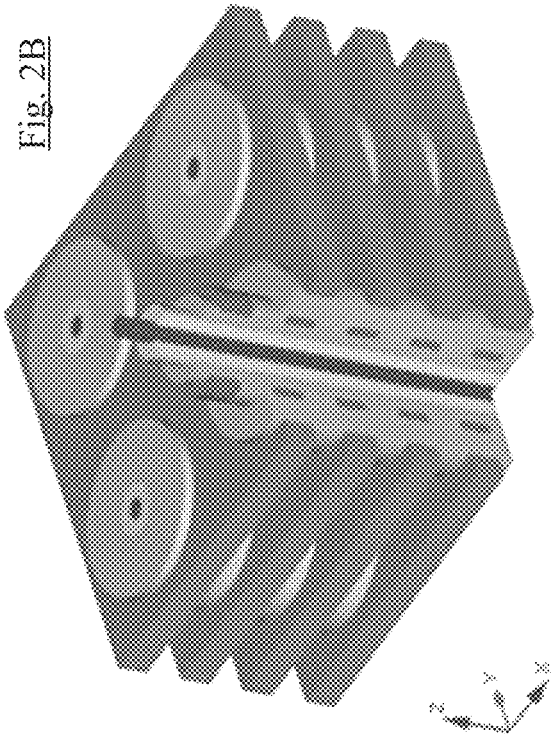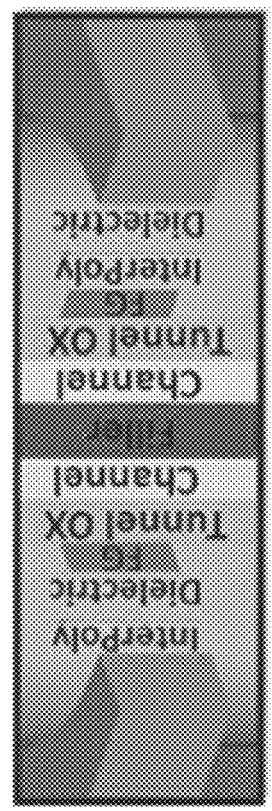
Fig. 2B
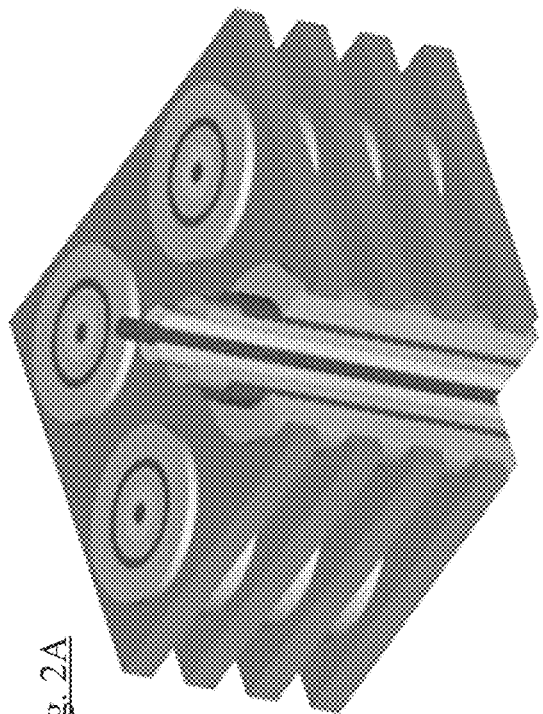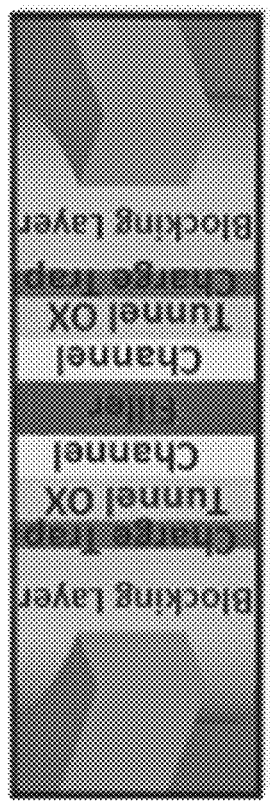
Fig. 2A

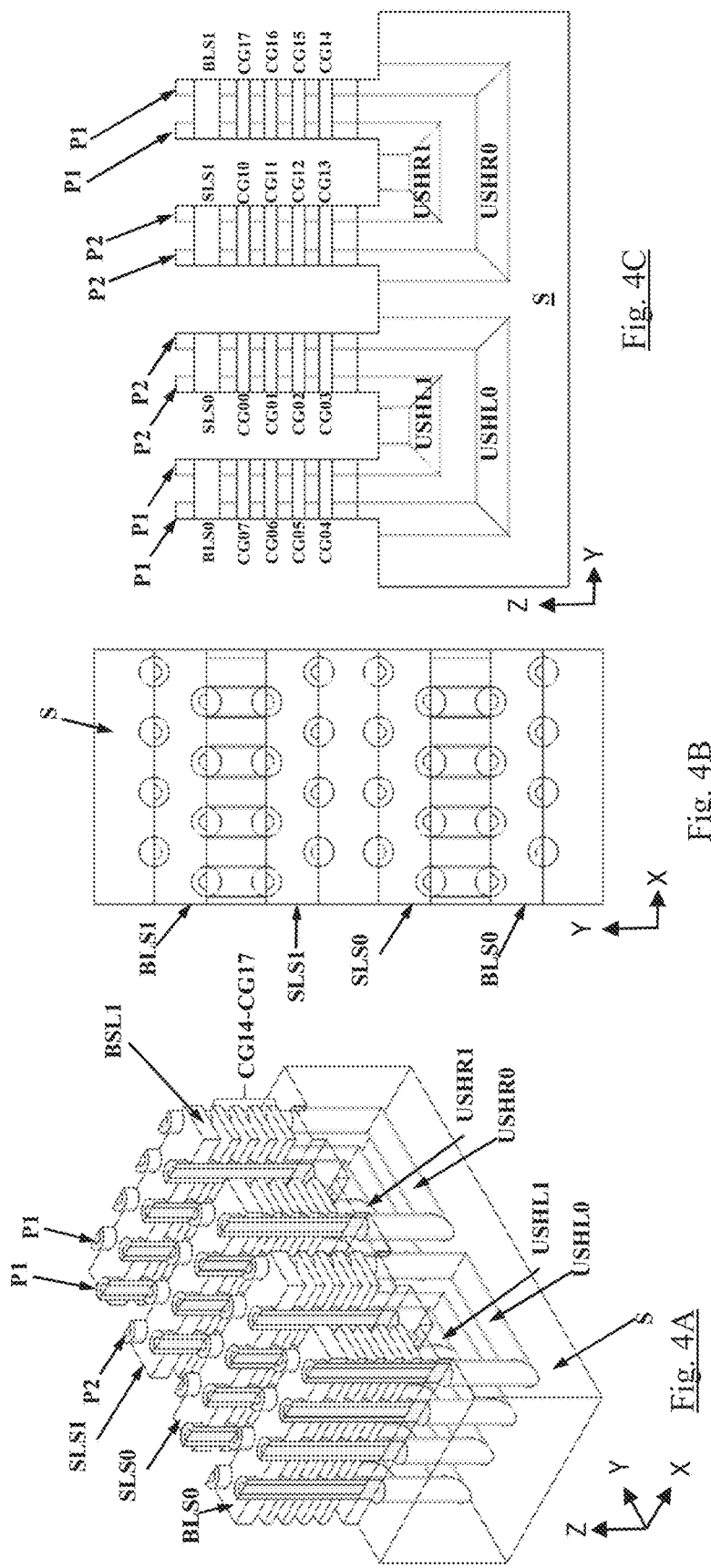

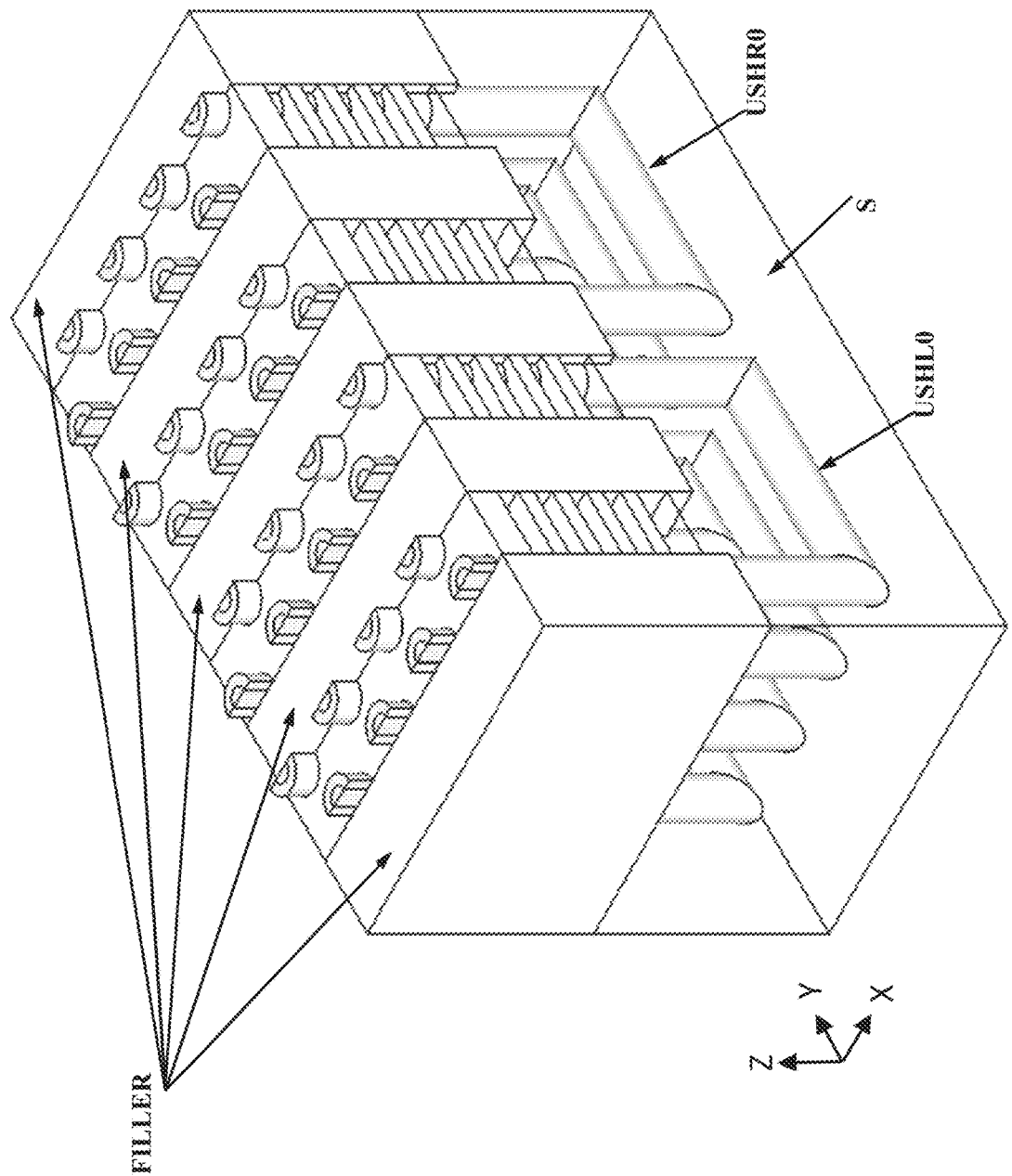

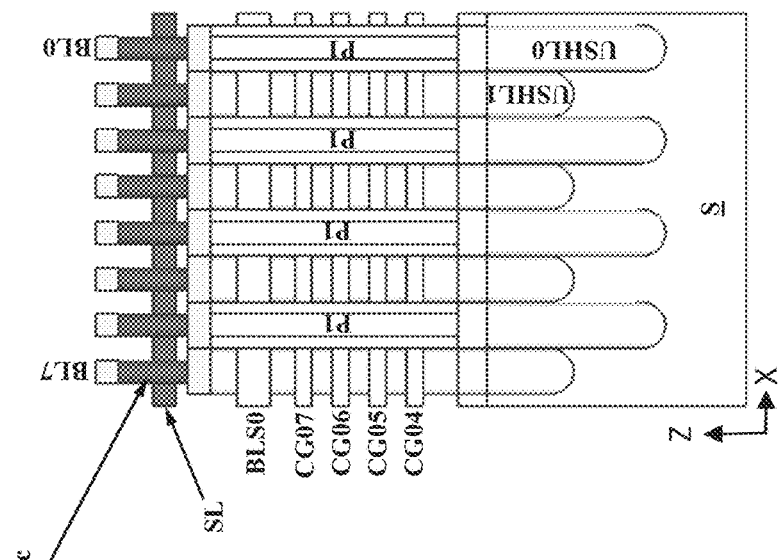
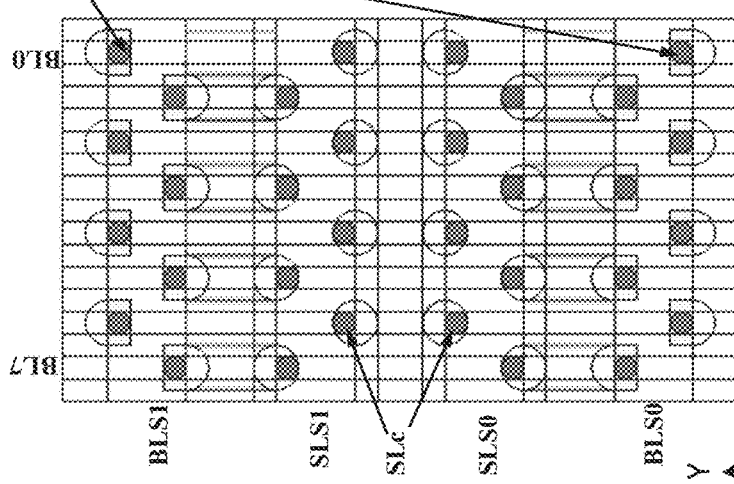
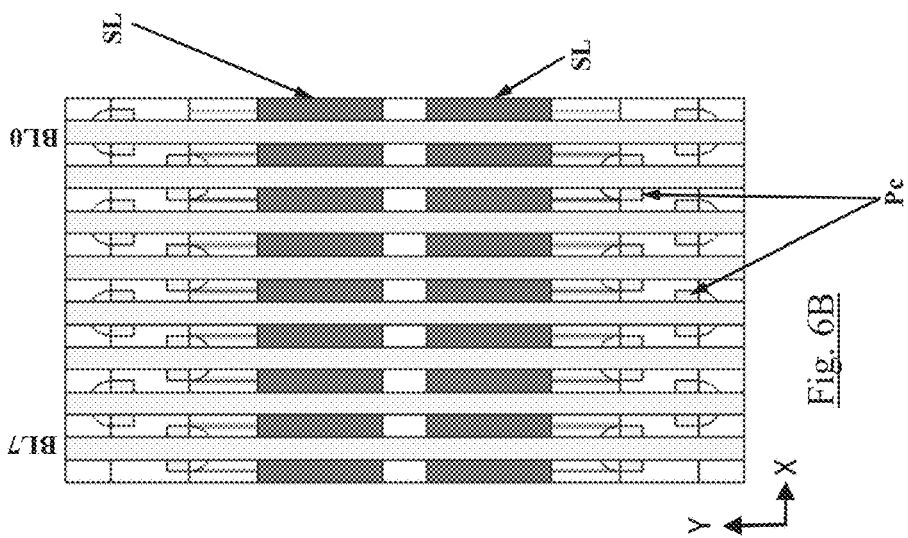

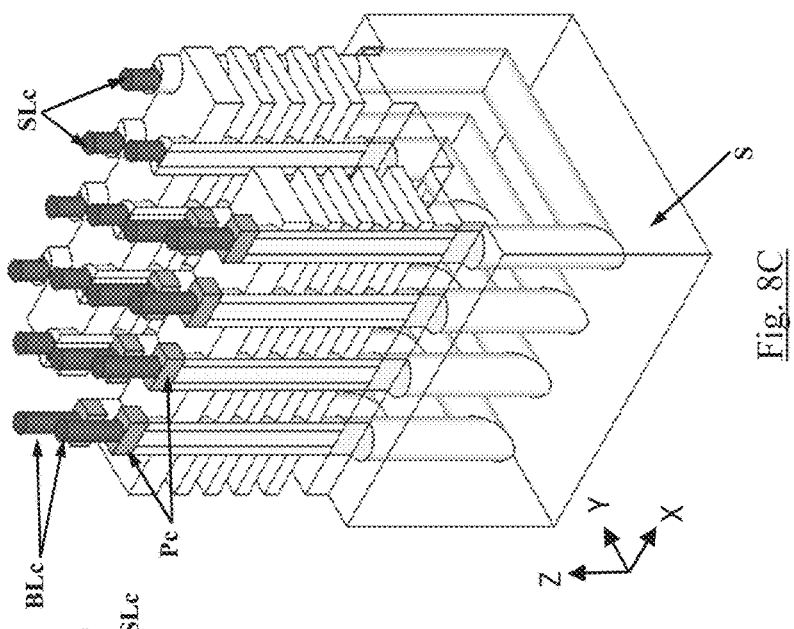
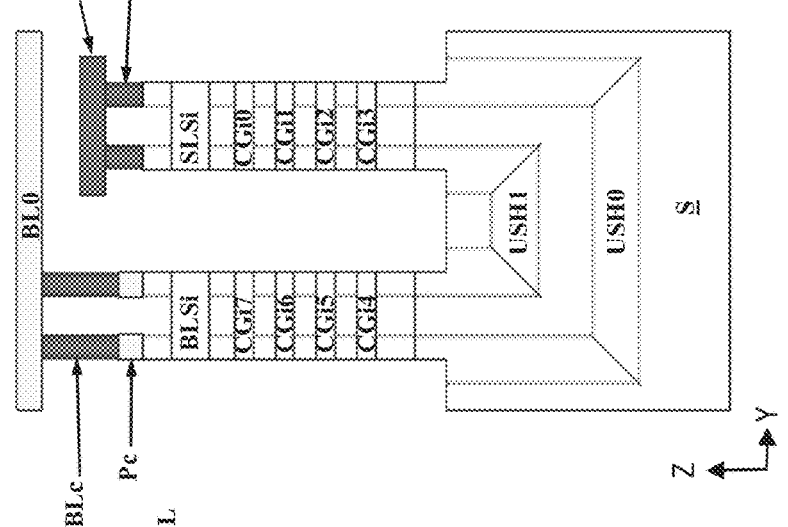
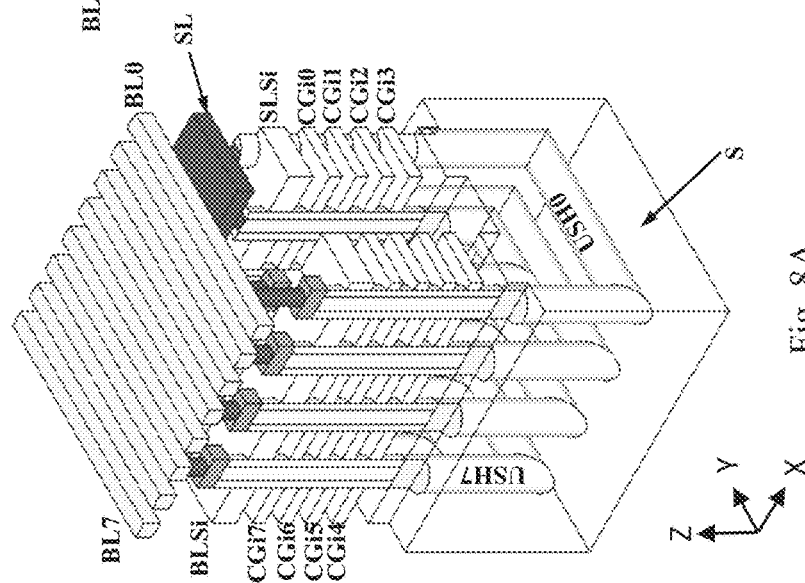

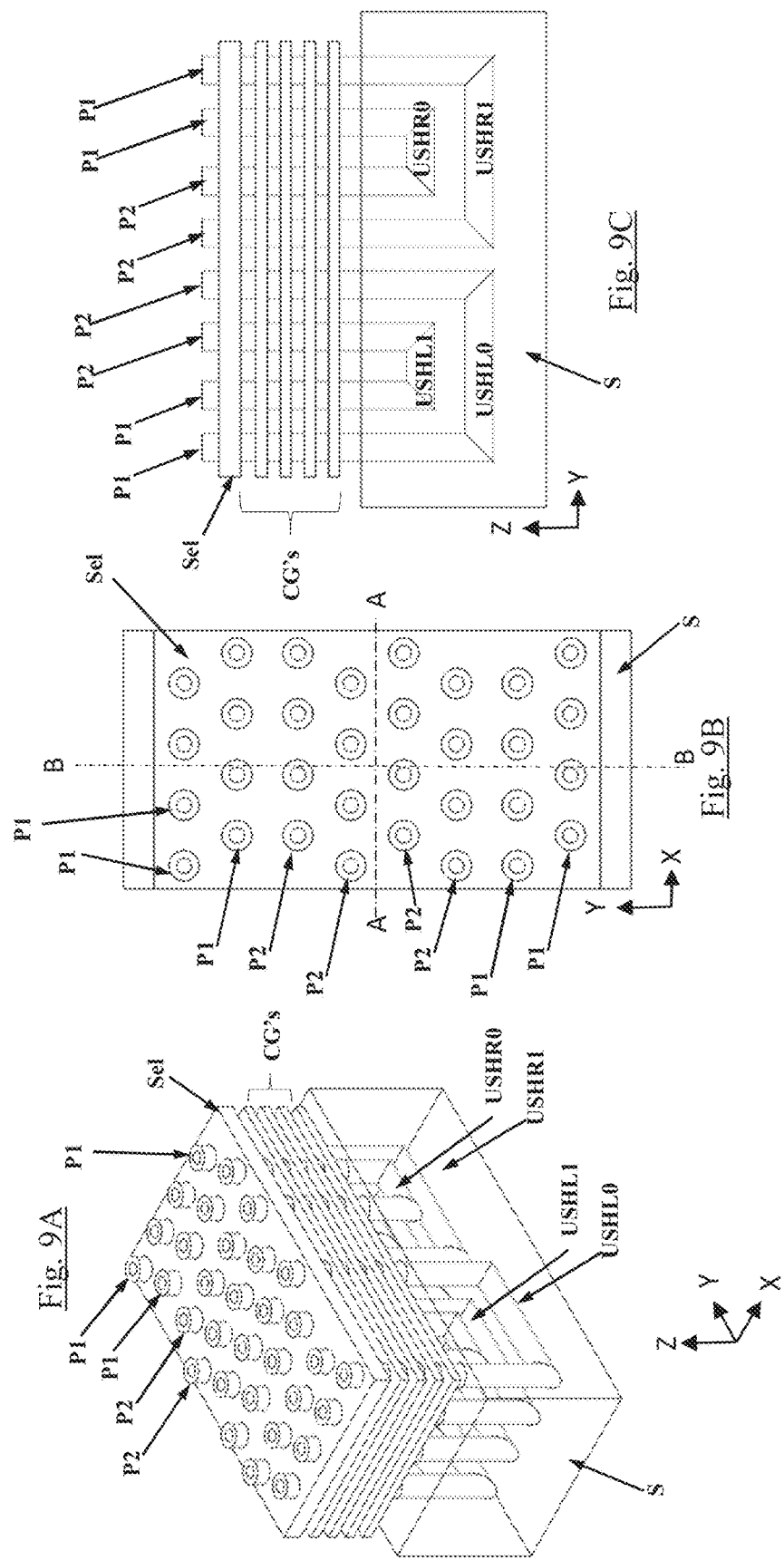

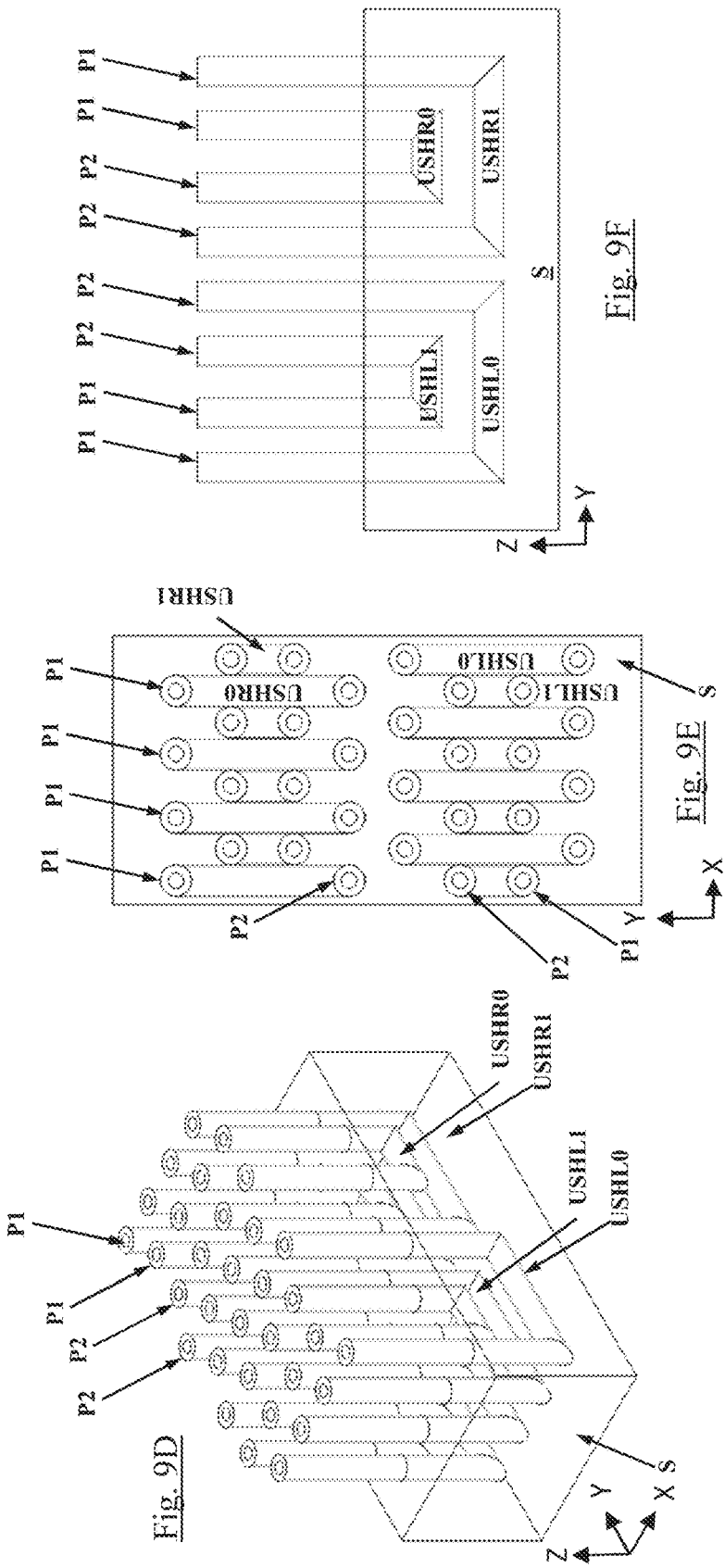

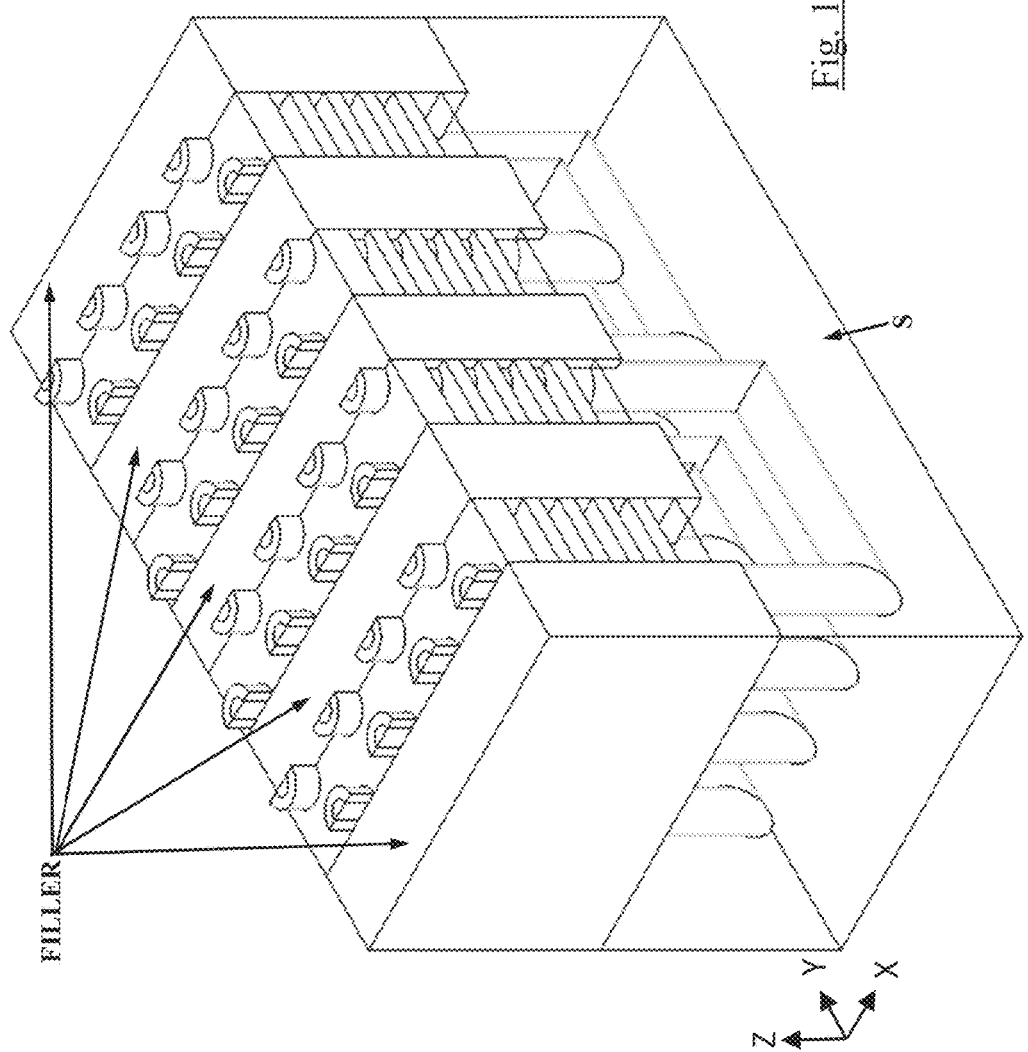

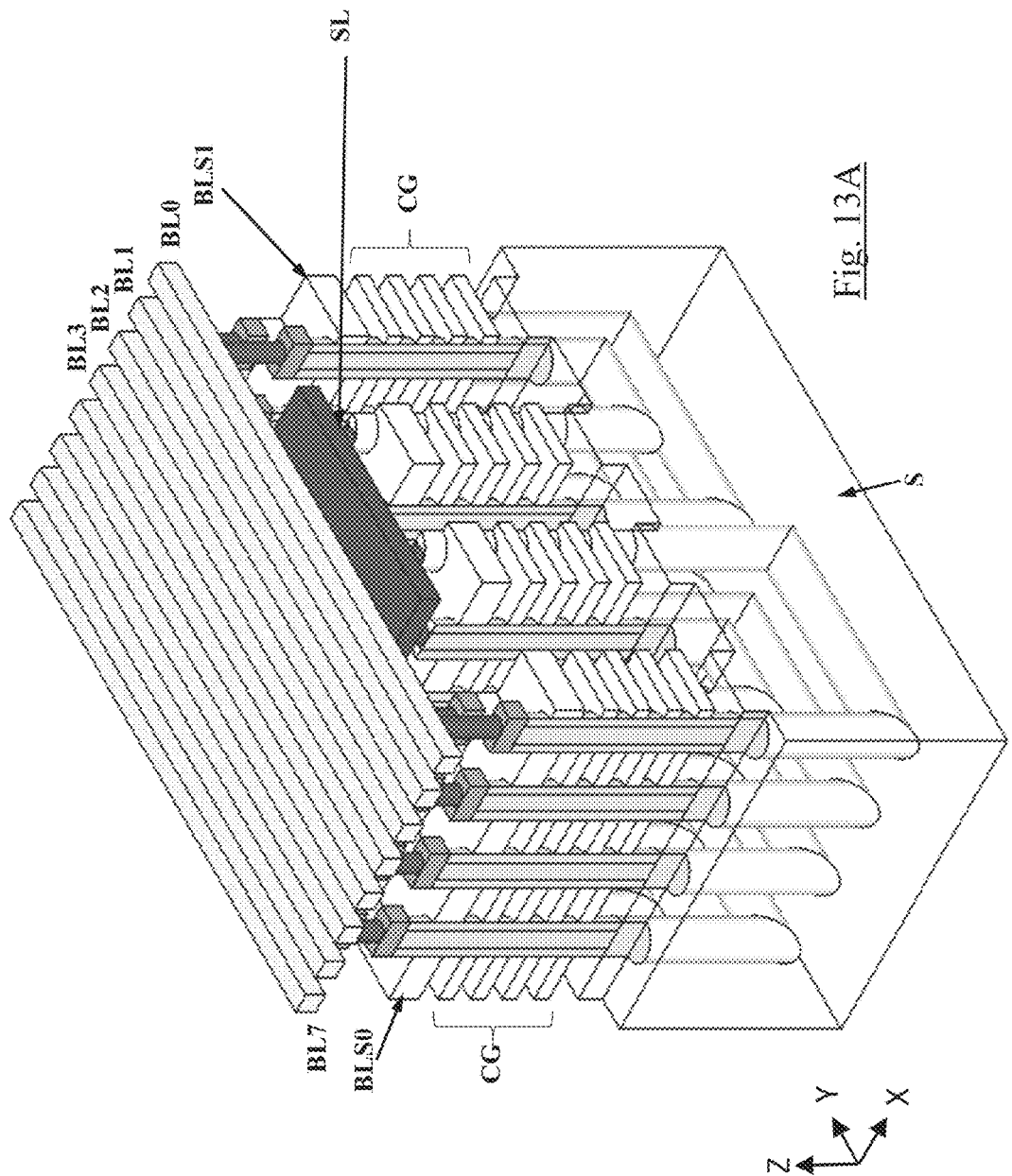

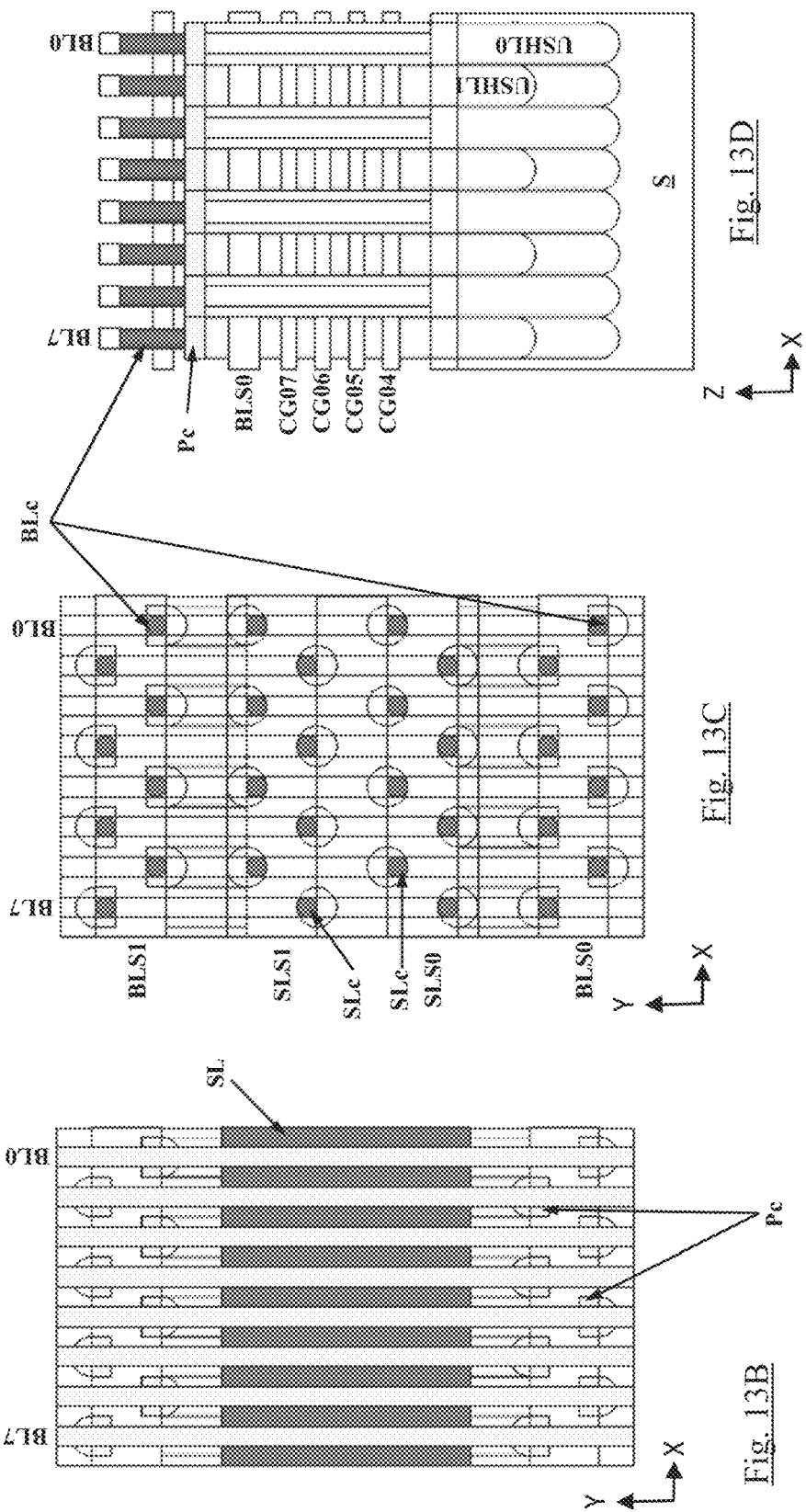

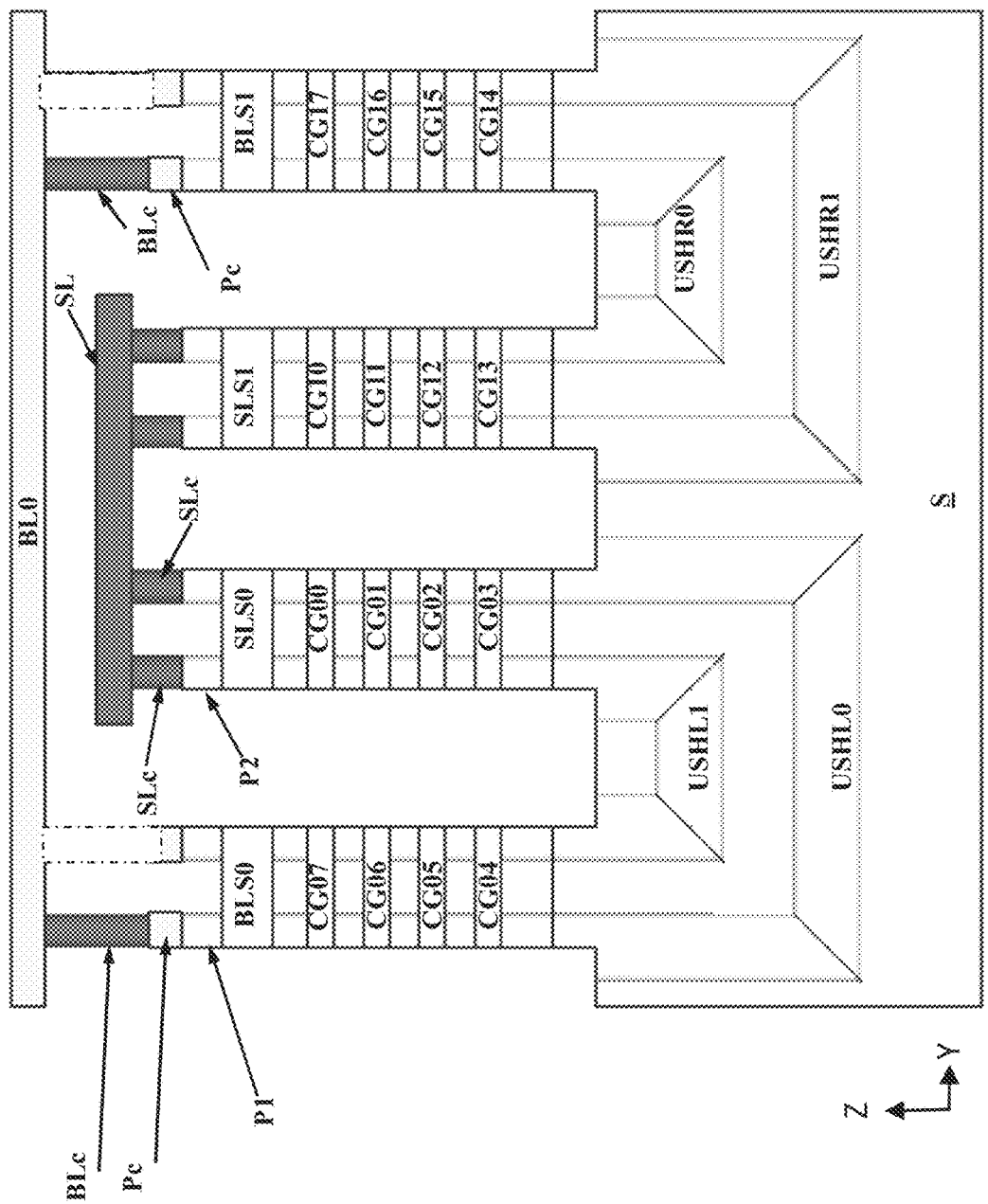

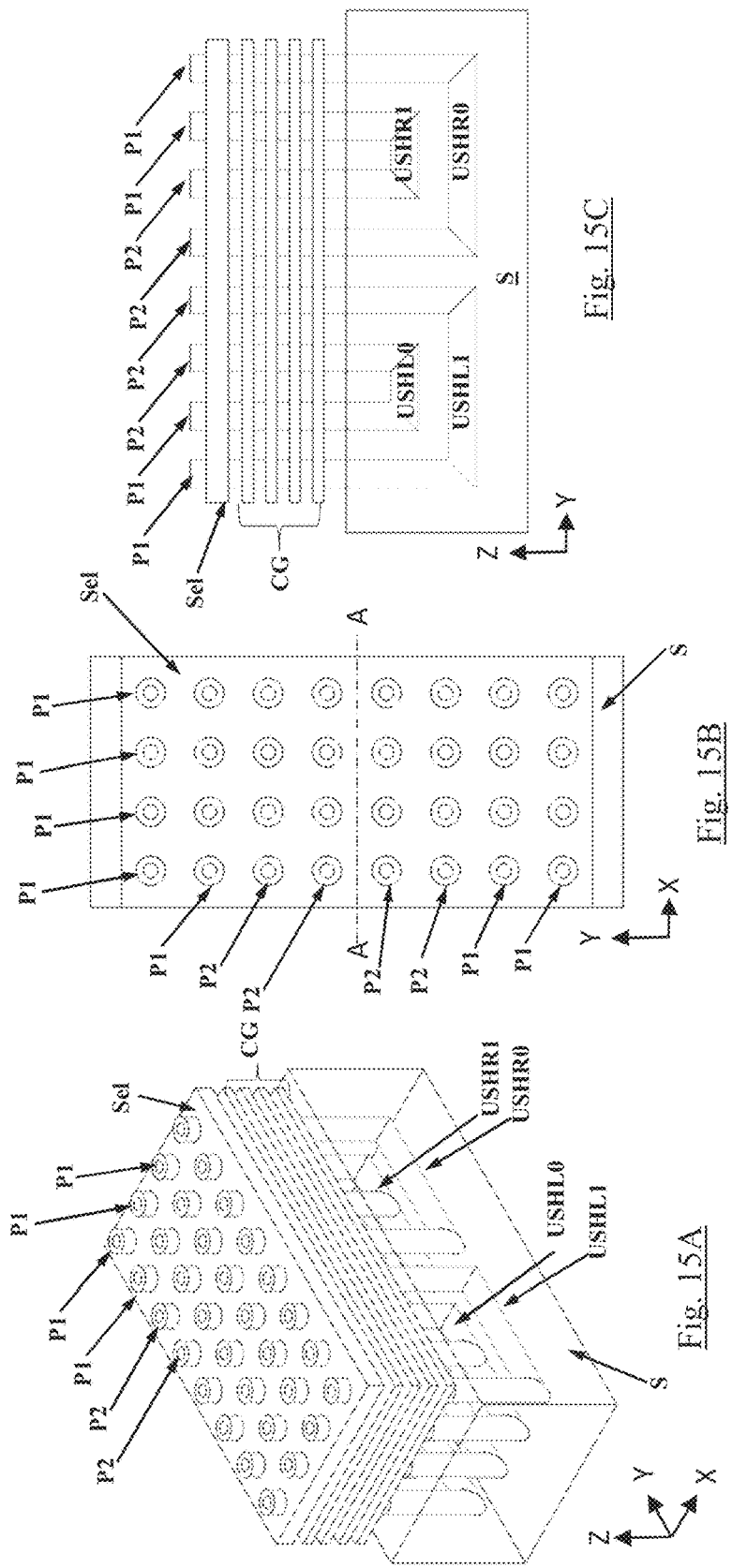

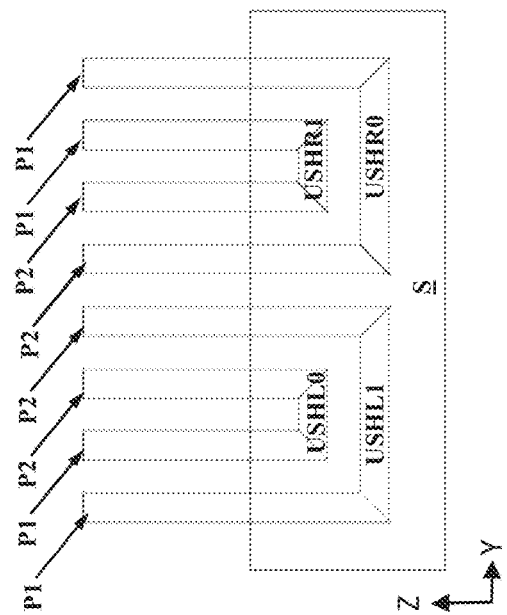
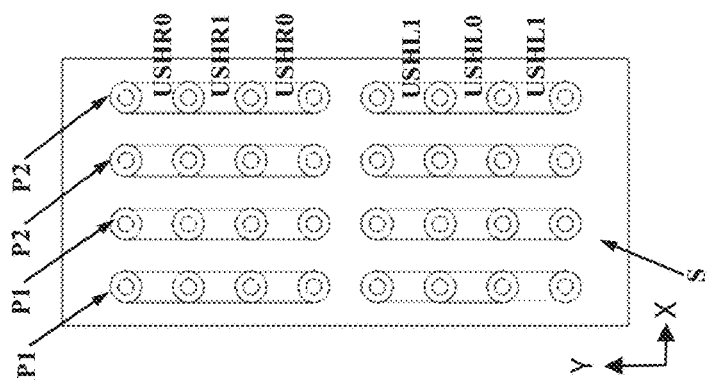
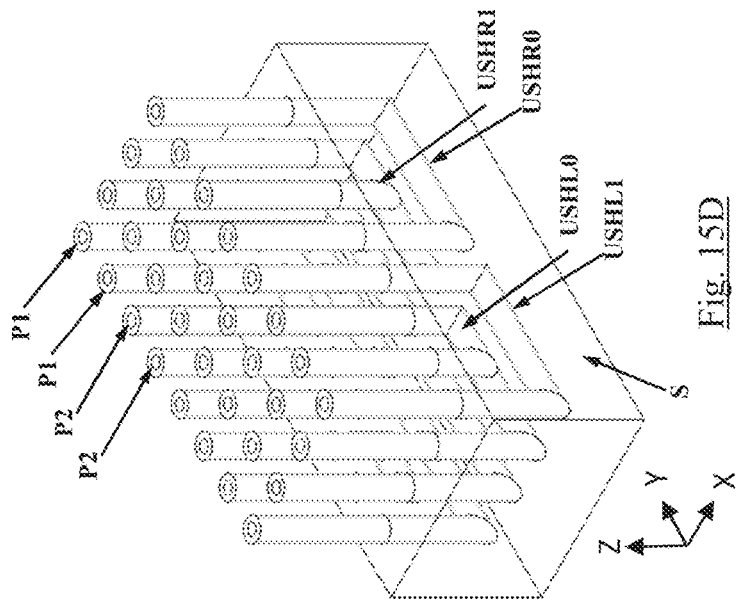
Fig. 15F
Fig. 15E
Fig. 15D

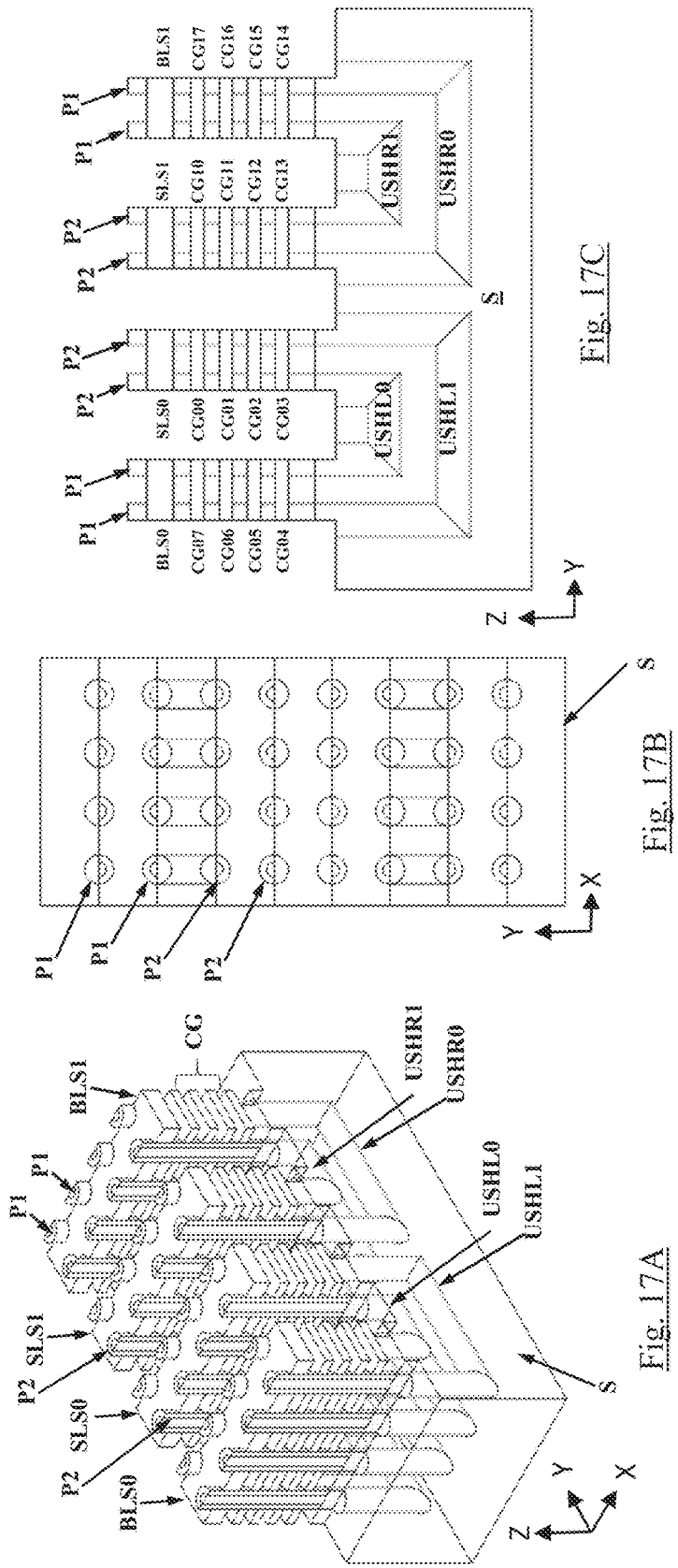

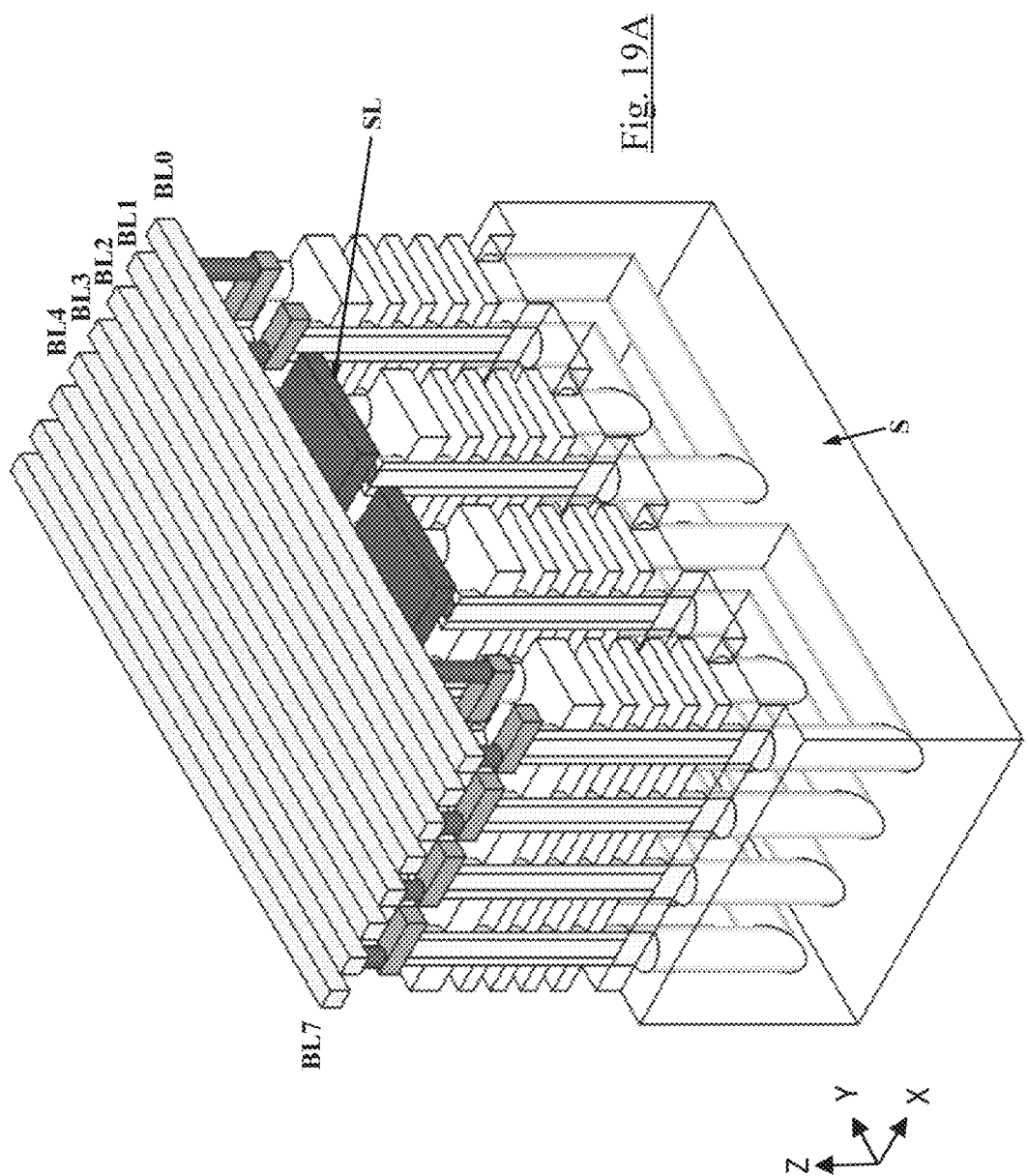

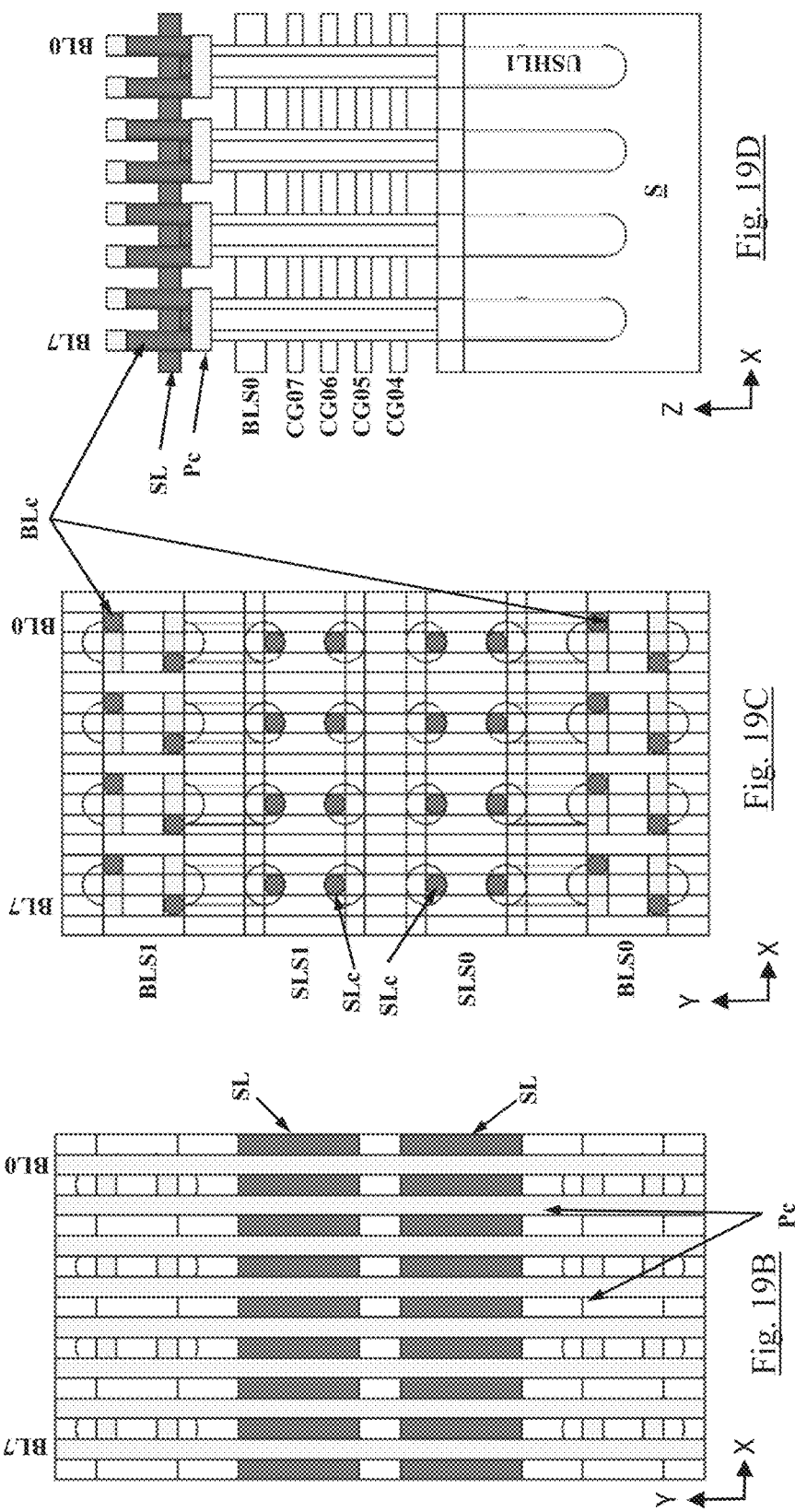

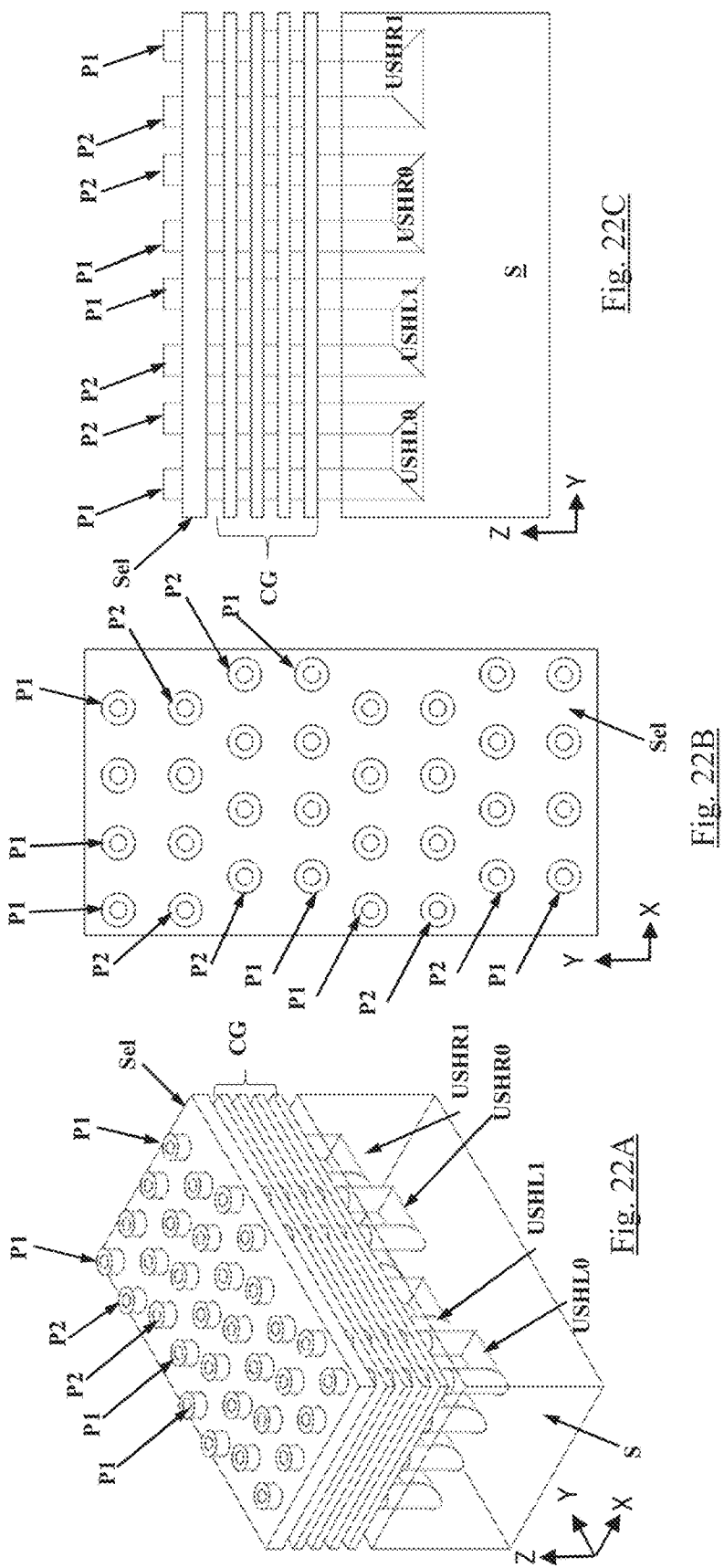

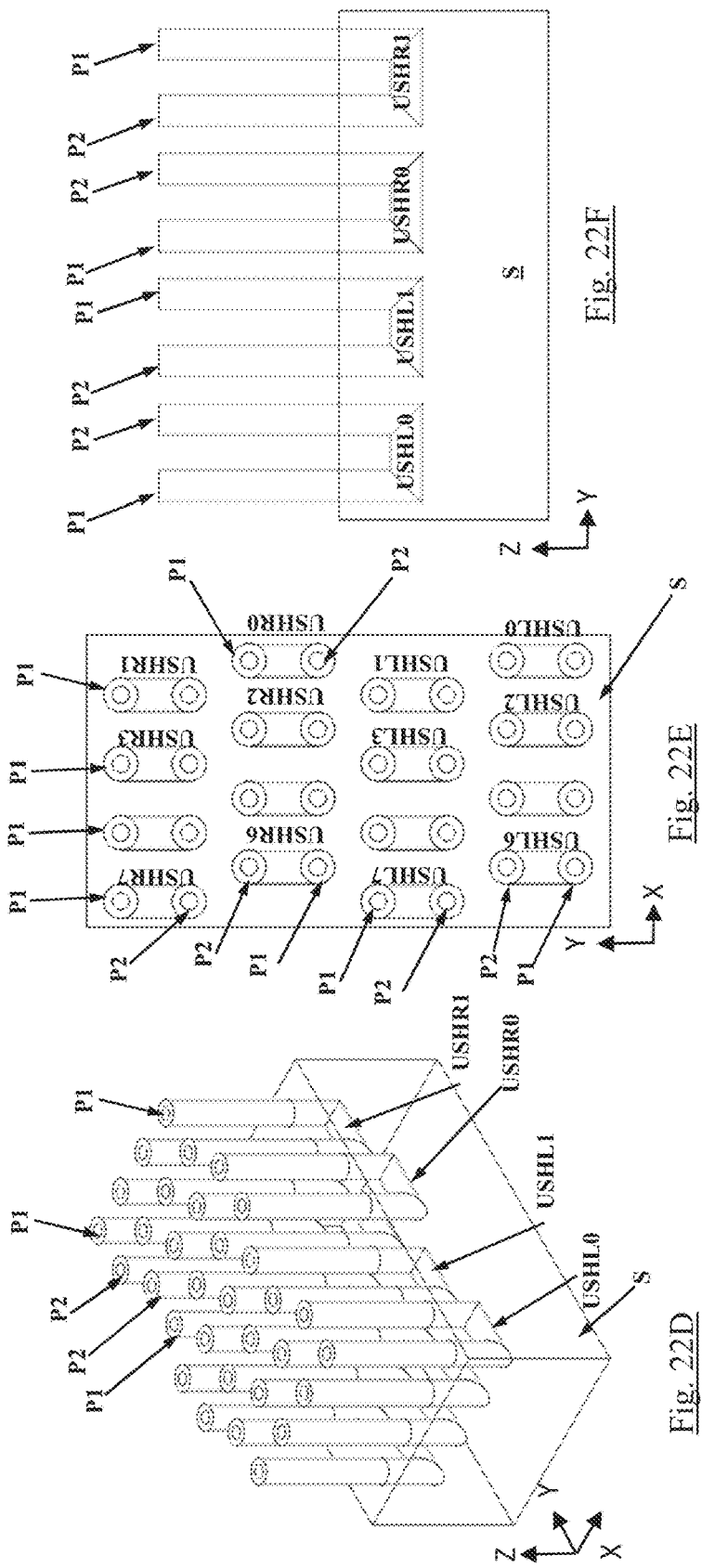

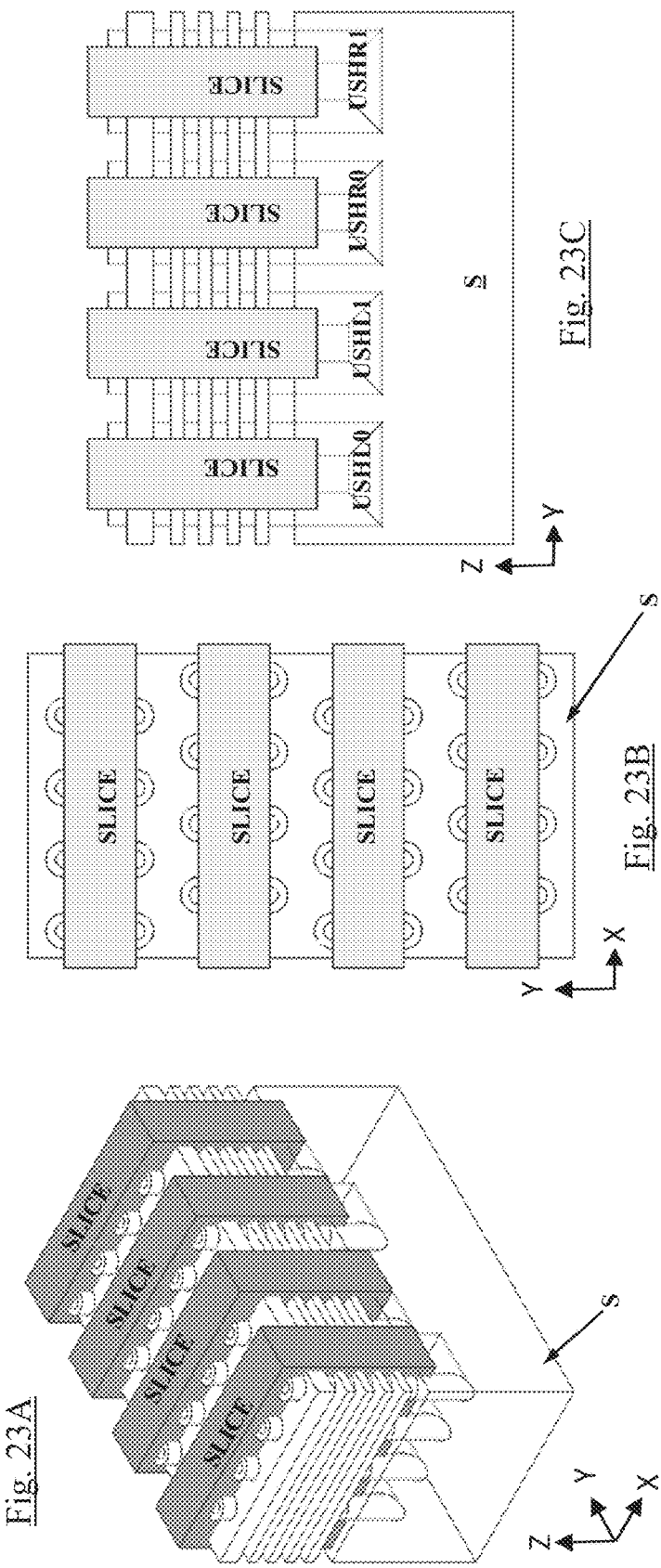

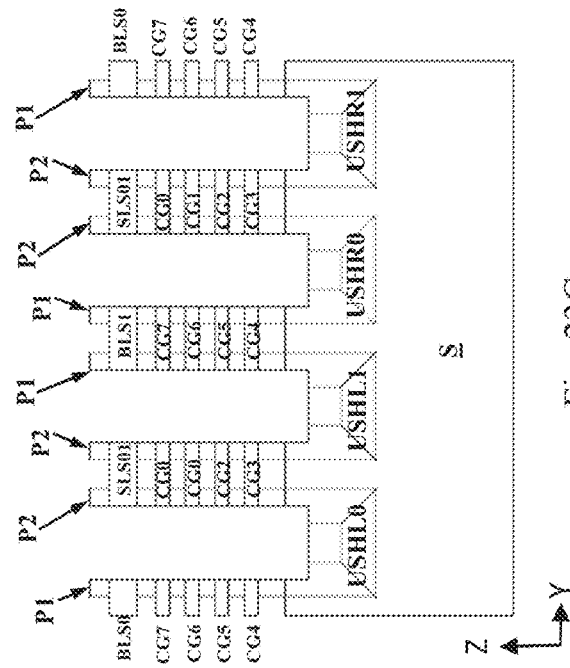
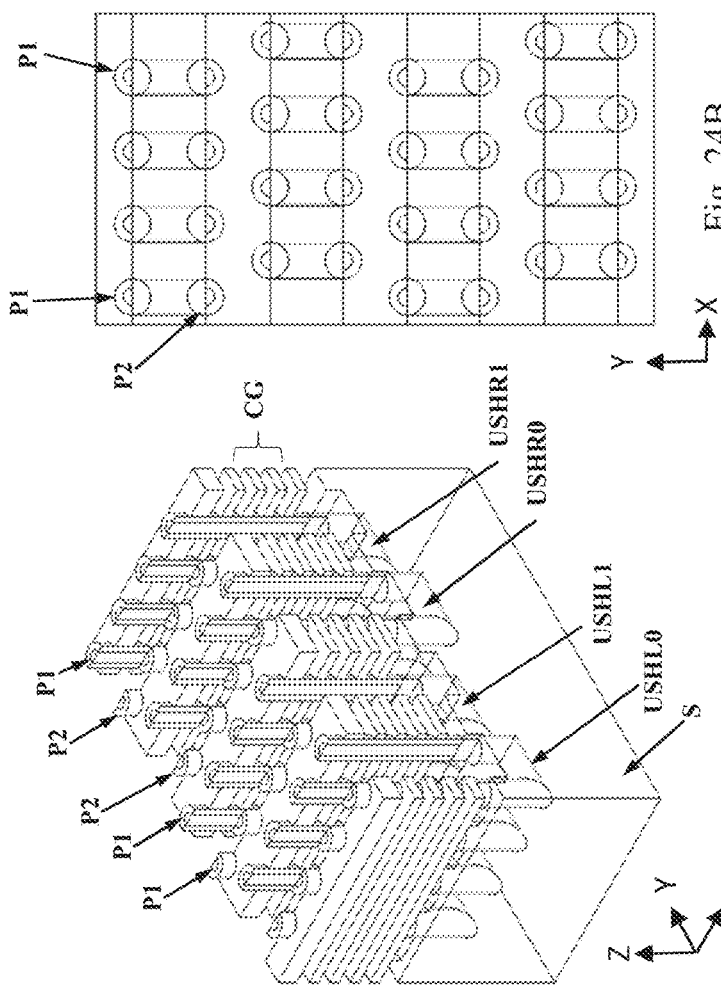
Fig. 23C
Fig. 24B
Fig. 24A

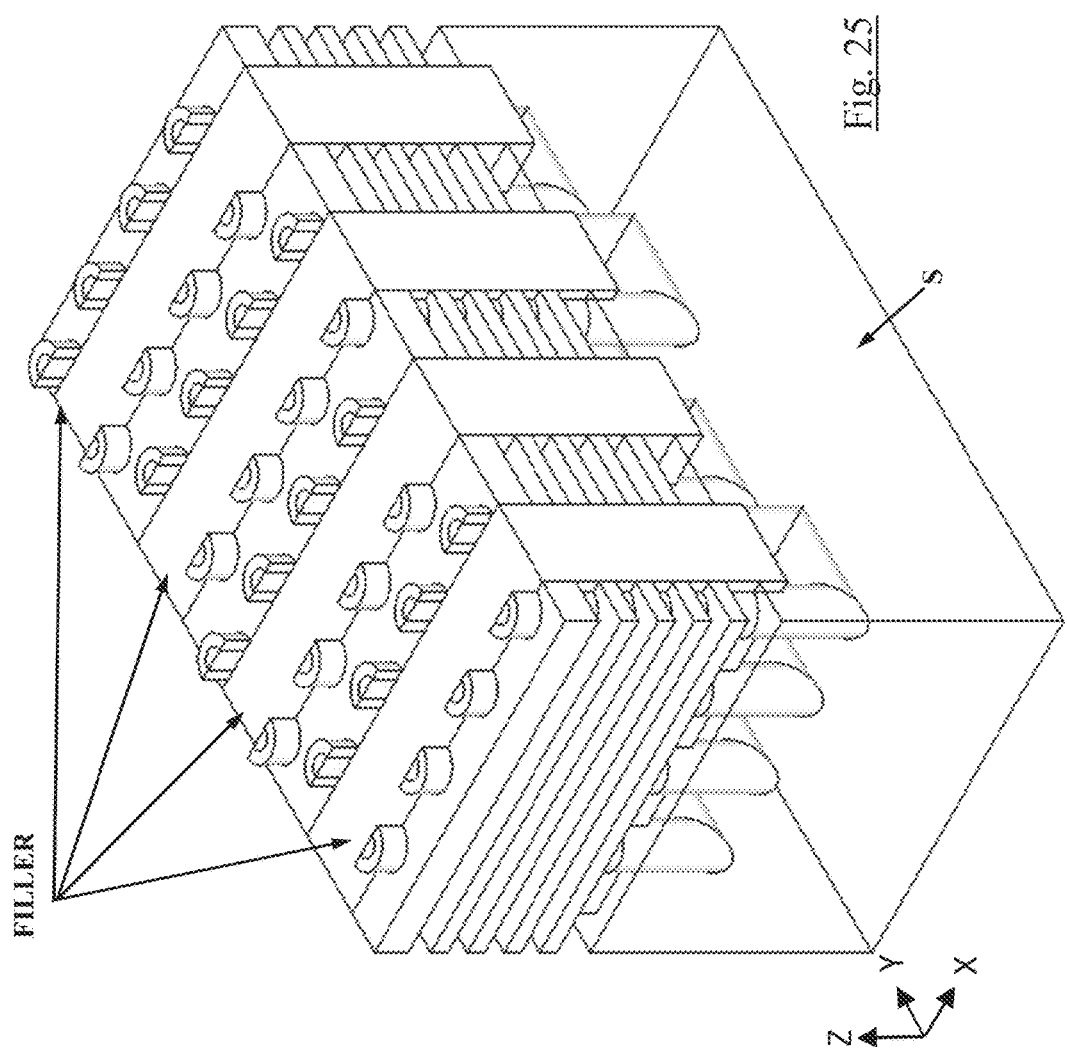

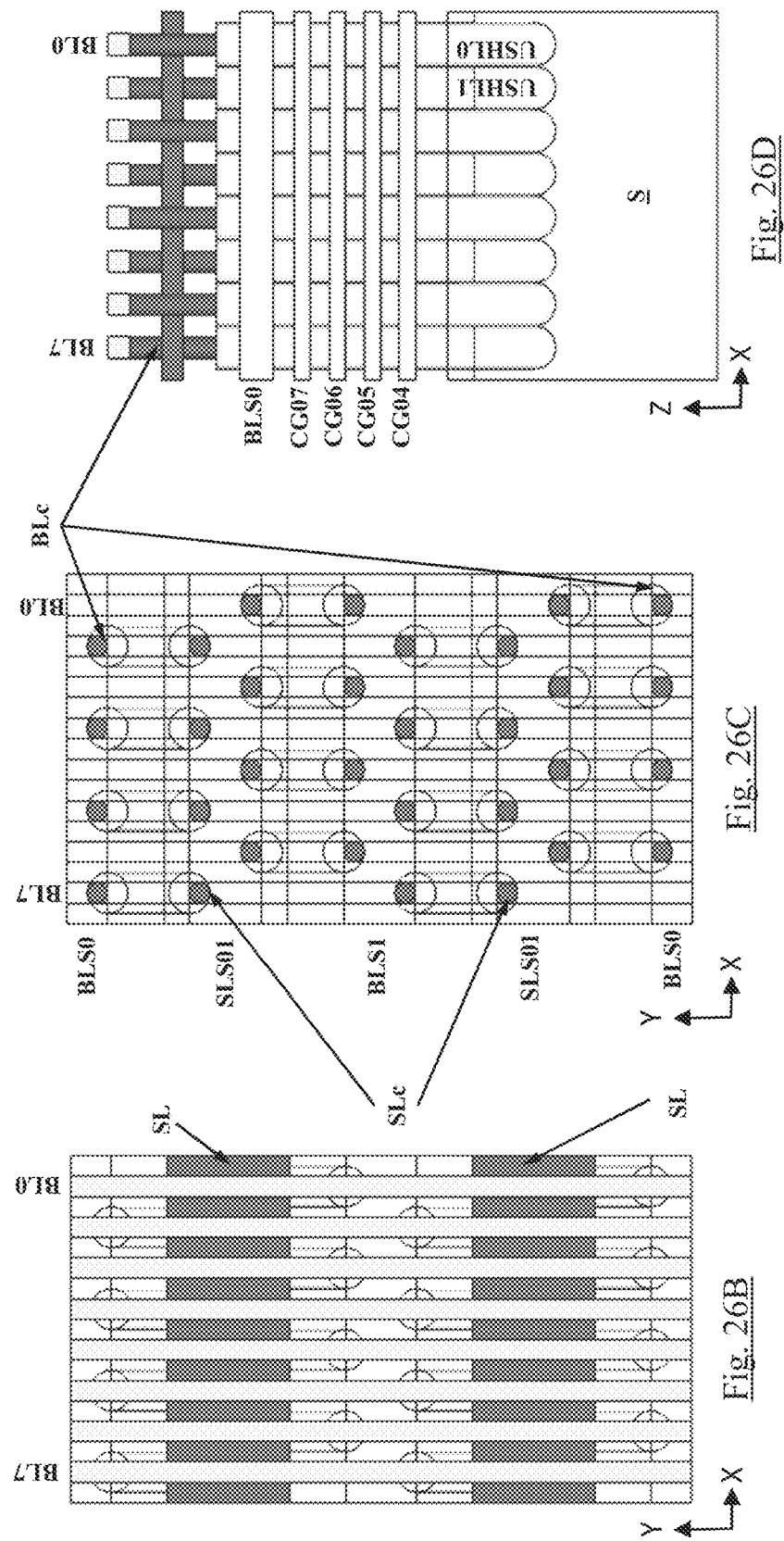

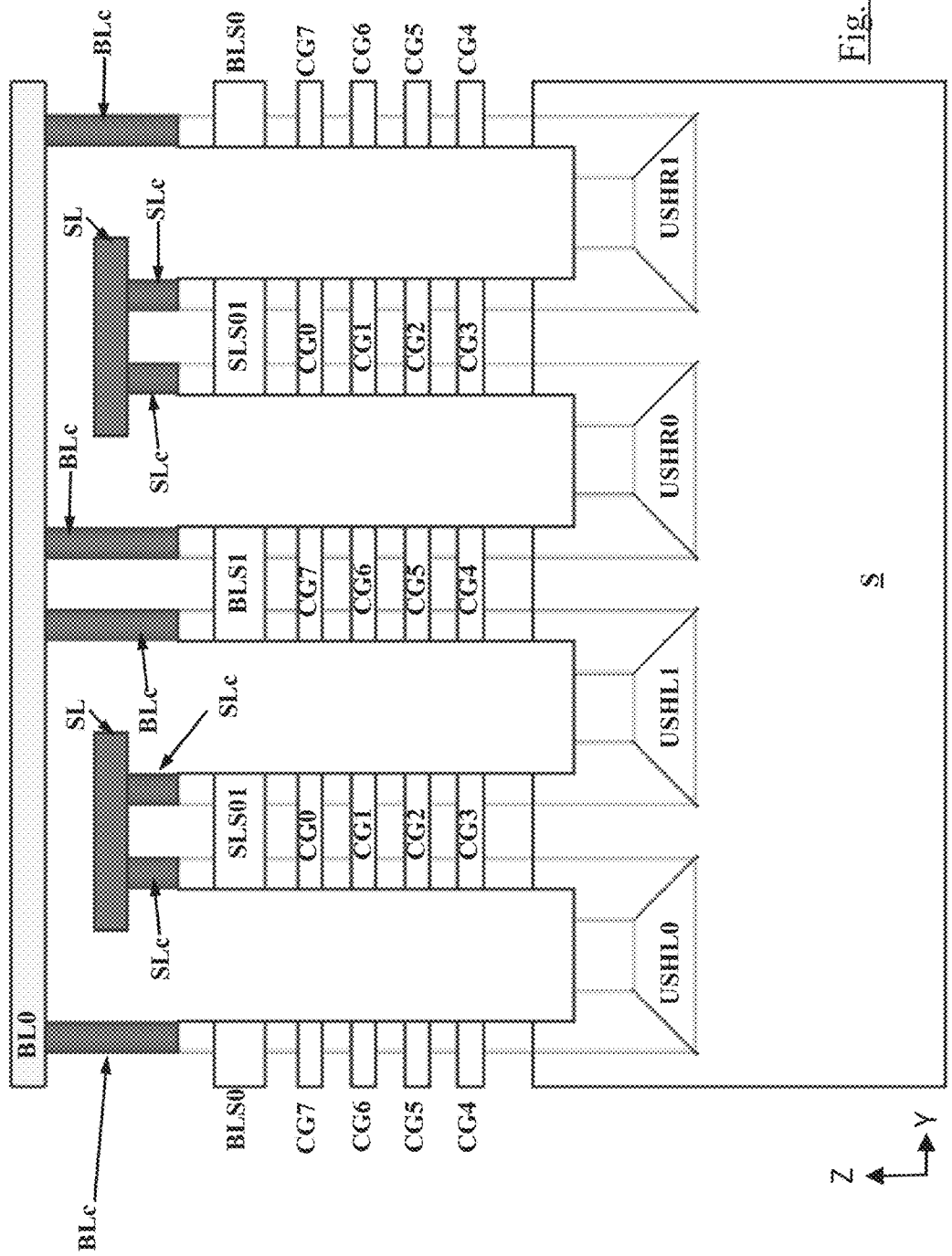

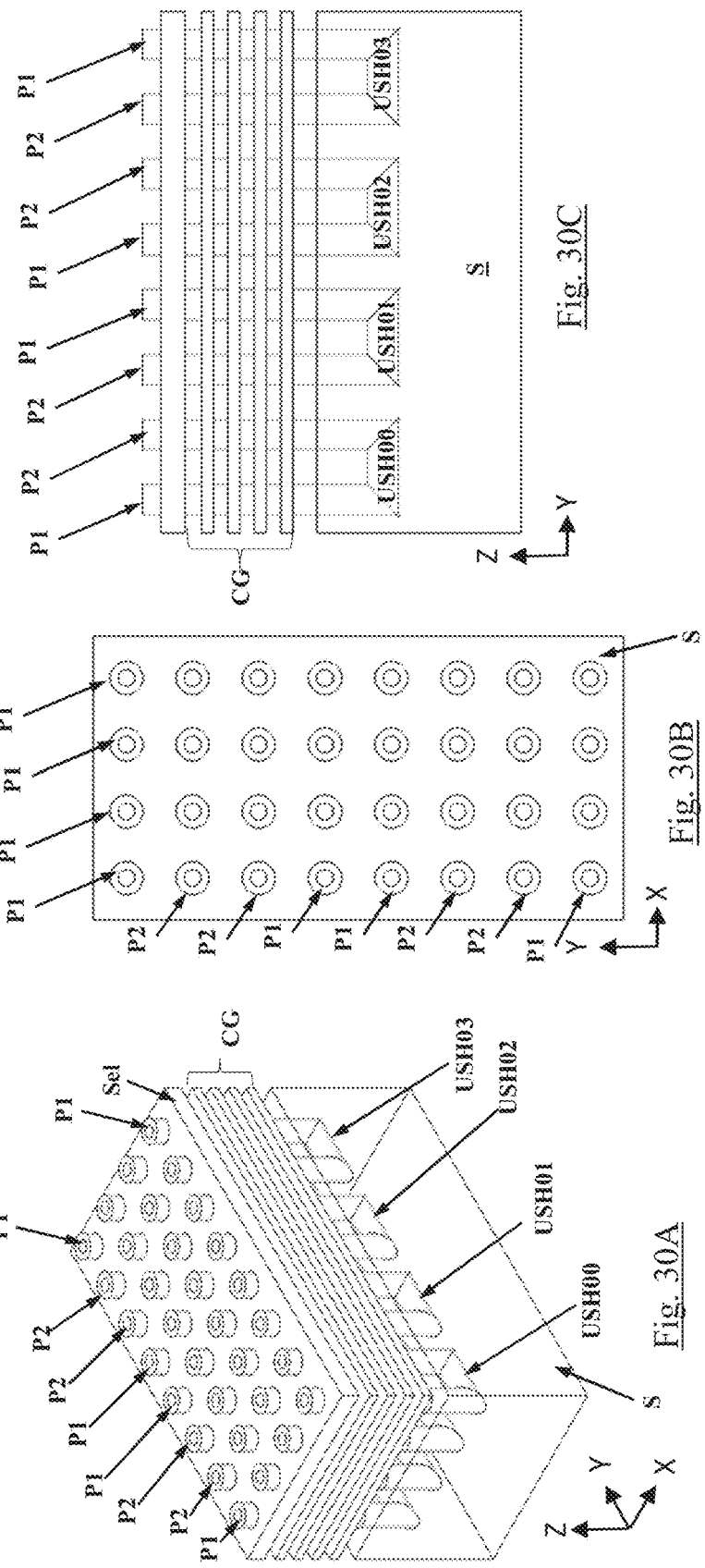

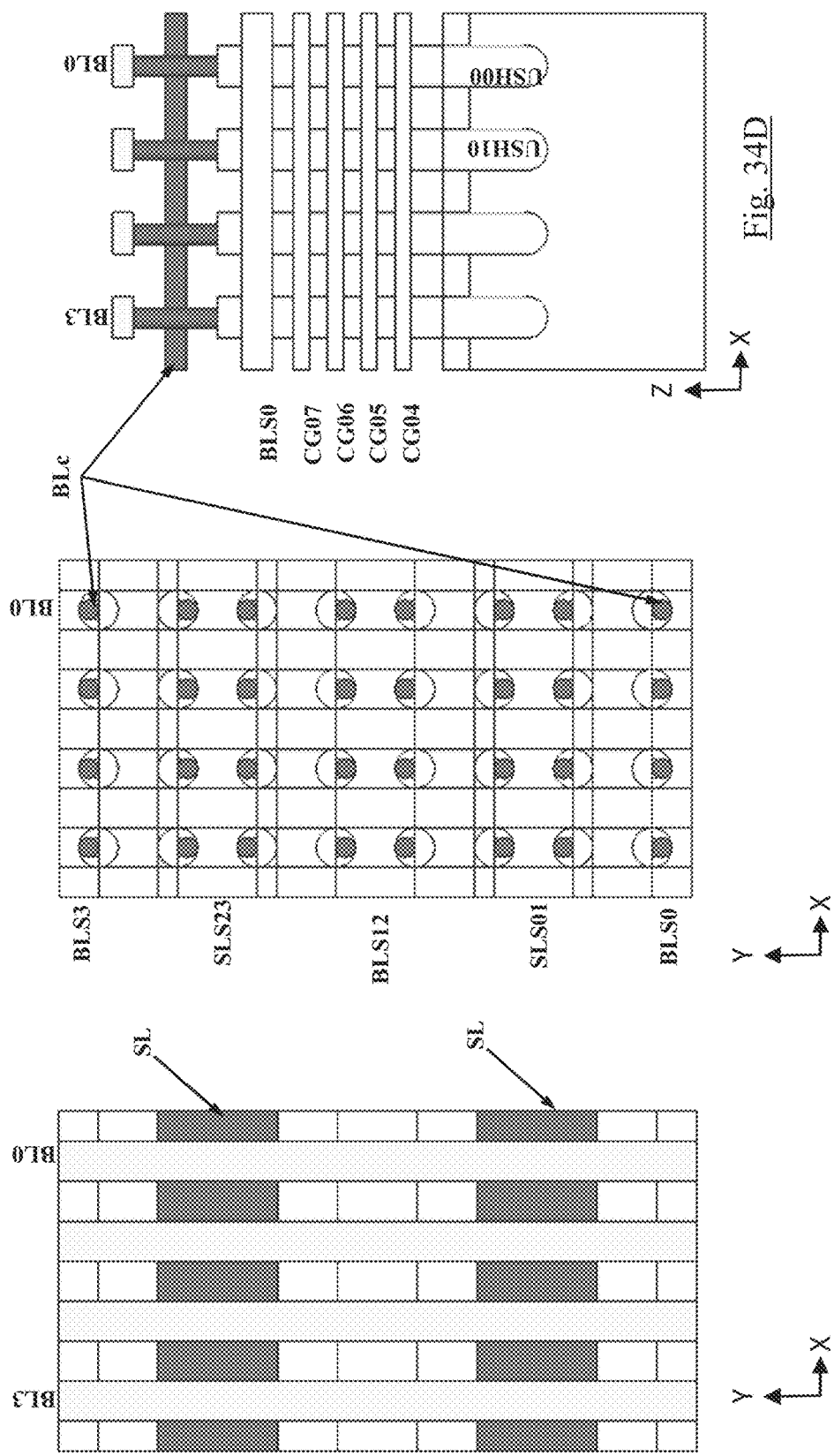

3D MEMORY DEVICE WITH U-SHAPED MEMORY CELL STRINGS

TECHNOLOGICAL BACKGROUND

Technical Field

The solution proposed in this document refers generally to the field of solid state devices, in particular semiconductor devices, and specifically to the field of semiconductor memories. More specifically, the solution proposed in this document refers to the field of the so-called "three-dimensional" ("3D") semiconductor memories.

State of the Art

In the field of non-volatile semiconductor memories (memory devices capable of retaining the data stored therein even in the absence of an energy supply source), 3D semiconductor memories ("3D memories") represent an evolution of the traditional "two-dimensional" semiconductor memories ("2D memories", in which the memory cells are formed as a single layer on a substrate of semiconductor material), which allows to overcome the limits set by the 2D structure to further increment of the integration scale, Therefore, further increases in the storage capacity of data per unit area can be achieved.

Examples of non-volatile 3D semiconductor memory devices with NAND architecture (in which there are groups of memory cells connected in series to form strings of memory cells) are described both in non-patent literature and in various patents/patent applications, among others U.S. Pat. No. 9,218,874, U.S. 2015/017771 A1 and U.S. 2014/0293695.

In particular, U.S. Pat. No. 9,218,874 describes an architecture in which there are strings of memory cells in the form of pillars which extend, in one direction, from a first end to a second end opposite the first end along said direction. U.S. 2015/017771 and U.S. 2014/0293695 describes instead a different architecture in which the strings of memory cells have generally a "U" shape, each of the strings comprising two pillars, extending parallel to each other along one direction, each pillar having a first end and a second end, and the second ends being connected to each other.

SUMMARY OF THE SOLUTION PROPOSED IN THIS DOCUMENT

The Applicant has observed that the known architectures of the memory cell array, such as those disclosed in U.S. 2015/017771 A1 and U.S. 2014/0293695 A1, have room for improvement in terms of structural compactness, with consequent improvement in the data storage capacity per unit area. In particular, a penalization of the compactness of the structure derives from the need to provide interruptions in the regularity of the array of (strings of) memory cells for defining (by usual lithographic techniques) bit line selectors, source line selectors and control gates.

A purpose of the solution disclosed in this document is to propose a memory cell array architecture for a 3D semiconductor memory, with "U" shaped memory cell strings, which is structurally more compact than the known architectures, which allows further increments of the data storage capacity per unit area.

According to the solution proposed in this document, a three-dimensional (3D) memory device is proposed, comprising:

a substrate;

a plurality of U-shaped memory cell strings each one including a buried string portion formed in the substrate, a first, bit line selector side string portion, or first pillar, and a second, source line selector side string portion, or second pillar, wherein the buried string portion is connected to a first end of the first string portion and to a first end of the second string portion, each of the U-shaped memory cell strings including a stack of memory cells along the first string portion and a stack of memory cells along the second string portion;

bit line selectors arranged at a second end of the first string portions opposite the first end, for the selective connection to respective bit lines;

source line selectors arranged at a second end of the second string portions opposite the first end, for the selective connection to respective source lines.

The string portions comprise first groups of first string portions, whereas in each first group the first string portions are aligned along a first direction to form a respective first row of first string portions, and second groups of second string portions, where in each second group the second string portions are aligned along the first direction to form a respective second row of second string portions.

The first rows of first string portions and the second rows of second string portions follow one another, alternately or in pairs, along a second direction transverse to the first direction.

First rows of first string portions and/or second rows of second string portions consecutive along said second direction are spaced apart from each other by a respective distance.

Between a first row of first string portions and a second row of second string portions consecutive along said second direction and a spaced apart a distance equal to or less than the minimum distance allowed by the resolution of the manufacturing technology there is formed a respective slit extending into a third direction, orthogonal to said first and second directions, from said second end to the substrate, said slit interrupting layers forming the bit line selectors and source line selectors and the control gates of the memory cells of the memory cells stacks formed along the first and second string portions.

The slit has a dimension, along said second direction, smaller than, equal to or greater than said minimum distance, and slit walls lying in planes parallel to said first and third directions delimit the first and second string portions of the first and second consecutive rows.

In embodiments of the proposed solution, said plurality of strings of U-shaped memory cells may comprise first U-shaped strings whose first and second pillars are spaced apart from each other a first distance in said second direction and extend in the substrate down to a first depth, and second U-shaped strings whose first and second pillars are spaced apart from each other a second distance in said second direction, which is lower than, for example equal to about half of, the first distance and extend in the substrate down to a second depth, which is less than, for example about half of, the first depth.

In embodiments of the proposed solution, all the U-shaped memory cells strings of said plurality may have the first and second pillars which are spaced apart from each other by a same distance in said second direction and which extend into the substrate down to a same depth.

Pairs of first and/or second consecutive rows along said second direction may have the respective first and/or second pillars arranged mutually offset, diagonally to the first and second directions, so that the first or second pillars of a row of the pair of first and/or second rows are facing the spaces between the first or second pillars of the other row of the pair of first and/or second rows.

Pairs of first and/or second consecutive rows along said second direction may have the respective first and/or second pillars arranged aligned in said second direction, so that the first or second pillars of a row of the pair of first and/or second rows are facing the first or second pillars of the other row of the pair of first and/or second rows.

In embodiments of the proposed solution, said plurality of U-shaped memory cells strings may comprise blocks of U-shaped memory cells strings, each block comprising two packets of memory U-shaped memory cells strings. A first packet of said two packets may comprise, following in the second direction:

a first row of first string portions;
a second row of second string portions belonging to the same U-shaped memory cells strings to which the first string portions of the first row belong;
a further second row of second string portions;
a further first row of first string portions belonging to the same U-shaped memory cells strings to which the second string portions of the further second row belong.

A second packet of said two packets, following the first packet in said second direction, may comprise, following one another in the second direction:

a first row of first string portions;
a second row of second string portions belonging to the same U-shaped memory cells strings to which the first string portions of the first row belong;
a further second row of second string portions;
a further first row of first string portions belonging to the same U-shaped memory cells strings to which the second string portions of the further second row belong.

In embodiments of the proposed solution, a first packet of said two packets may comprise, following one another in the second direction:

a first row of first string portions;
a further first row of first string portions belonging to other of U-shaped memory cells strings;
a second row of second string portions belonging to the same U-shaped memory cells strings to which the first string portions of the further first row belong;
a further second row of second string portions belonging to the same U-shaped memory cells strings to which the first string portions of the first row belong, and a second packet of said two packets, following the first packet in said second direction, may comprise, following one another in the second direction:

a second row of second string portions;
a further second row of second string portions;
a first row of first string portions belonging to the same U-shaped memory cells strings to which the second string portions of the further second row belong;
a further first row of first string portions belonging to the same U-shaped memory cells strings to which the second string portions of the second row belong.

Still according to the solution proposed in this document, a method for making a three-dimensional, 3D, memory device is proposed. The method includes:

forming a plurality of U-shaped memory cells strings each one including a buried string portion formed in a substrate, a first bit line selector side string portion or first bit line selector side pillar and a second source line selector side string portion or second source line selector side pillar, in which the buried string portion is connected to a first end of the first string portion and to a first end of the second string portion, each of the U-shaped memory cells strings including a stack of memory cells along the first string portion and a stack of memory cells along the second string portion;

forming realizing layers intended to form bit line selectors and source line selectors and control gates of the memory cells of the memory cells stacks formed along the first and second string portions.

First groups of first string portions are aligned along a first direction to form a respective first row of first string portions; second groups of second string portions are aligned along the first direction to form a respective second row of second string portions. The first rows of first string portions and the second rows of second string portions follow one another, alternately or in pairs, along a second direction transverse to the first direction.

First rows of first string portions and/or second rows of second string portions consecutive along said second direction are spaced apart from each other by a respective distance.

The method comprises forming, between a first row of first string portions and a second row of second string portions consecutive along said second direction and spaced apart a distance equal to or less than the minimum distance allowed by the resolution of the manufacturing technology, a respective slit extending in a third direction, orthogonal to said first and second directions, from said second end down to the substrate, said slit interrupting the layers forming the bit line selectors and the source line selectors and the control gates of the memory cells of the stacks of memory cells formed along the first and second string portions, and wherein said slit has a dimension, along said second direction, smaller than, equal to or greater than said minimum distance (D), and wherein slit walls lying in planes parallel to said first and third directions delimit the first and second string portions of the first and second consecutive rows.

Thanks to the solution proposed in this document it is possible to realize 3D semiconductor memories with improved data storage capacity with respect to what is known in the art.

BRIEF DESCRIPTION OF THE ATTACHED DRAWINGS

These and other features and advantages of the solution proposed in this document will appear more clearly from the reading of the following detailed description of some of its exemplary embodiments, to be understood as non-limitative. For better intelligibility, in the following description reference will be made to the accompanying figures, briefly presented below:

FIGS. 1-8 refer to a first embodiment of the solution proposed in this document, and in particular:

FIGS. 1A, 1B and 1C schematize a portion of a matrix of memory cells of a 3D semiconductor memory according to the first embodiment of the solution proposed in the present document, respectively in axonometric view, in plan view from above and in side view, in a manufacturing phase;

FIGS. 1D, 1E and 1F are views similar to those of FIGS. 1A, 1B and 1C, respectively, but with several layers of material not shown;

FIGS. 2A and 2B depict the structure of two different types of memory cell, respectively a "Charge Trap" type in FIG. 2A and a "Floating Gate" type in FIG. 2B, usable in the array of memory cells according to the solution proposed in this document;

FIGS. 4A, 4B and 4C are views similar to those of FIGS. 3A, 3B and 3C in a still subsequent manufacturing phase;

FIG. 5 is a view similar to that of FIG. 4A, in a subsequent manufacturing phase;

FIG. 6B is a plan view of what is shown in FIG. 6A;

FIG. 6C is similar to FIG. 6B but with some elements shown in semi-transparency;

FIGS. 6D and 6E are two side views of FIG. 6A, from two different sides;

FIGS. 8A, 8B and 8C show, in axonometric views from various points of view, an elementary block of the memory cell array according to the first embodiment of the preceding figures;

Figure 10C:
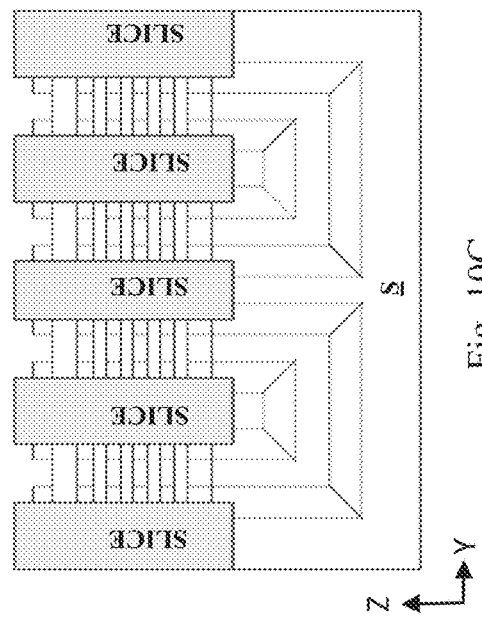
Figure 10B:
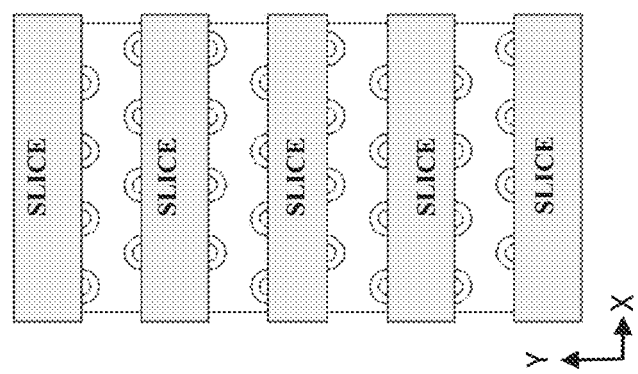
Figure 10A:
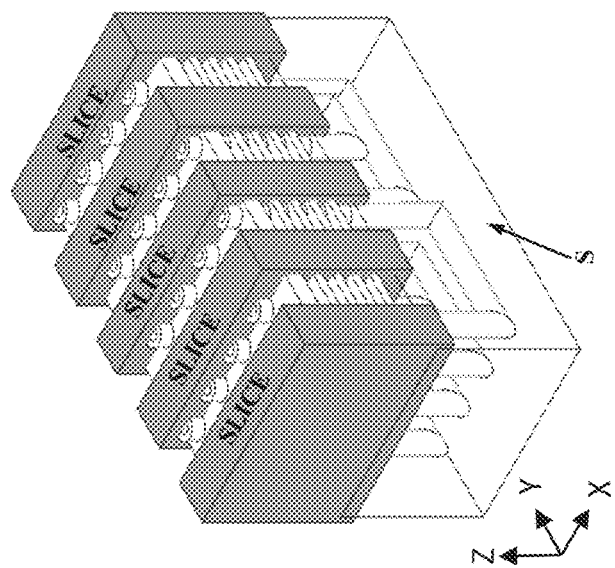
Figure 11C:
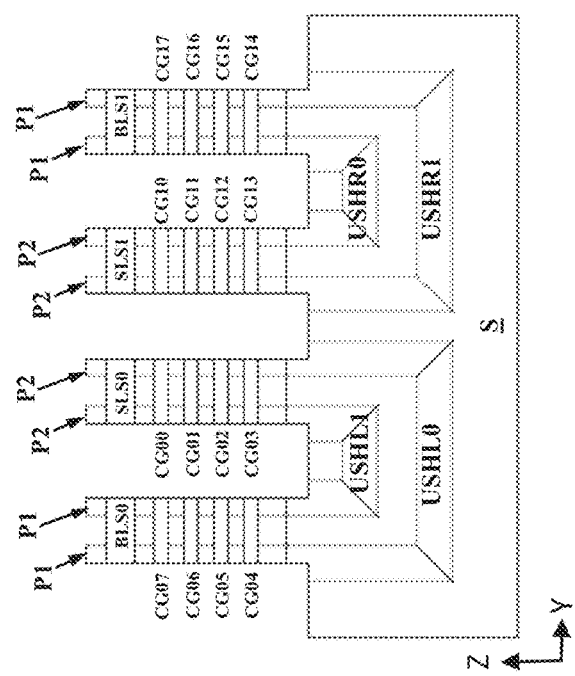
Figure 11B:
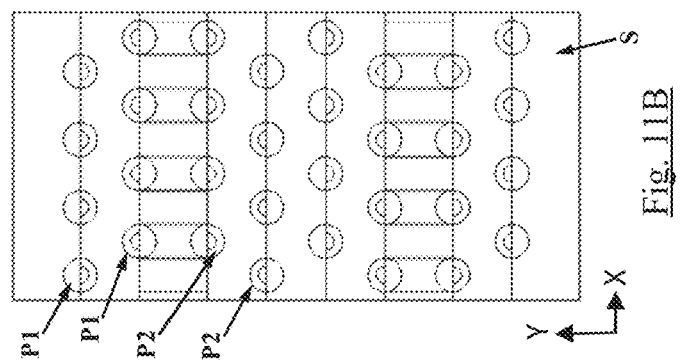
Figure 11A:
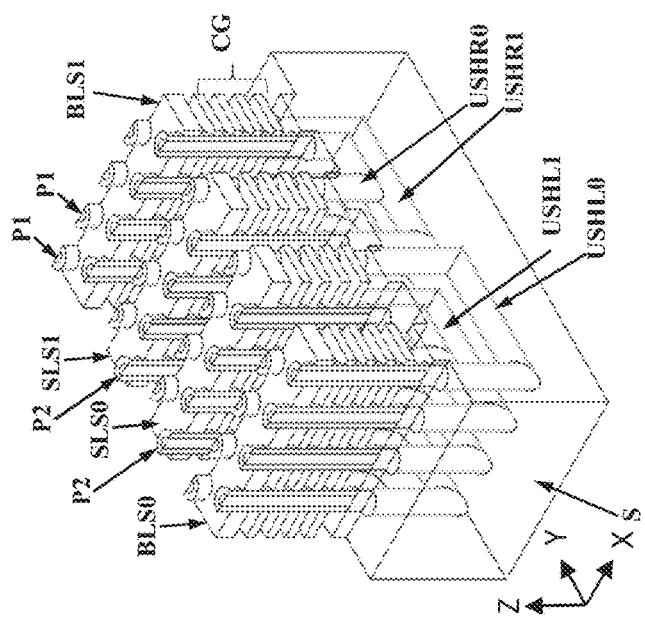
Figure 14:
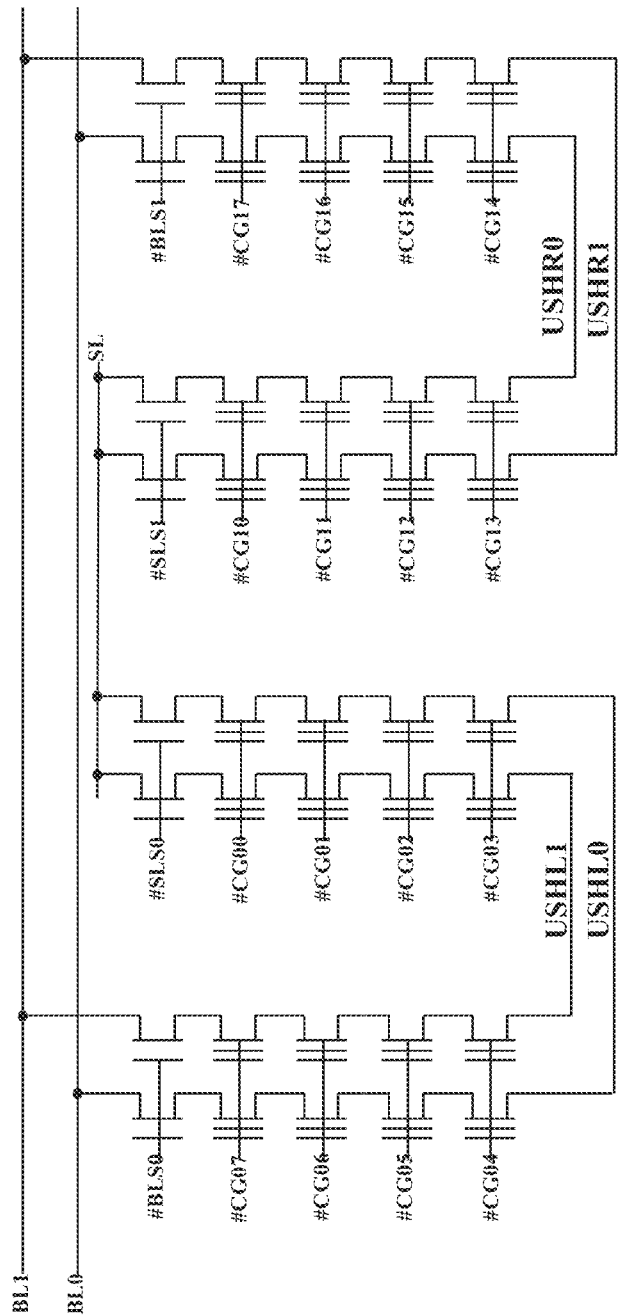
Figure 16C:
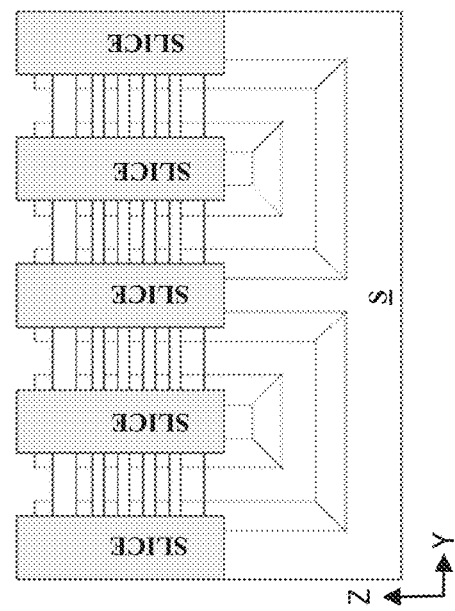
Figure 16B:
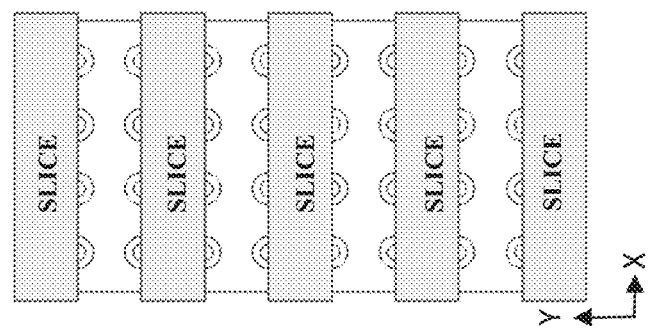
Figure 16A:
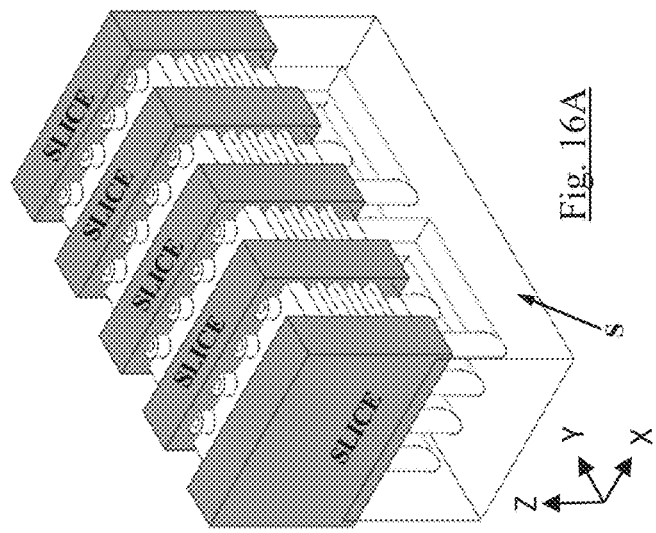
Figure 18:
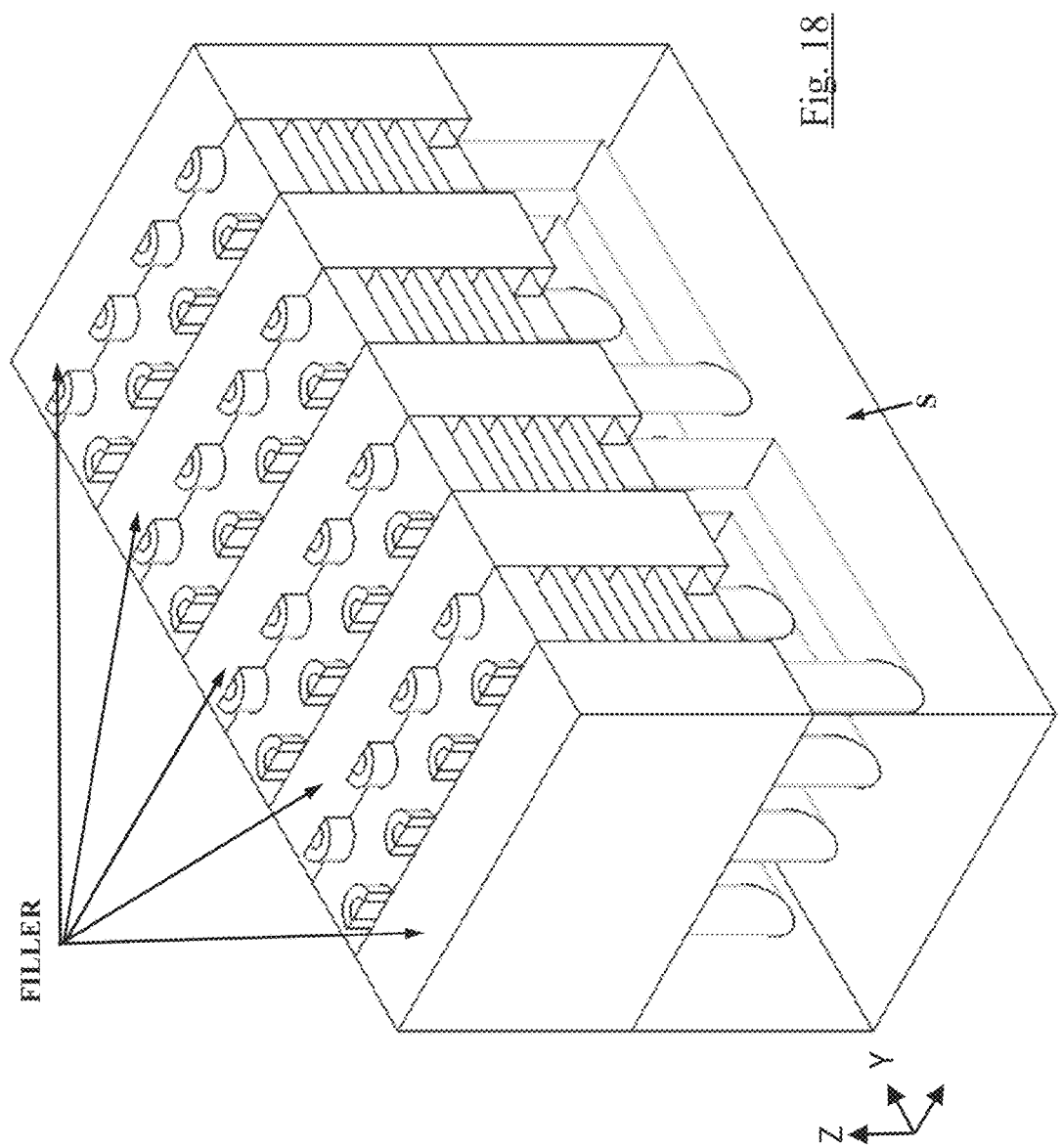
Figure 19E:
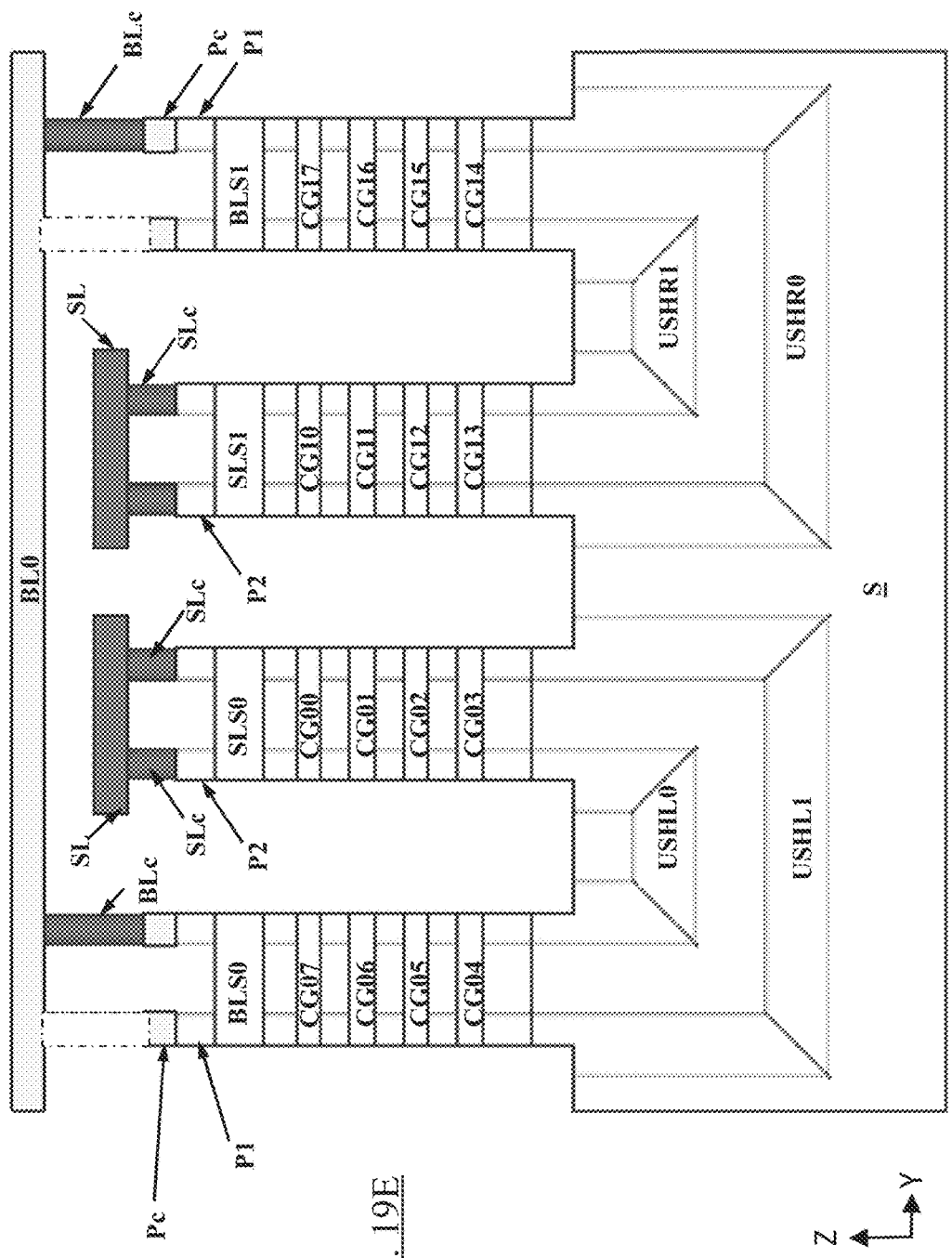
Figure 20:
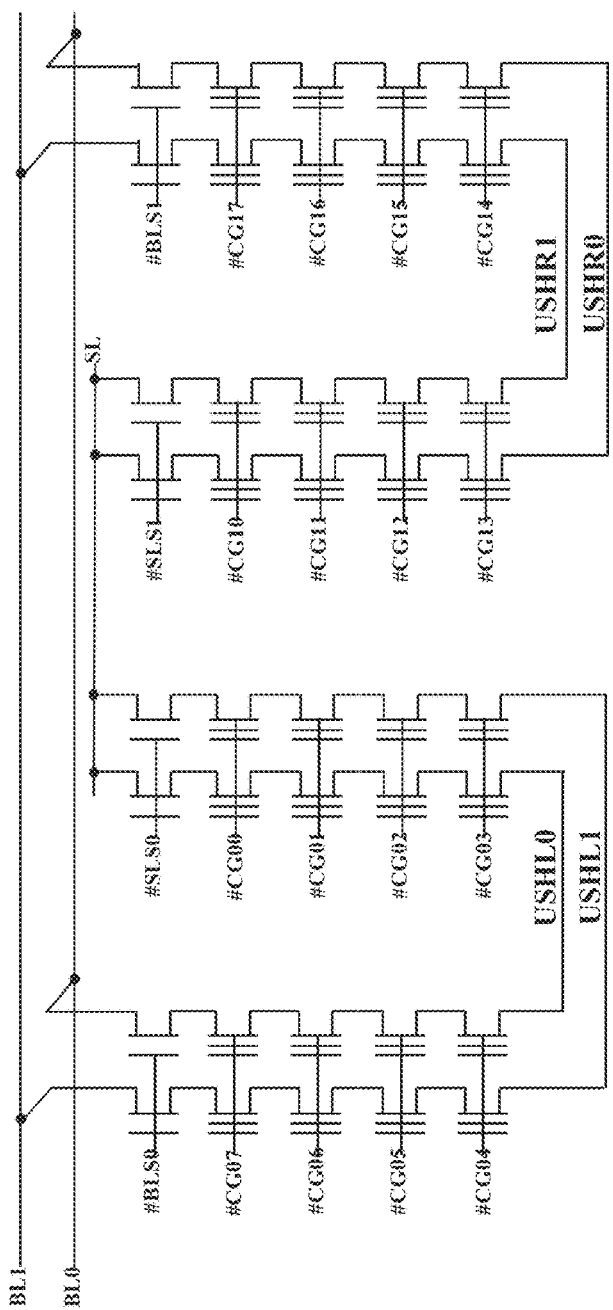
Figure 21A:
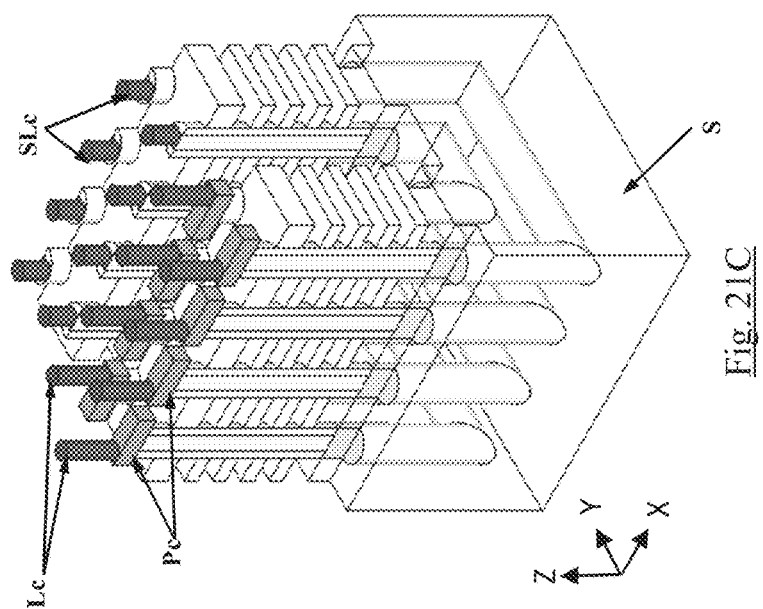
Figure 21B:
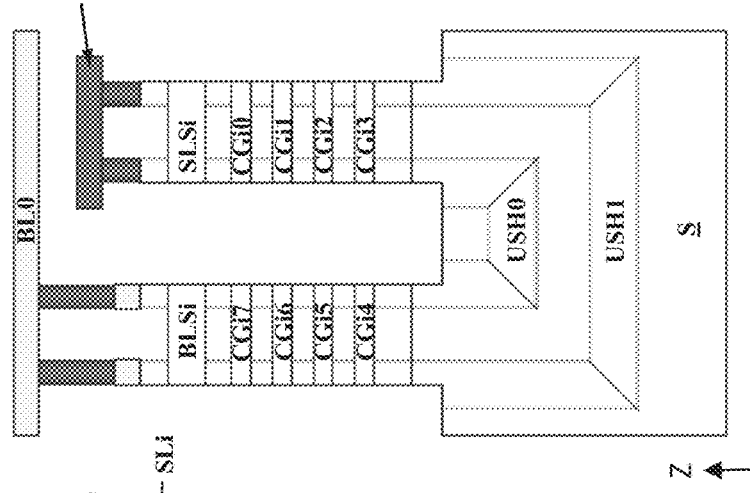
Figure 21C:
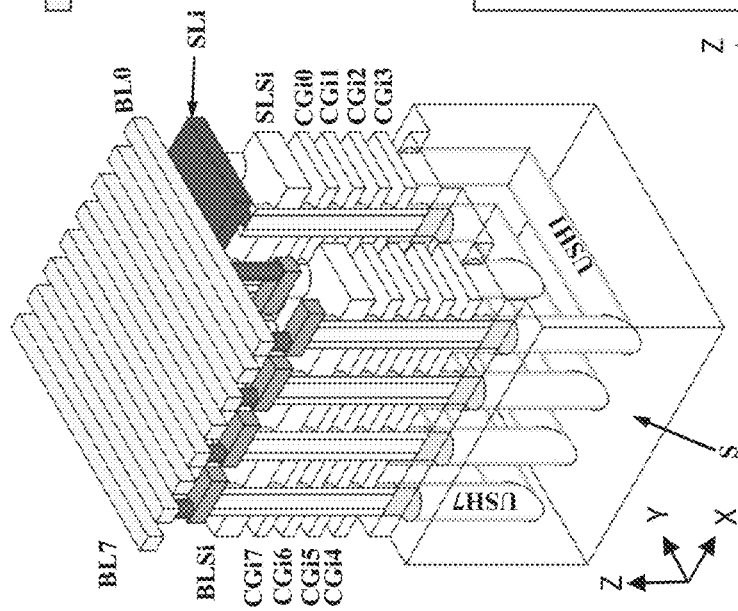
Figure 26A:
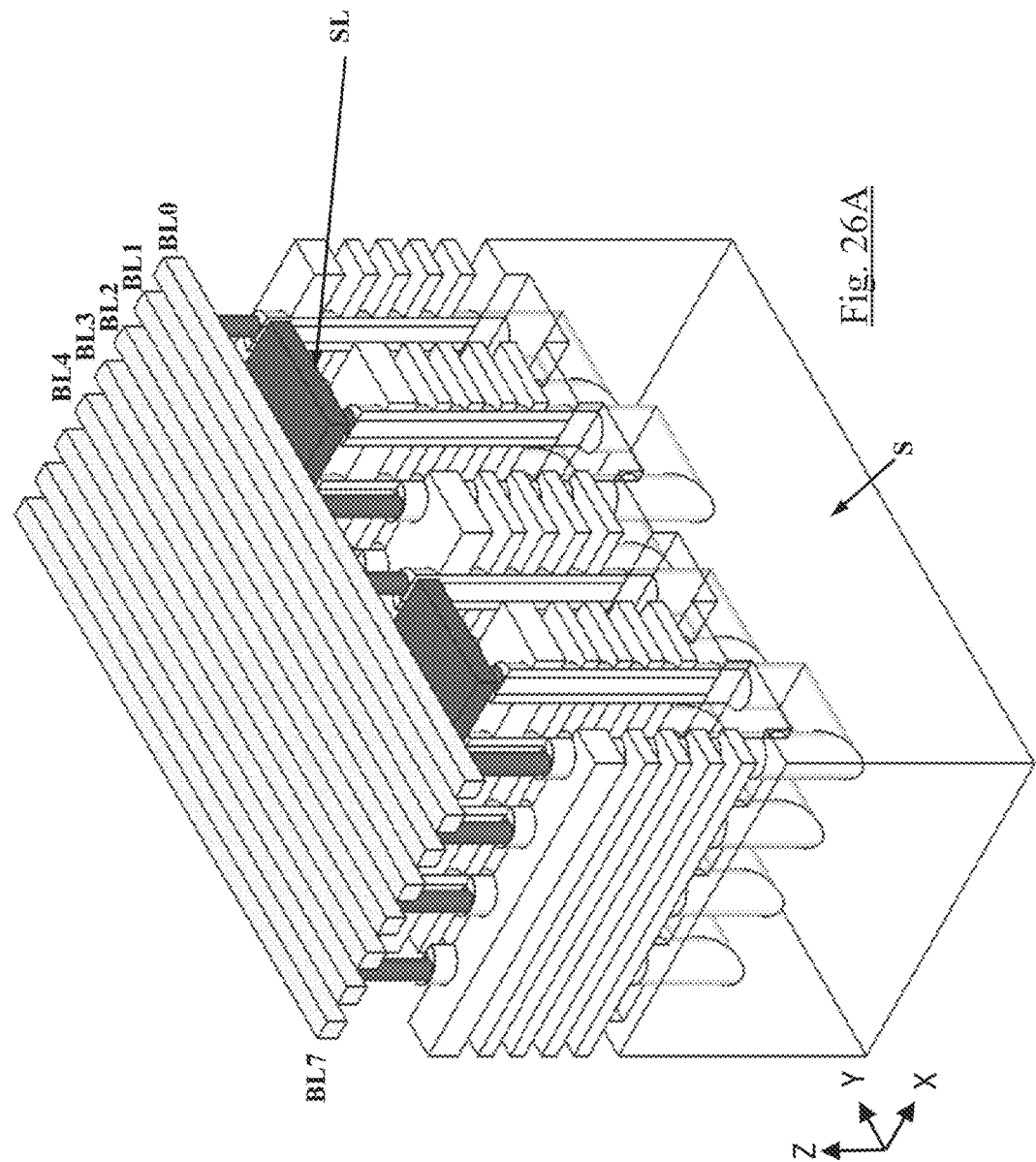
Figure 27:
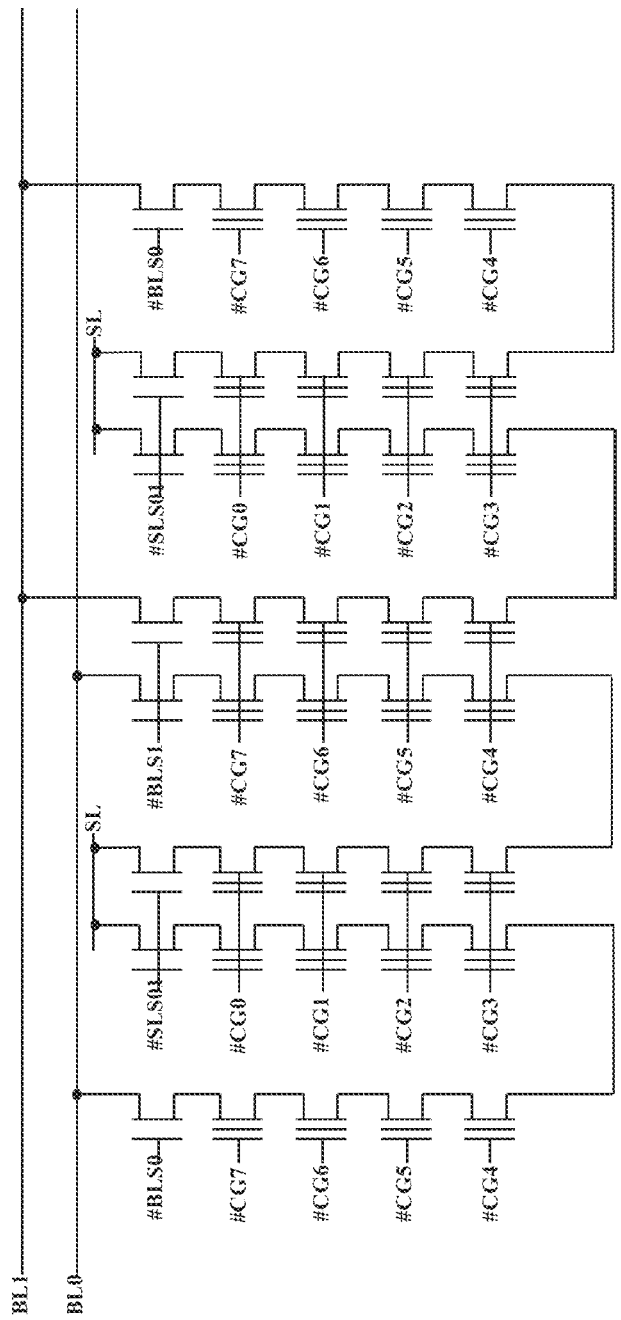
Figure 28A:
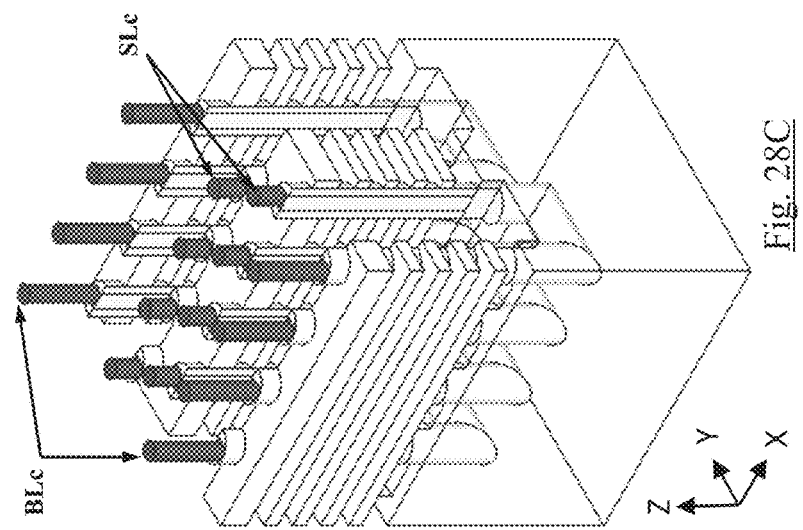
Figure 28B:
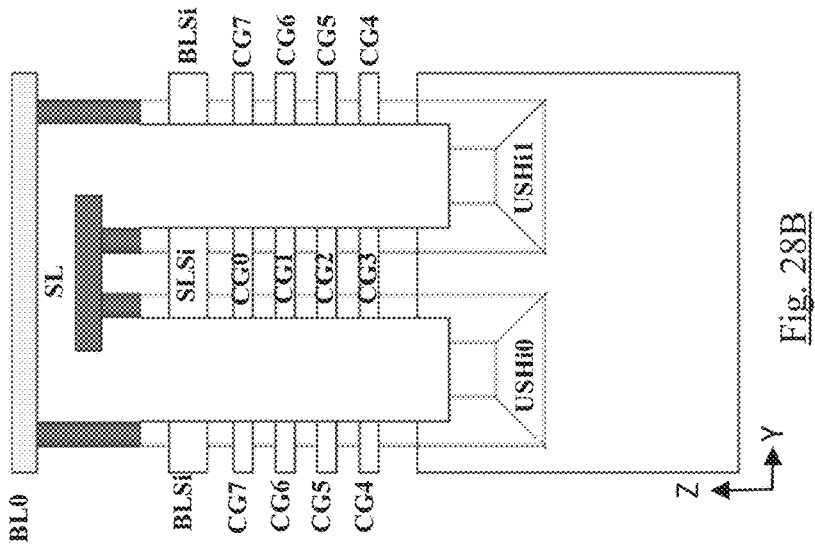
Figure 28C:
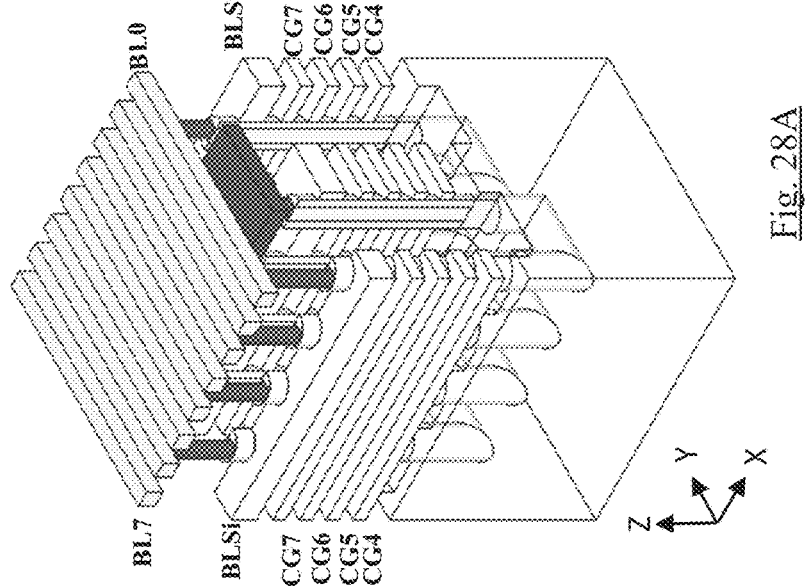
Figure 29A:
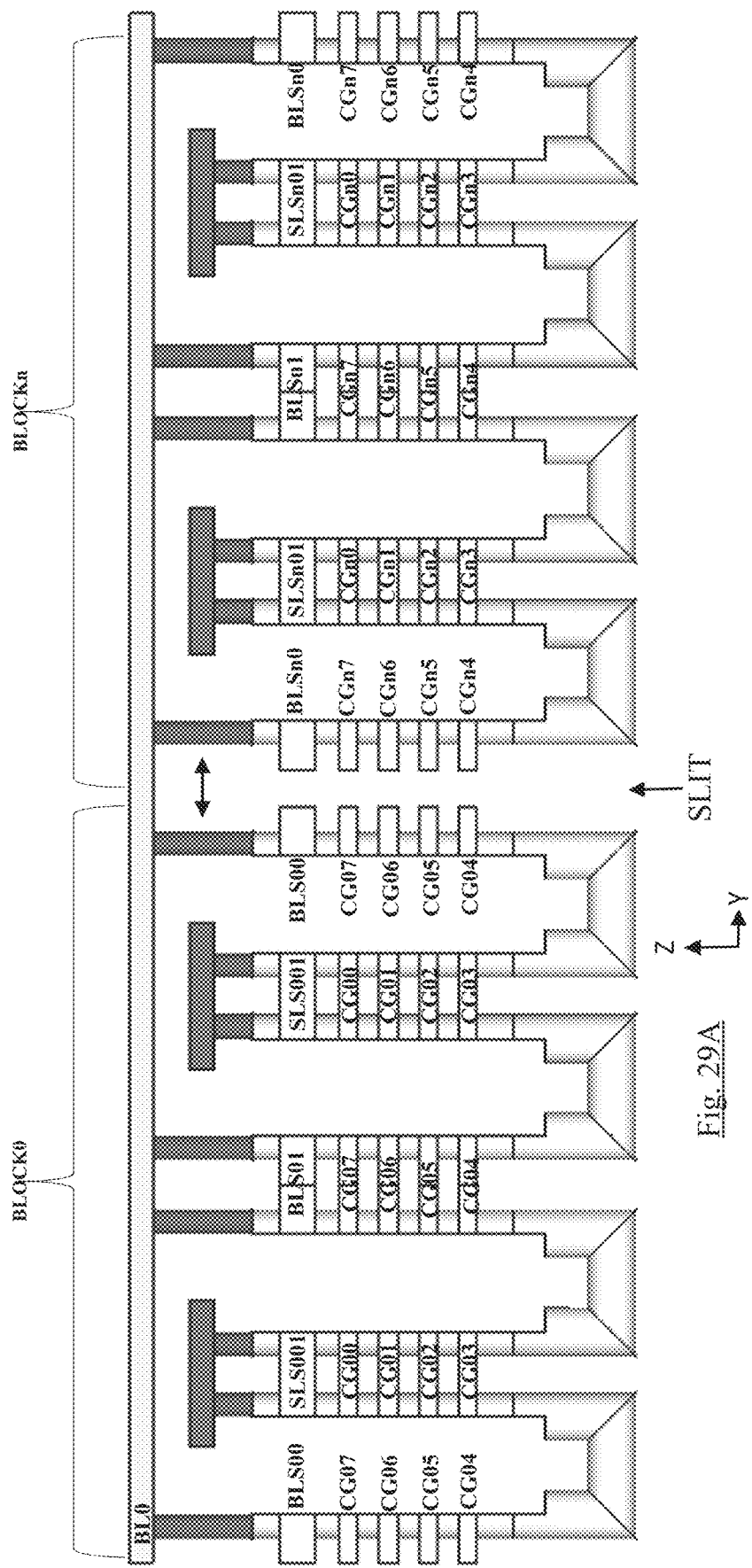
Figure 29B:
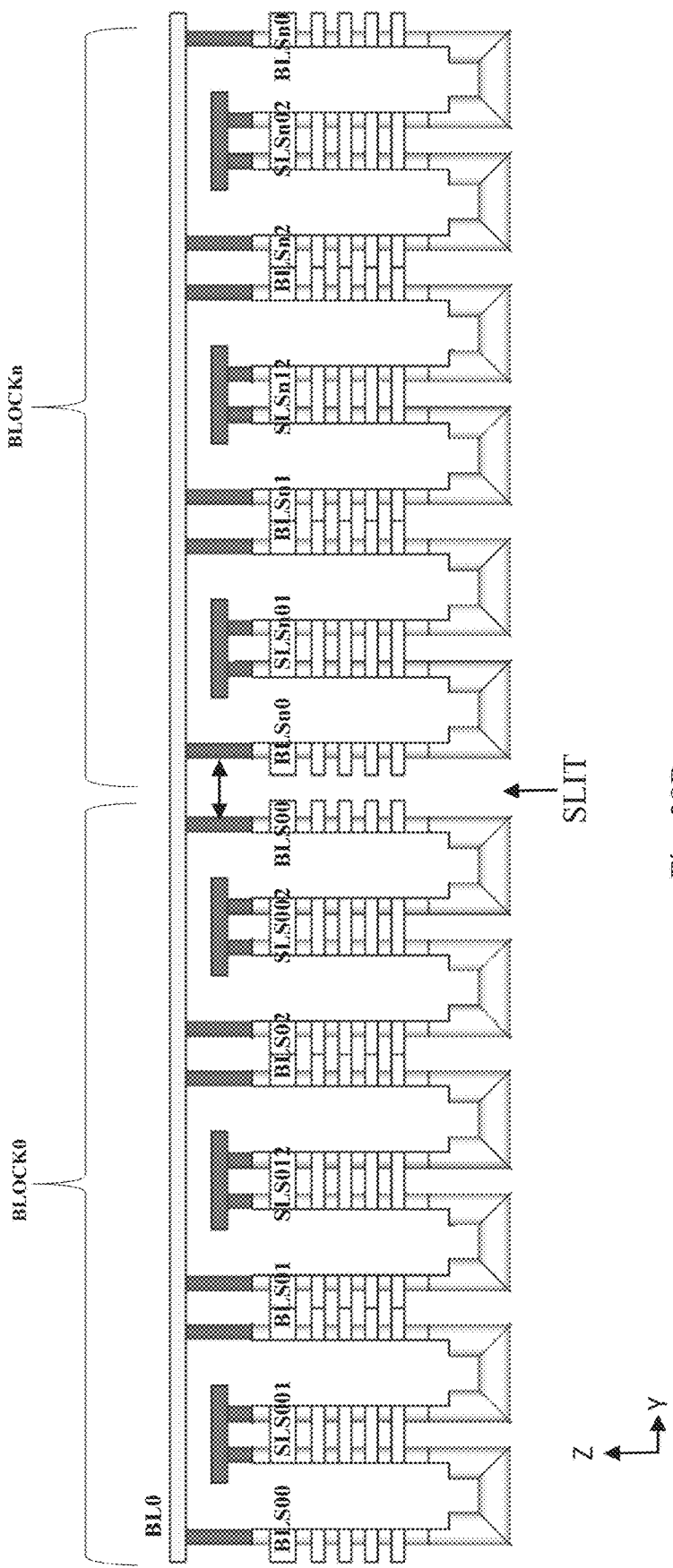
Figure 30F:
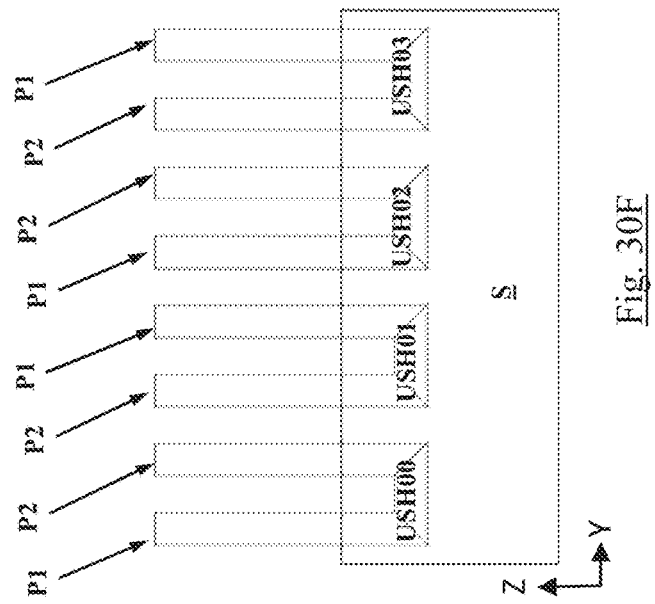
Figure 30E:
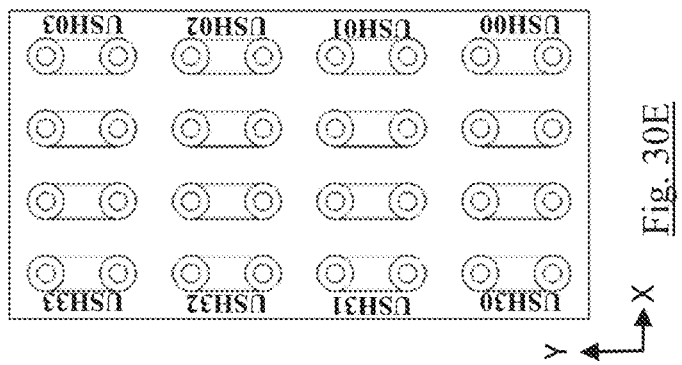
Figure 30D:
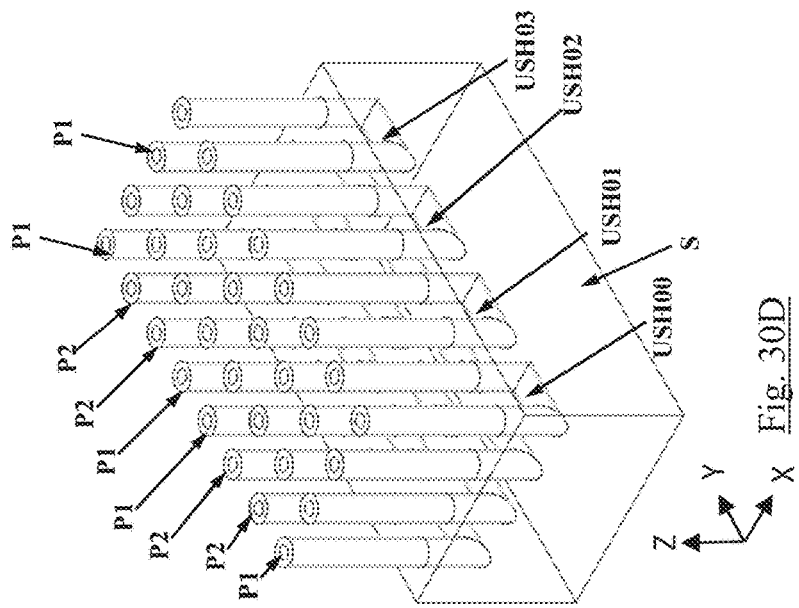
Figure 31C:
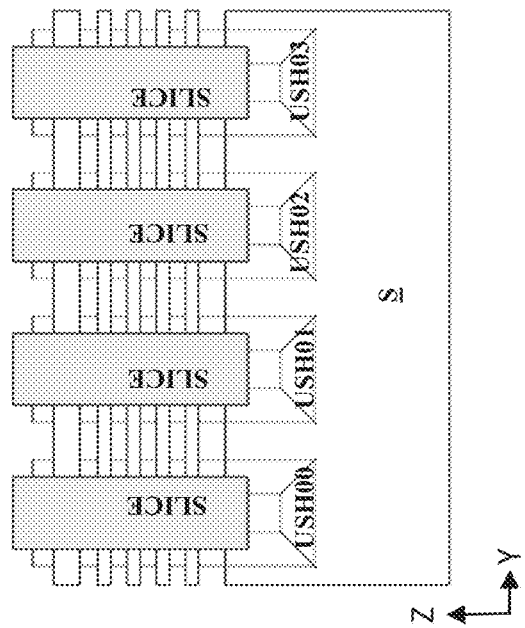
Figure 31B:
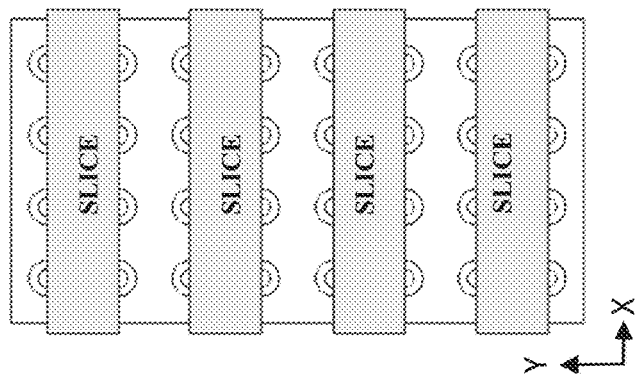
Figure 31A:
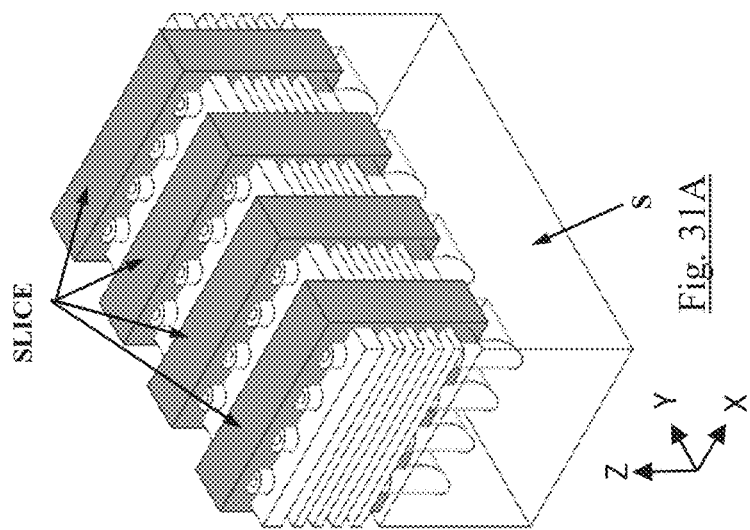
Figure 32C:
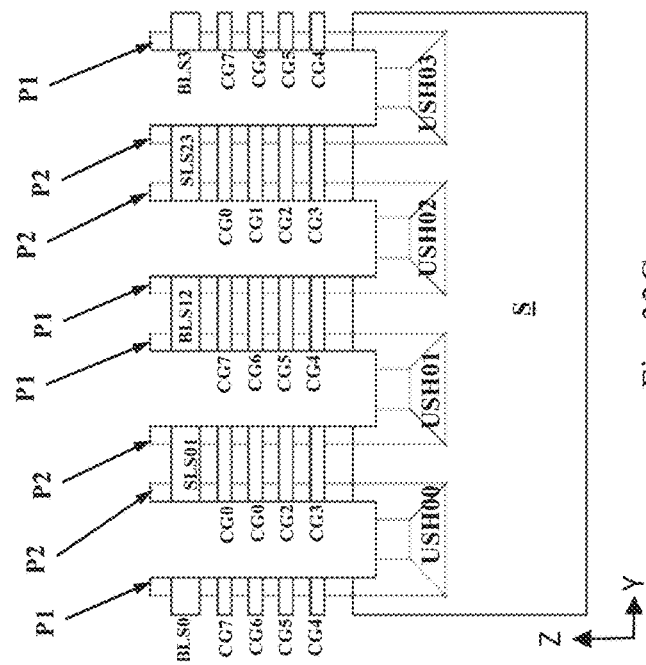
Figure 32B:
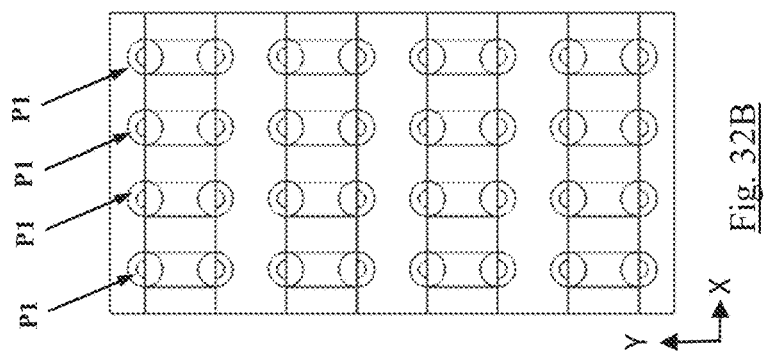
Figure 32A:
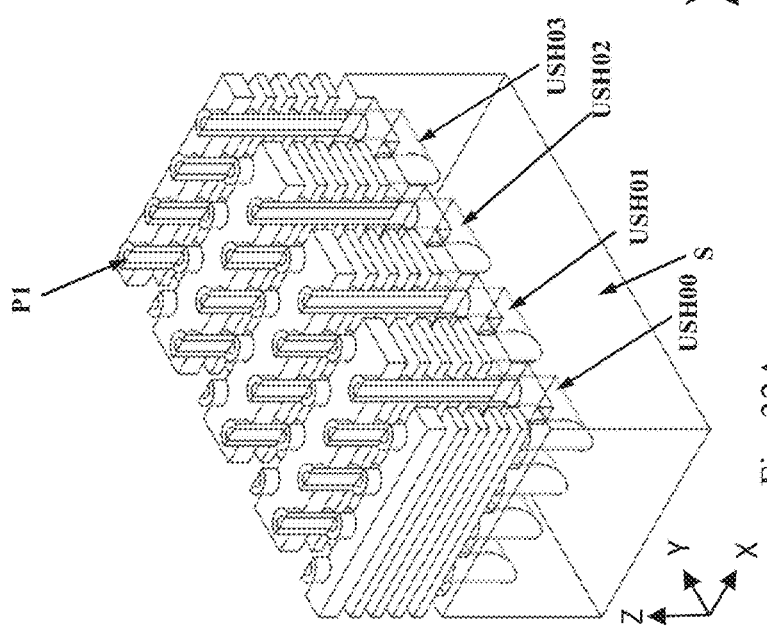
Figure 33:
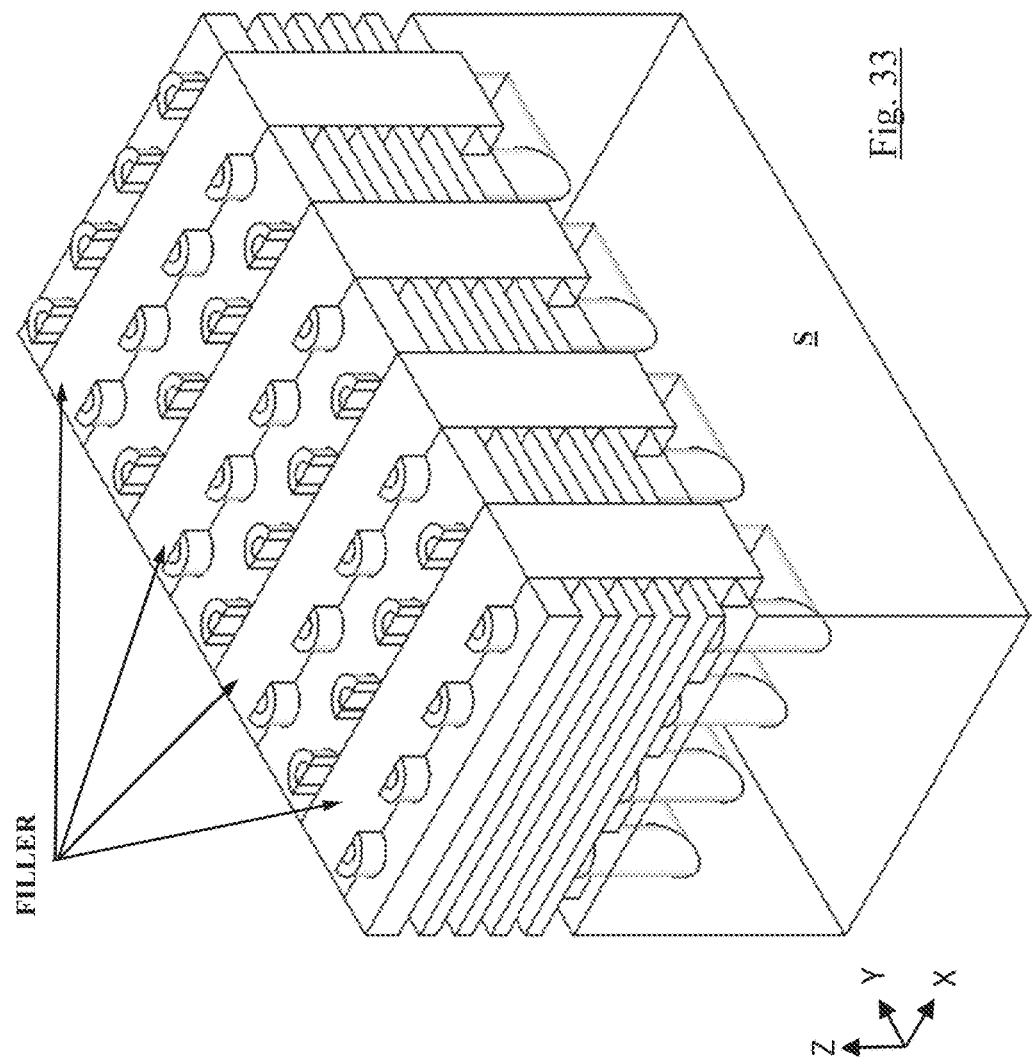
Figure 34A:
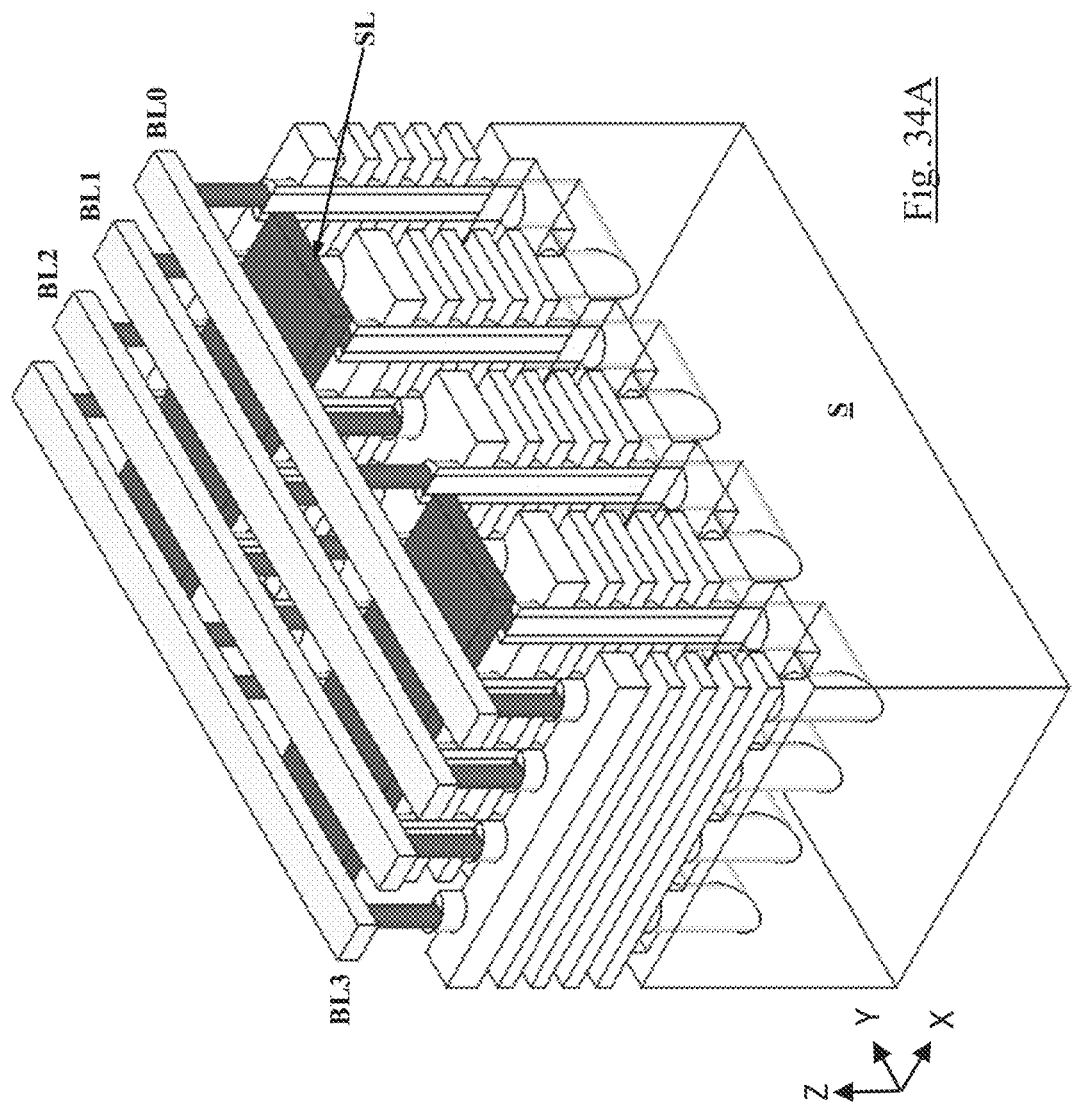
Figure 34E:
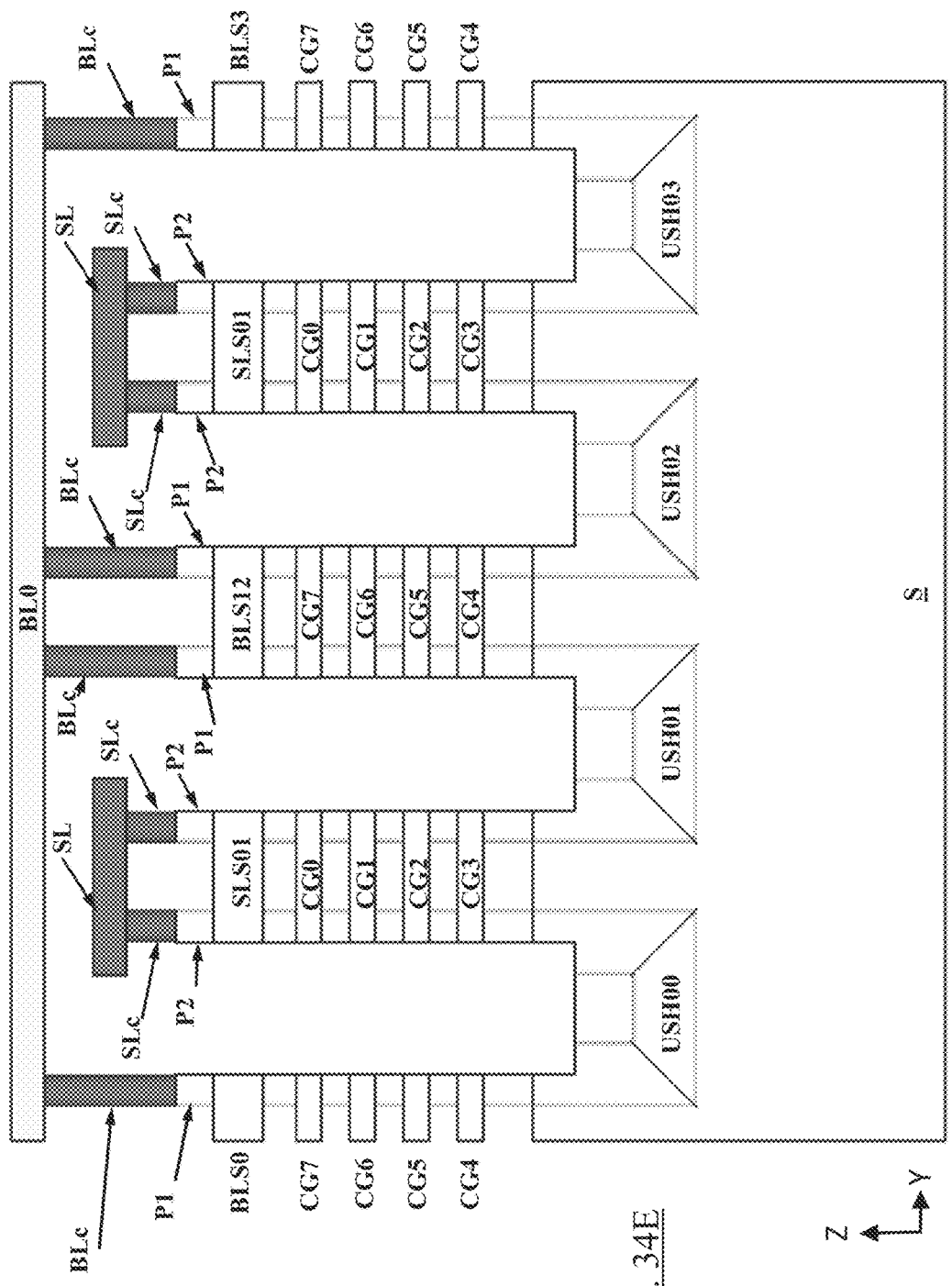
Figure 35:
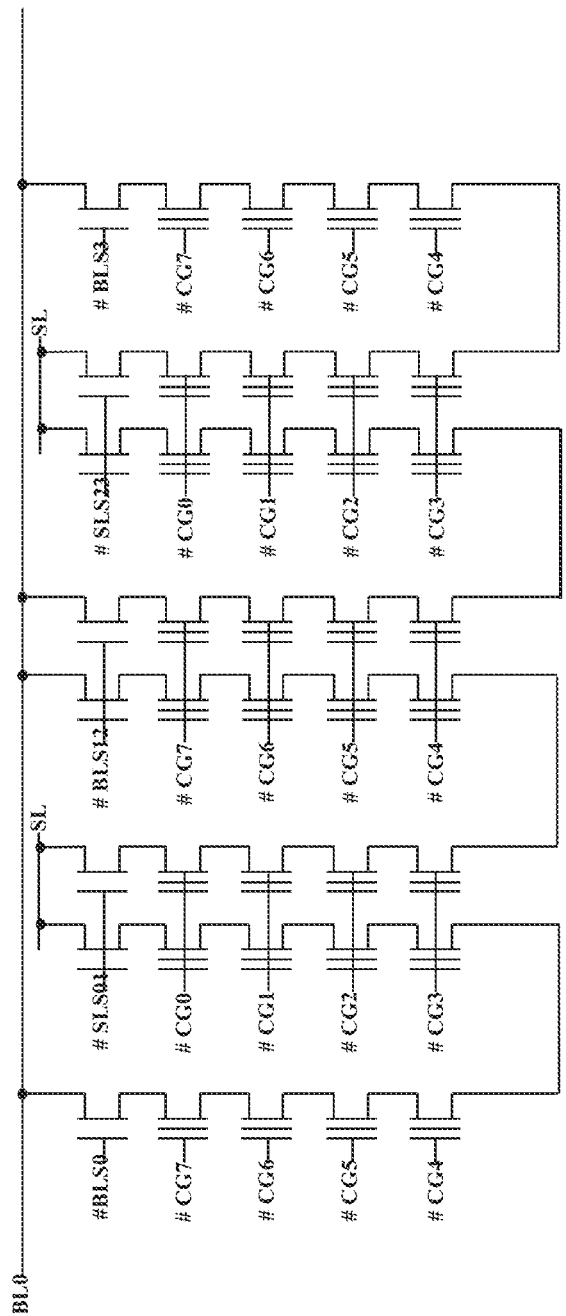
Figure 36C:
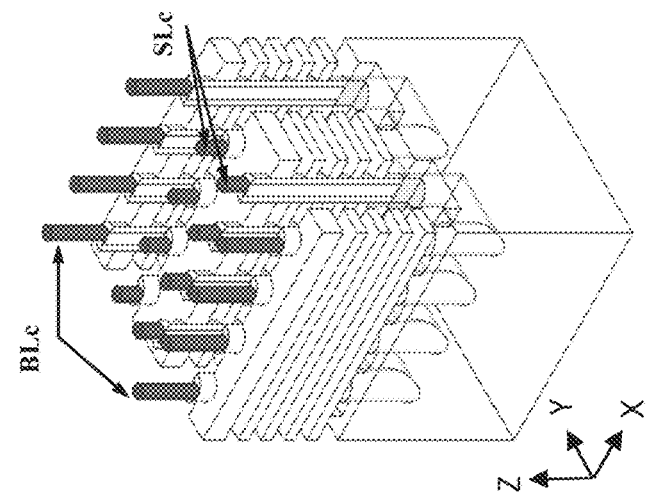
Figure 36B:
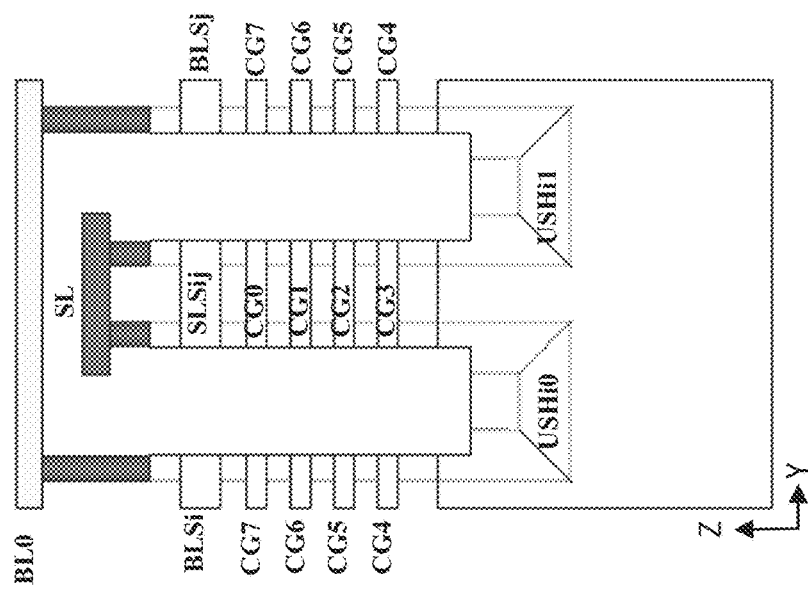
Figure 36A:
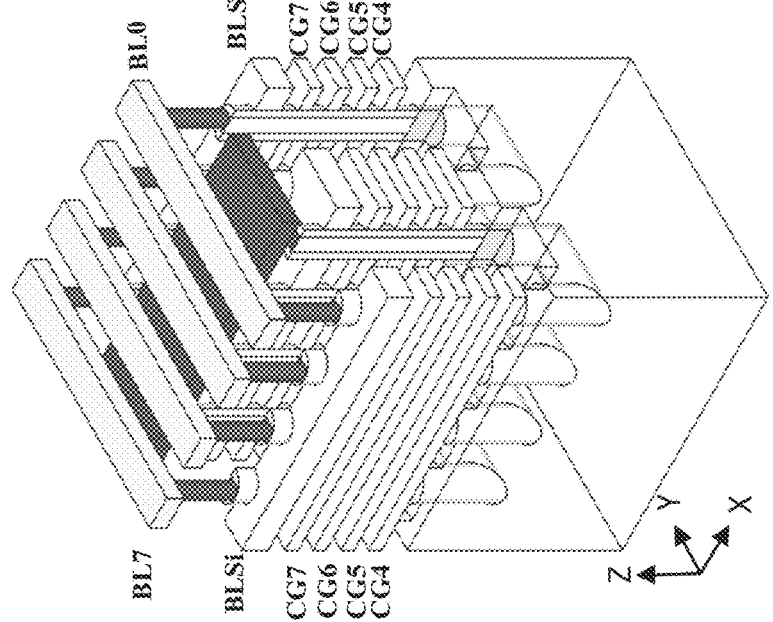
Figure 37A:
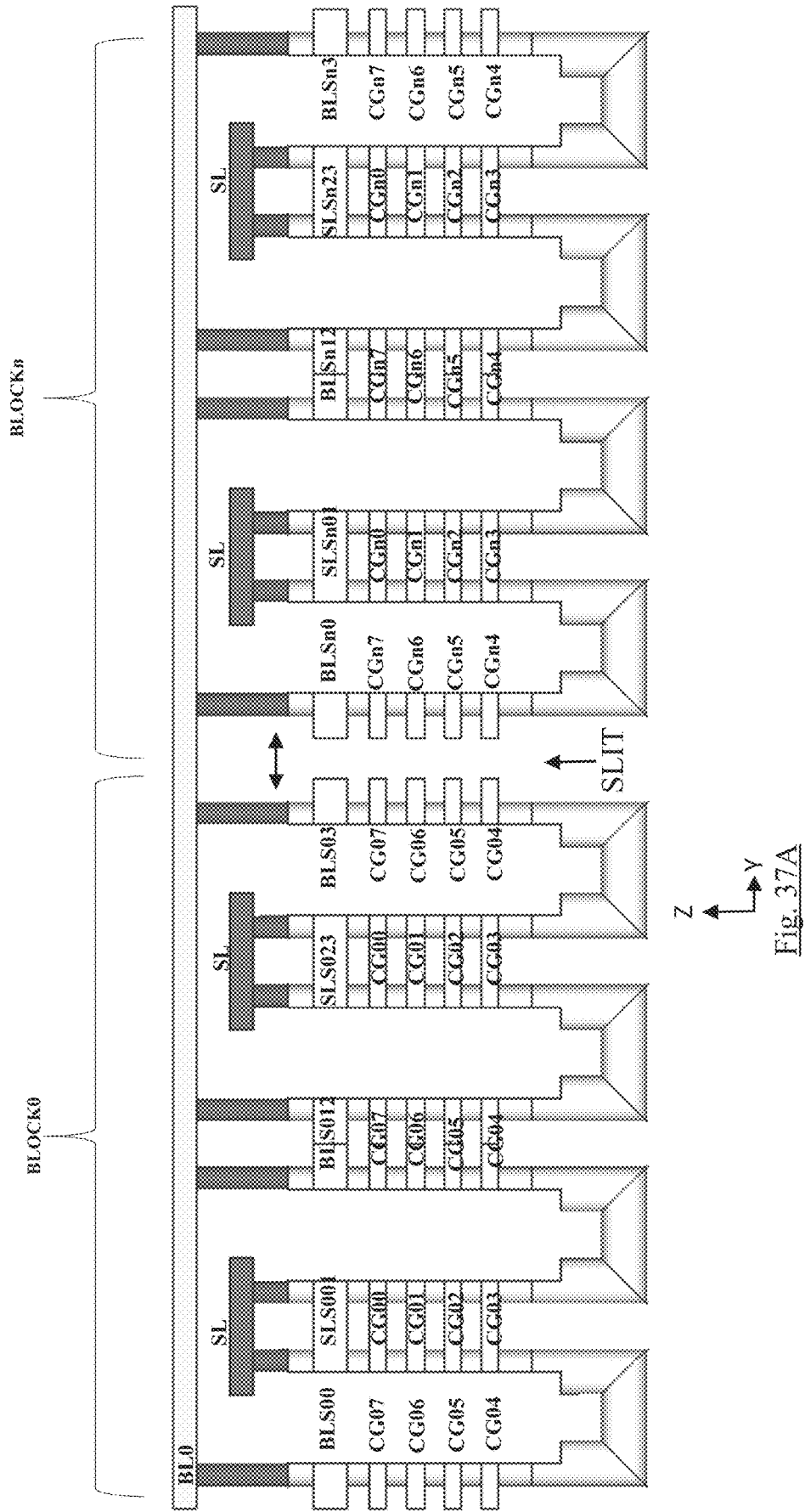
Figure 37B:
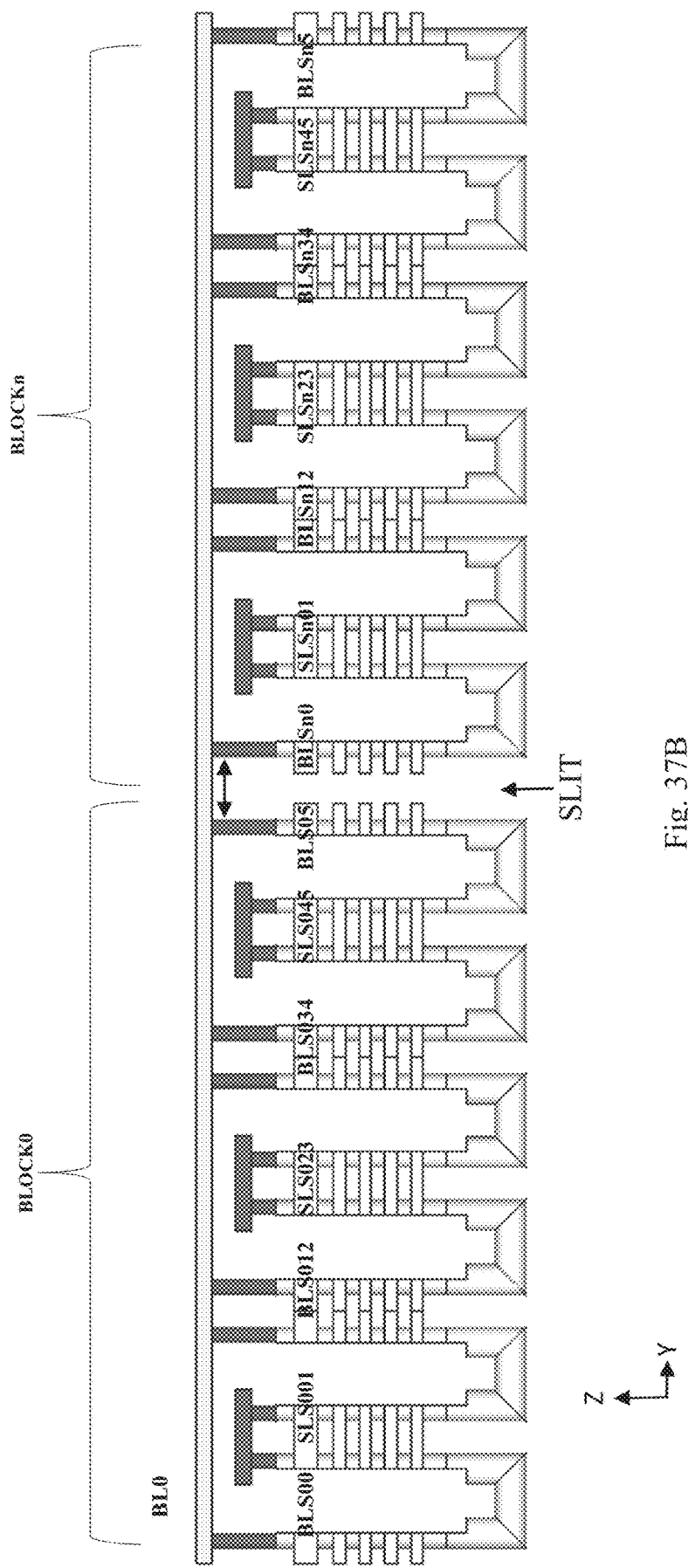

FIGS. 9-14 refer to a second embodiment of the solution proposed in this document, and in particular:

FIGS. 9A, 9B and 9C schematize a portion of a matrix of memory cells of a 3D semiconductor memory in accordance with the second embodiment of the solution proposed in the present document, respectively in axonometric view, in top plan view and in lateral view, in a manufacturing phase;

FIGS. 9D, 9E and 9F are views similar to those of FIGS. 9A, 9B and 9C, respectively, but with several layers of material not shown;

FIGS. 10A, 10B and 10C are views similar to those of FIGS. 9A, 9B and 9C, respectively, in a subsequent manufacturing phase;

FIGS. 11A, 11B and 11C are views similar to those of FIGS. 10A, 10B and 10C in a still later manufacturing phase;

FIG. 12 is a view similar to that of FIG. 11A, in a subsequent manufacturing phase;

FIG. 13A is a view similar to that of FIG. 12, in a subsequent manufacturing phase;

FIG. 13B is a plan view of what is shown in FIG. 13A;

FIG. 13C is similar to FIG. 13B but with some elements shown in semi-transparency;

FIGS. 13D and 13E are two side views of FIG. 13A, from two different sides;

FIG. 14 shows the equivalent electrical circuit of the structure of FIG. 13A;

FIGS. 15-21 relate to a third embodiment of the solution proposed in this document, and in particular:

FIGS. 15A, 15B and 15C schematize a portion of a matrix of memory cells of a 3D semiconductor memory according to the third embodiment of the solution proposed in the present document, respectively in axonometric view, in plan view from above and in side view, in a manufacturing phase;

FIGS. 15D, 15E and 15F are views similar to those of FIGS. 15A, 15B and 15C, respectively, but with several layers of material not shown;

FIGS. 16A, 16B and 16C are views similar to those of FIGS. 15A, 15B and 15C, respectively, in a subsequent manufacturing phase;

FIGS. 17A, 17B and 17C are views similar to those of FIGS. 15A, 15B and 15C in a still later manufacturing phase;

FIG. 18 is a view similar to that of FIG. 17A, in a subsequent manufacturing phase;

FIG. 19A is a view similar to that of FIG. 18, in a subsequent manufacturing phase;

FIG. 19B is a plan view of what is shown in FIG. 19A;

FIG. 19C is similar to FIG. 19B, but with some elements shown in semi-transparency;

FIGS. 19D and 19E are two side views of FIG. 19A, from two different sides;

FIG. 20 shows the equivalent electrical circuit of the structure of FIG. 19A;

FIGS. 21A, 21B and 21C show, in axonometric views from various points of view, a basic block of the memory cell array according to the third embodiment of the preceding figures;

FIGS. 22-29 refer to a fourth embodiment of the solution proposed in this document, and in particular:

FIGS. 22A, 22B and 22C schematize a portion of a matrix of memory cells of a 3D semiconductor memory in accordance with the fourth embodiment of the solution proposed in the present document, respectively in axonometric view, in top plan view and in lateral view, in a manufacturing phase;

FIGS. 22D, 22E and 22F are views similar to those of FIGS. 22A, 22B and 22C, respectively, but with several layers of material not shown;

FIGS. 23A, 23B and 23C are views similar to those of FIGS. 22A, 22B and 22C, respectively, in a subsequent manufacturing phase;

FIGS. 24A, 24B and 24C are views similar to those of FIGS. 23A, 23B and 23C in a still later manufacturing phase;

FIG. 25 is a view similar to that of FIG. 24A, in a subsequent manufacturing phase;

FIG. 26A is a view similar to that of FIG. 25, in a subsequent manufacturing phase;

FIG. 26B is a plan view of what is shown in FIG. 26A;

FIG. 26C is similar to FIG. 26B, but with some elements shown in semi-transparency;

FIGS. 26D and 26E are two side views of FIG. 26A, from two different sides;

FIG. 27 shows the equivalent electrical circuit of the structure of FIG. 26A;

FIGS. 28A, 28B and 28C show, in axonometric views from various points of view, an elementary unit of the matrix of memory cells according to the fourth embodiment of the previous figures;

29A and 29B show portions of the memory cell array consisting of two blocks, wherein each block comprises two elementary units, or three elementary units, respectively, as in FIG. 26E, put side-by-side;

FIGS. 30-37 relate to a fifth embodiment of the solution proposed in this document, and in particular:

FIGS. 30A, 30B and 30C schematize a portion of a matrix of memory cells of a 3D semiconductor memory according to the fifth embodiment of the solution proposed in the present document, respectively in axonometric view, in top plan view and in lateral view, in a manufacturing phase;

FIGS. 30D, 30E and 30F are views similar to those of FIGS. 30A, 30B and 30C, respectively, but with several layers of material not shown;

FIGS. 31A, 31B and 31C are views similar to those of FIGS. 30A, 30B and 30C, respectively, in a subsequent manufacturing phase;

FIGS. 32A, 32B and 32C are views similar to those of FIGS. 31A, 31B and 31C in a still later manufacturing phase;

FIG. 33 is a view similar to that of FIG. 32A, in a subsequent manufacturing phase;

FIG. 34A is a view similar to that of FIG. 33, in a subsequent manufacturing phase;

FIG. 34B is a plan view of what is shown in FIG. 34A;

FIG. 34C is similar to FIG. 34B, but with some elements shown in semi-transparency;

FIGS. 34D and 34E are two side views of FIG. 34A, from two different sides;

FIG. 35 shows the equivalent electrical circuit of the structure of FIG. 34A;

FIGS. 36A, 36B and 36C show, in axonometric views from various points of view, an elementary unit of the memory cell array according to the fifth embodiment of the preceding figures;

FIGS. 37A and 37B show, similarly to FIGS. 29A and 29B, portions of matrix memory cells consisting of two blocks, wherein each block includes two elementary units, respectively three elementary units, as in FIG. 34E put side-by-side.

DETAILED DESCRIPTION OF EXEMPLARY
EMBODIMENTS OF THE SOLUTION
PROPOSED IN THIS DOCUMENT

In the following, five embodiments of a memory cell array architecture for a 3D semiconductor memory will be presented according to the solution proposed in this document. The first embodiment will be described exhaustively, while, for the sake of brevity, for the subsequent embodiments the most significant differences with respect to the first or to other described embodiments will be described.

First Embodiment

A first embodiment of a memory cell array architecture for a 3D semiconductor memory is shown in FIGS. 1-8.

Starting from FIGS. 1A, 1B and 1C, there is schematized a portion of a memory cell array of a 3D semiconductor memory, respectively in axonometry, in plan view from above and in a side view, in a manufacturing phase. In FIGS. 1D, 1E and 1F the same matrix portion is shown, in views similar to the previous three views, but with some layers of material not shown for the purpose of greater clarity.

The shown array portion comprises two packets of memory cells strings which are generically in the shape of a "U" (hereinafter referred to as "U-shaped strings" for the sake of brevity). A generic U-shaped string comprises a plurality of memory cells arranged along a U-shaped tubular structure; in particular, the tubular structure comprises a first string portion (or first pillar) P1 and a second string portion (or second pillar) P2, both extending in the direction Z indicated in the figures; the first and second pillars P1 and P2 are joined by a lower tubular section (according to the orientation of the figures), or buried U-shaped string portion, such as the buried U-shaped string portions indicated with USHL0, USHL1, USHR0 and USHR1 in the figures, which electrically connects the first and second pillars P1 and P2 (the lower tubular portion or buried U-shaped string portion is typically made in a substrate S, which may a layer called "pipe gate", of the same material as the memory cell control gate, for example polycrystalline silicon—polysilicon—, or a layer made of a semiconductor material, for example silicon, or an insulating material, for example silicon oxide). As will emerge from the following, the first pillars P1 are the pillars on the bit line selector side (or, more shortly, bit line side pillars) and the second pillars P2 are the pillars on the source line selector side (or, more shortly, source line side pillars).

The first and second pillars P1 and P2 comprise various layers of material, which define the structure of the memory cells. In particular, the memory cells may for example be of the "Charge Trap" ("CT") type, as shown in FIG. 2A, or of the floating gate ("Floating Gate" or "FG") type, as shown in FIG. 2B. Without entering into excessive details, being both types of memory cells known to those skilled in the art, in the case of CT cells each of the two pillars P1 and P2 of a generic U-shaped string comprises, radially from its periphery towards its center, an outer blocking layer ("Blocking Layer"), an entrapment layer of electrical charges ("Charge Trap"), a layer of tunnel oxide ("Tunnel Ox"), a channel layer ("Channel") and a central filling layer ("Filler"). In the case of FG cells, each of the two pillars of a U-shaped string includes, always radially from its periphery towards its center, a layer of dielectric material ("Inter-poly Dielectric"), a layer forming the floating gate ("FG"), a layer of tunnel oxide ("Tunnel Ox"), a channel layer ("Channel") and a central filling layer ("Filler"). The type, that is, the specific structure of the memory cells is not however essential for the solution presented in this document, which is for example applicable both to CT memory cells and to FG memory cells as well as to memory cells of different structure.

With the reference numeral CG, the layers of material (for example, in polysilicon) which will form a control gates of the memory cells are globally indicated, arranged stacked (in succession along the Z direction) around the first and second pillars P1 and P2 of the U-shaped strings. FIGS. 1A, 1B and 1C relate to a manufacturing phase of the memory matrix preceding the photolithographic definition of the layers which will form the control gates.

In the example shown in the figures, there are four control gate layers: each pillar P1 or P2 of a generic U-shaped string therefore comprises 4 memory cells in succession (stacked) along the Z direction, and the memory is said to be a "4 Layers" memory. Known in the art are 3D memory devices with different number of layers, for example with 24, 36 and even 48 layers, in which each pillar P1 or P2 a generic U-shaped string contains, respectively, 24, 36 and 48 stacked memory cells (and a corresponding number of control gates). The solution presented in this document (in particular, any of the embodiments that will be described herein) is applicable regardless of the number of layers (i.e., irrespective of the number of memory cells stacked in the pillars P1 and P2 of the U-shaped strings).

Each of the two packets of U-shaped strings includes 8 U-shaped strings, for a total (in the considered example of a 4-layer memory) of (4+4)×8=64 memory cells for each packet. In each of the two packets, the 8 U-shaped strings follow each other along the direction X indicated in the figures. The 8 U-shaped strings of each packet comprise 4 first U-shaped strings whose first and second pillars P1 and P2 are spaced apart from each other by a first distance (in the Y direction) and extend into the substrate S down to a first depth (direction Z), and 4 second U-shaped strings whose first and second pillars P1 and P2 are spaced apart from each other by a second distance (in the Y direction), smaller (for example, about half) of the first distance and extend into the substrate S down to a second depth, less (for example, about half) of the first depth; in each packet of U-shaped strings, the 4 first strings and the 4 second strings are mutually alternating along the X direction. The structure (the two packets of 8 U-shaped strings) is specular with respect to a plane (indicated by line A-A in FIG. 1B) parallel to the XZ plane (consequently, first U-shaped strings of the first packet face, in the direction Y indicated in the figures, first U-shaped strings of the second packet). Moving along the Y direction, from one or the other of the two lateral ends towards the centerline of the structure, there are 4 first pillars P1 (of the 4 first U-shaped strings of a packet) aligned along the X direction, followed by 4 first pillars P1 (of the 4 second U-shaped strings of the same packet) aligned along the X direction, followed by 4 second pillars P2 (of the 4 second U-shaped strings of the packet) aligned along the X direction, followed by 4 second pillars P2 (of the 4 first U-shaped strings of the packet). That is, there are rows (along the X direction) of first pillars P1 or of second pillars P2, such rows being consecutive along the Y direction. Along the Y direction there are 4 generally zig-zag arrangements of pairs of first pillars P1 and pairs of second pillars P2 (a pair of first pillars P1, followed by a pair of second pillars P2, followed by another pair of second pillars P2 followed by another pair of first pillars P1).

Reference numeral Sel indicates a layer of material that will form bit line selectors and source line selectors. The bit line selectors will be used to selectively electrically connect/disconnect a first pillar P1 (bit line side pillar) of a generic U-shaped string to a respective bit line. The source line selectors will be used to selectively electrically connect/disconnect a second pillar P2 (source line side pillar) of a generic U-shaped string to a source line. The bit line and source line selectors can, for example, be MOS transistors.

Figure 1G:
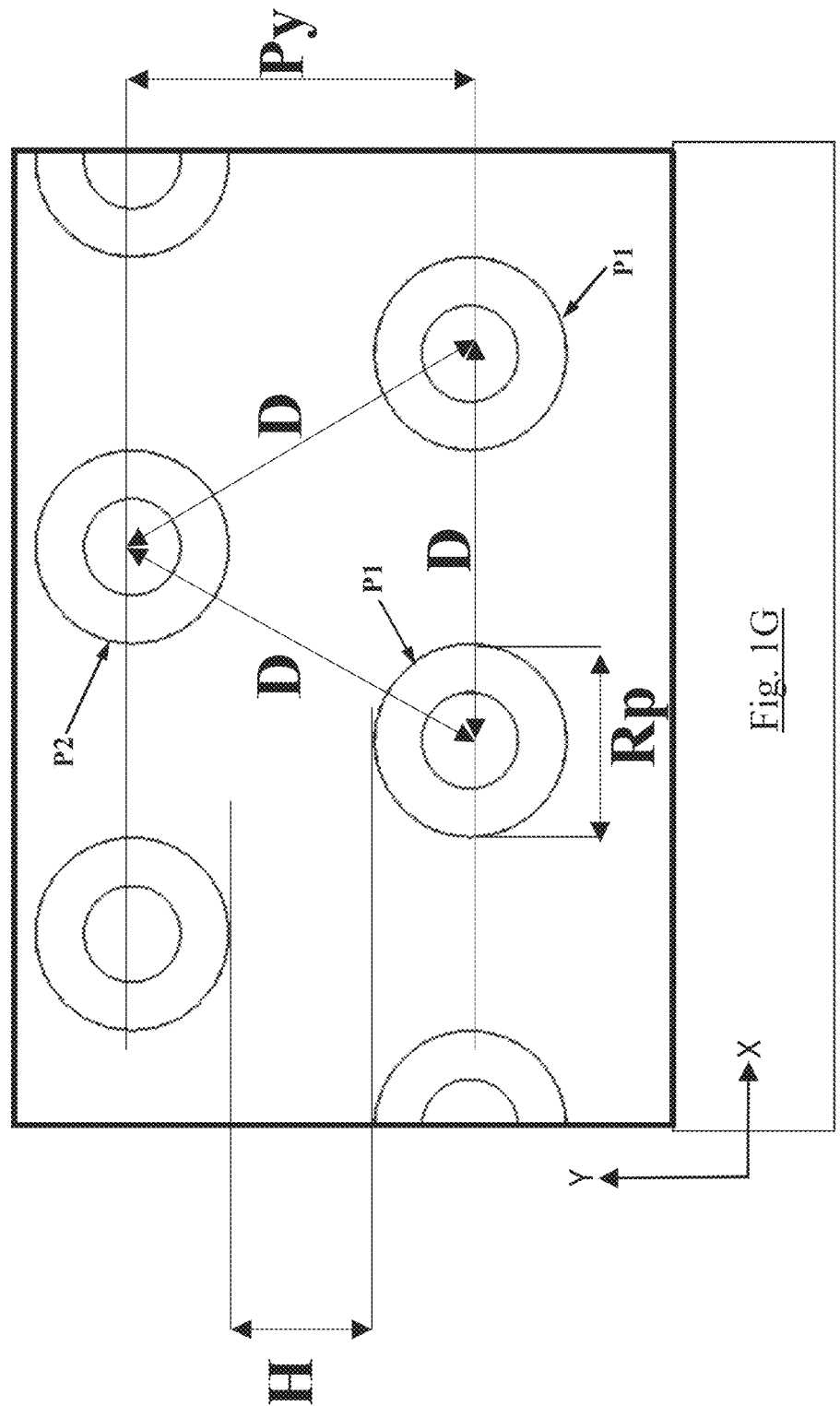
FIG. 1G is an enlargement of a part of the portion of memory cells matrix shown in FIG. 1B, with an indication of relevant geometric distances.

In the enlargement of a part of FIG. 1B shown in FIG. 1G, relevant geometric dimensions of the structure are indicated. In particular, reference Rp indicates the width (in the X direction) of the generic first or second pillar P1 or P2 of a U-shaped string of memory cells. The first and second pillars P1 and P2 of the U-shaped strings can, for example (as in the figures) have a cylindrical shape, so that their width Rp in the direction X coincides substantially with their width in the Y direction and corresponds to the diameter of the cylinders that form the pillars P1 and P2. Reference H indicates the distance between the edges of two adjacent pillars P1, P2 in the Y direction. Reference D indicates the distance between the center of a generic pillar P1, P2 and the center of a pillar P1, P2 adjacent thereto in the X or Y direction.

Technological constraints determine the minimum value of the width Rp of the pillars P1, P2 and the minimum value of the distance D between the center (i.e., the axis) of a generic pillar P1, P2 and the center of an adjacent pillar P1, P2 (in other words, there is a technological constraint on the minimum value of the radius of an imaginary circle centered on the center of a generic pillar P1, P2: the centers of the adjacent pillars P1 or P2 must lie on the circumference of this imaginary circle, or outside of it. Thanks to the staggered arrangement in the direction X of half a distance D of the pillars P2 with respect to the pillars P1, the distance Py between the two adjacent rows of pillars P1, P2 (measured between the centers, i.e., between the axes, of the respective pillars P1, P2) is less than the distance D: the minimum value of the distance Py may in this case be less than the minimum value (technological constraint) of the distance D. Therefore, the staggered arrangement of the pillars P1, P2 allows to obtain a greater compactness of the structure in the Y direction with respect to the case where the pillars P2 are facing the pillars P1 (in which case the minimum distance Py should coincide with the minimum value of distance D allowed by the technology). Referring to the portion of a memory cell array of FIG. 1B, starting from the bottom and moving along the X direction, the distance Py between the first two rows of pillars P1, P2 may be less than the minimum distance D imposed by the technology; the distance Py between the second and third rows of pillars P1, P2 cannot be less than the minimum distance D imposed by the technology; the distance Py between the third and the fourth rows of pillars P1, P2 can be less than the minimum distance D imposed by technology, and so on.

Figure 3C:
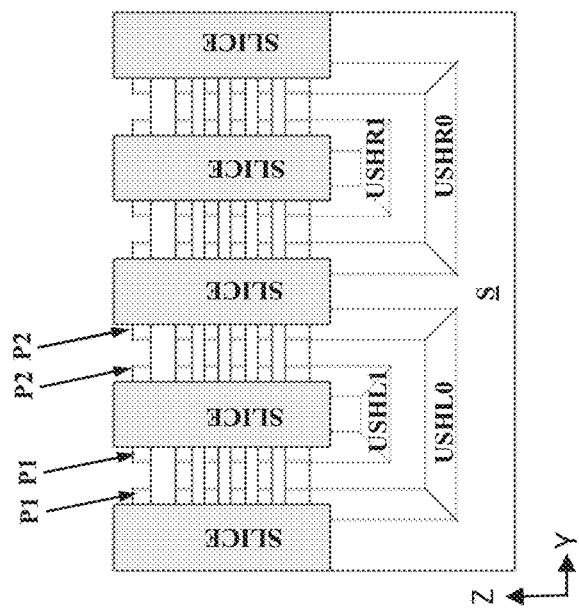
FIGS. 3A, 3B and 3C are views similar to those of FIGS. 1A, 1B and 1C, respectively, in a subsequent manufacturing phase.
Figure 3B:
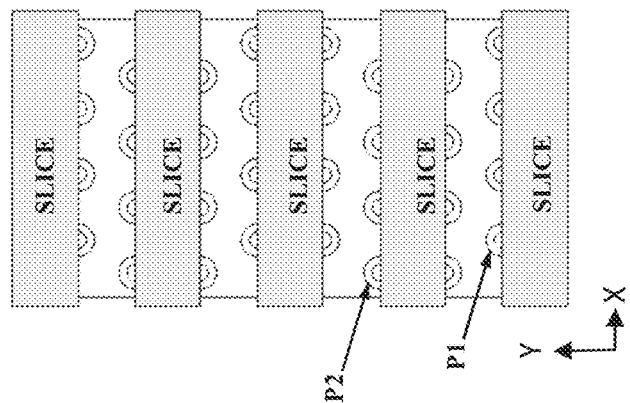
Figure 3A:
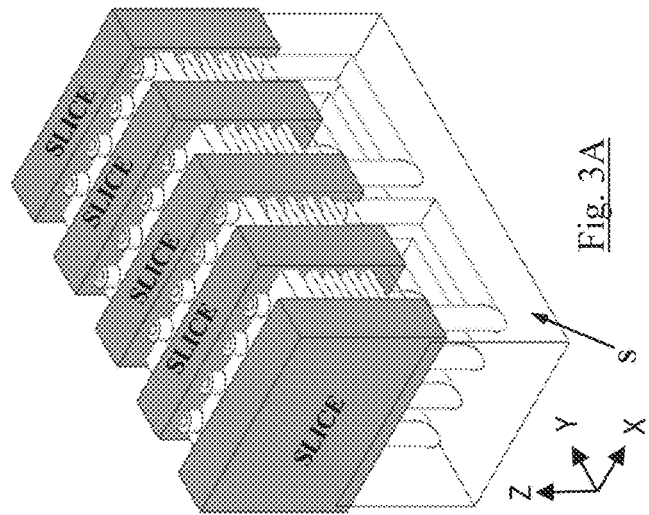

Turning now to FIGS. 3A, 3B and 3C, the structure is photolithographically "sliced" realizing (using known lithographic techniques) with regularity cuts and excavations to remove slices SLICE of structure (including the layers Sel of bit line and source line selectors and of control gate, and the intermediate layers thereof, down to the surface of the substrate S).

In particular, the slices SLICE which are removed have a substantially rectangular parallelepiped shape, with bases lying on XZ planes and heights along the Y direction. The removed slices SLICE have width such as to also affect the first and second pillars P1 and P2 of the U-shaped strings: the generic slice SLICE thus cuts pairs of rows (along the direction X) adjacent and consecutive in the direction Y of the first pillars P1 and/or the second P2 pillars belonging to the same U-shaped strings (in the figures, the first and last slices SLICE seem to cut only one row of first pillars P1, but this is only due to the fact that in the figures a portion of the matrix of cells of total memory is shown).

The width along the Y direction of the slices SLICE is preferably, but not limitatively, such that the pillars P1 and P2 of the U-shaped strings are cut in half, that is (in the example of cylindrical pillars P1 and P2) along their diameter in the X direction. Therefore, the widths of the slices SLICE are in this case equal to the distances Py between the two rows of adjacent pillars P1, P2 which are affected by the cut, which distances Py being, as explained above, at the least equal to the minimum distance D allowed by the technology (since the pillars P1 and P2 of the rows of pillars that are affected by the cut are facing each other, not being offset, since they belong to the same U-shaped strings). Moreover, in alternative embodiments, it is possible to size the width of the slices SLICE in such a way that the pillars P1 and P2 of the U-shaped strings are cut for less or more than half of them.

FIGS. 4A, 4B and 4C show the structure after the removal of the slices SLICE. Thanks to this operation, in which the layers of material CG which will form the control gates of the memory cells, the layer Sel of the bit line and source line selectors and the intermediate layers are selectively cut and removed, the control gates CG00-CG07 and CG10-CG17 of the memory cells are defined, the bit line selectors BLS0, BLS1 are defined and the source line selectors SLS0, SLS1 are defined. In greater detail, the control gates CG00-CG03 belong to the memory cells stacked along the second pillar P2 of the U-shaped strings of the first packet, and the control gates CG04-CG07 belong to the memory cells stacked along the first pillar P1 of the U-shaped strings of the first packet; similarly, the control gates CG10-CG13 belong to the memory cells stacked along the second pillar P2 of the U-shaped strings of the second packet, and the control gates CG14-CG17 belong to the memory cells stacked along the first pillar P1 of the U-shaped strings of the second packet. A first group of bit line selectors BLS0 comprises respective bit line selectors for each of the first pillars P1 of the U-shaped strings of the first packet, and a second group of bit line selectors BLS1 comprises respective bit line selectors for each of the first pillars P1 of U-shaped strings of the second packet. A first group of source line selectors SLS0 comprises source line selectors for each of the second pillars P2 of the U-shaped strings of the first packet, and a second group of source line selectors SLS1 comprises source line selectors for each of the second pillars P2 of the U-shaped strings of the second packet. It is noted that the two groups of source line selectors SLS0 and SLS1 are disposed substantially towards the center of the structure, while the two groups of bit line selectors BLS0 and BLS1 are arranged on the two sides (in the Y direction) of the structure. The first group of bit line selectors BLS0 is superimposed on the control gates CG04-CG07, the first group of source line selectors SLS0 is superimposed on the control gates CG00-CG03, the second group of source line selectors SLS1 is superimposed on the control gates CG10-CG13 and the second group of bit line selectors BLS1 is superimposed on the control gates CG14-CG17.

Preferably, the spaces left empty by the removal of the slices SLICE are filled with an insulating filling material FILLER, for example a dielectric material and/or an oxide, as shown in FIG. 5. The insulating material FILLER is then selectively removed centrally from the spaces left empty by the removal of the slices SLICE, remaining along the walls of the spaces themselves, so as to isolate the bit line selectors, the source line selectors, the control gates and the pillars P1, P2.

In the following figures, the insulating filling material FILLER remaining after the selective removal within the spaces left empty by the removal of the slices SLICE is no longer shown, in order not to render the figures scarcely intelligible.

As can be seen in FIGS. 6A-6E, contacts are subsequently formed of electrically conductive material (e.g., metal material, such as aluminum or tungsten, or polysilicon) to the pillars P1 and P2 of the U-shaped strings, for the subsequent connection to bit lines (bit line contacts Pc and BLc) and to source lines (source line contacts SLc). In particular, the bit line contacts can for example comprise a first contact portion Pc to the first pillars P1 of the U-shaped strings, of a dimension substantially corresponding to the size Rp of the first pillars P1, and a second contact portion BLc, for example of reduced size with respect to the first contact portion Pc, for the contact to the respective bit line, said second contact portion BLc being intended for physical and electrical contact with the first contact portion Pc.

Again with reference to FIGS. 6A-6E, after the formation of the contacts the source lines SL are created and then, above the source lines SL, the bit lines BL0-BL7 are formed; both the source lines SL and the bit lines BL0-BL7 are made of electrically conductive material, for example in two different layers (levels) of metallic material, or the source lines SL are made starting from a polysilicon layer and the bit lines BL0-BL7 are made of an overlying metal layer.

In the example shown in the drawings, 2 source lines SL are formed, one that contacts the second pillars P2 of the 8 U-shaped strings of the first packet and the other that contacts the second pillars P2 of the 8 U-shaped strings of the second packet (however, nothing would prevent from creating a single, unique source line SL which contacts the second pillars P2 of the 8 U-shaped strings of both the first and second packets). Still in the example considered, 8 bit lines BL0-BL7 are formed, each of which contacts two respective first pillars P1, one belonging to a U-shaped string of the first packet and the other belonging to a U-shaped string of the second packet. The source lines SL extend parallel to each other in the direction X, while the bit lines BL0-BL7 extend parallel to each other in the direction Y, transversally to the source lines SL. Each of the 8 bit lines BL0-BL7 overlies a respective row (along the Y direction) of (2) pairs of first pillars P1 and second pillars P2.

Figure 6A:
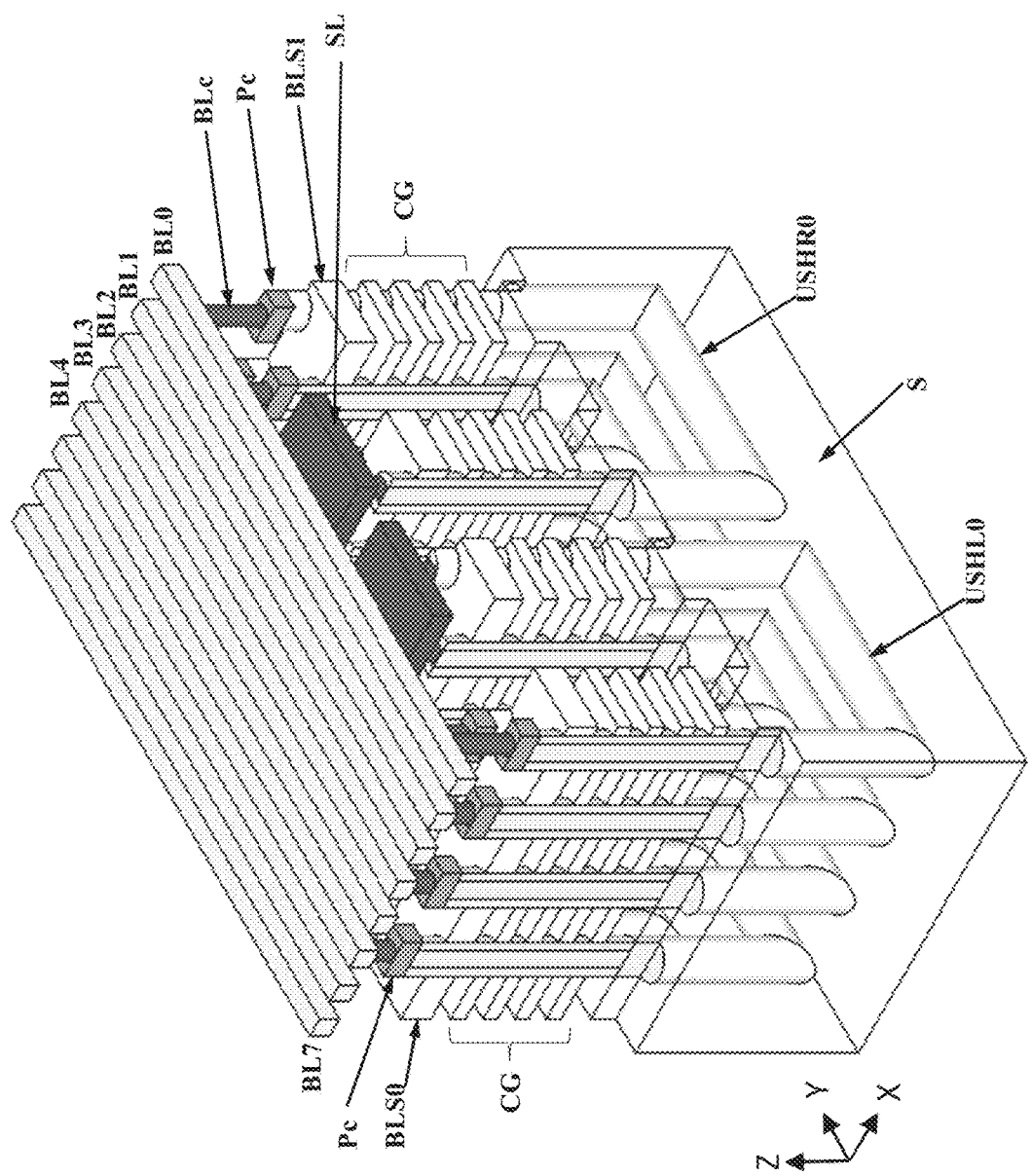
FIG. 6A is a view similar to that of FIG. 5, in a subsequent manufacturing phase.
Figure 6E:
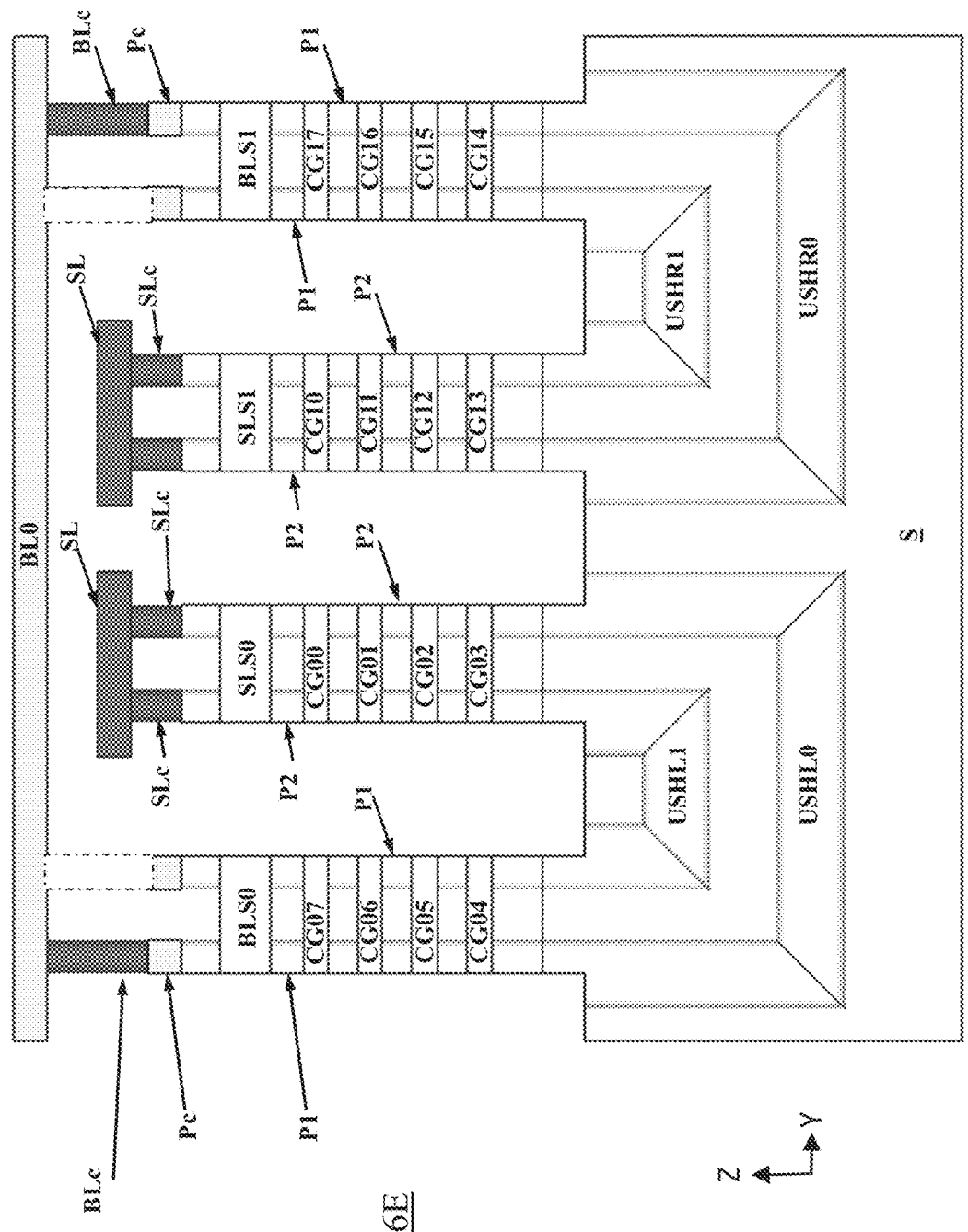
Figure 7:
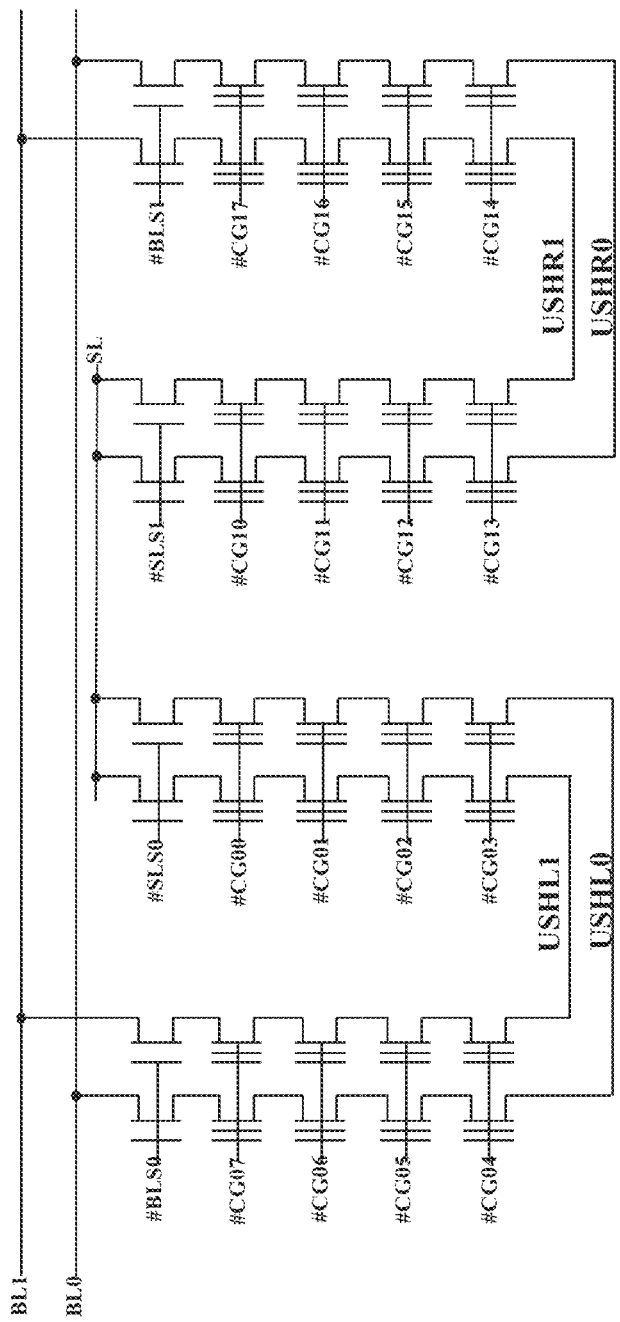
FIG. 7 shows the equivalent electrical circuit of the structure of FIG. 6A.

FIG. 7 is an electrical equivalent circuit diagram of the structure visible in FIG. 6A (limited to the first two bit lines BL0 and BL1). The 2 bit line selectors of each of the 2 groups of bit line selectors BLS0, BLS1 are controlled by a respective common bit line selection command signal #BLS0, #BLS1. By activating the bit line selectors BLS0, BLS1 it is possible to selectively electrically connect the U-shaped strings of the first and second packet of U-shaped strings to the respective bit line BL0, BL1. The 2 source line selectors of each of the two groups of source line selectors SLS0 and SLS1 are controlled by a respective common source line selection command signal #SLS0, #SLS1. By activating the source line selectors SLS0, SLS1 it is possible to electrically connect in a selective manner the U-shaped strings of the first and second packet of U-shaped strings to the respective source line SL. The control gates CG00-CG03, CG04-CG07, CG10-CG13, CG14-CG17 of the memory cells are controlled by respective control gate selection command signals #CG00-#CG03, #CG04-#CG07, #CG10-#CG13 and #CG14-#CG17. The bit line selection command signals #BLS0, #BLS1, the common source line selection command signals #SLS0, #SLS1, and the control gate selection command signals #CG00-#CG03, #CG04-#CG07, #CG10-#CG13 and #CG14-#CG17 are generated by decoding circuits of memory cell addressing signals (not shown). The control gates CG00-CG03, CG04-CG07, CG10-CG13 and CG14-CG17 constitute the word lines of the memory.

FIGS. 8A-8C show an elementary unit of a memory array according to the first embodiment of the solution described herein. By mirroring the elementary unit with respect to an XZ plane, the matrix portion represented in FIGS. 6A-6E is obtained, which, replicated (side by side) several times along the X and Y directions, gives rise to a matrix of memory cells of any size.

Thanks to the fact that the cut and removal of the slices SLICE, which allow to define the control gates, the source line selectors and the bit line selectors, are performed on an array of U-shaped strings with regular pattern along the X and Y directions, involving at least partly the same pillars of the U-shaped strings, it is not necessary to provide distances (along the Y direction) between the pillars greater than the minimum distance D between the centers of the adjacent pillars P1, P2 allowed by the technological constraints (minimum "feature size").

Instead, making reference for example to FIG. 5 of U.S. 2014/0293695, it is noted that in the known architectures, in order to define the control gates, the source line selectors and the bit line selectors, it is necessary, every two rows of pillars (in the direction indicated with "row direction"), to space apart the rows of pillars P1 and P2 by more than the minimum distance allowed by the photolithographic technology between the centers of the pillars of adjacent rows of pillars. Similar considerations apply to architectures described in U.S. 2015/017771 (for example, see FIG. 5B).

In other words, thanks to the proposed solution, it is possible to maintain the distance (in the Y direction) between the consecutive rows of pillars P1 and P2 to the minimum value Py allowed by the technology (i.e., the minimum distance D between the centers of the pillars P1 and P2 allowed by the technology) also in correspondence of those areas in which the cuts and the removal of the slices SLICE are made, which allow to define the control gates, the source line selectors and the bit line selectors.

Second Embodiment

A second embodiment of a memory cell array architecture for a 3D semiconductor memory is shown in FIGS. 9-14, which correspond, in terms of the views shown, to FIGS. 1A-1F and 3-7 of the first embodiment.

The architecture according to the second embodiment differs from that according to the first embodiment in that the two packets of 8 U-shaped strings are not symmetrical, specular with respect to a plane parallel to the XZ plane: as visible for example in FIG. 9B, the arrangement of the 8 U-shaped strings of one of the packets, for example the packet at the top of the figure, corresponds to the arrangement of the U-shaped strings of the other packet (at the bottom of the figure) with respect to the plane with line A-A and overturned with respect to a plane with line B-B, parallel to the YZ plane, which is the median plane, along the direction Y, of the matrix portion shown in the figure. In this way, first U-shaped strings (i.e., U-shaped strings whose first and second pillars P1 and P2 are spaced apart from each other by a first distance and extend into the substrate S down to a first depth) of the first packet are no longer facing, in the Y direction, first U-shaped strings of the second packet, facing instead the spaces between the first U-shaped strings of the second packet. As a result, while in the first embodiment, by looking for example FIG. 1B, there were three pillar alignments (first pillars P1 or second pillars P2) facing in the direction Y, in the second embodiment there are only two arrays of pillars facing in the direction Y. In particular, all the second pillars P2 are arranged, moving along the Y direction, with a zig-zag pattern. This different arrangement allows to realize a more compact structure in the Y direction (in particular, in the area of the source line selectors): in fact, with reference to FIG. 1G, thanks to the arrangement of the pillars P1, P2 of the second embodiment, it is possible to maintain, for a greater number (5 instead of 4) of pairs of rows of pillars P1, P2 with respect to the first embodiment, a distance Py between the adjacent rows of pillars P1, P2 in the Y direction a distance less than the minimum distance D between the centers of the pillars imposed by the technology constraints. In other words, the increased staggering of the arrangement of the pillars makes it possible an even greater compactness of the structure in the Y direction with respect to the first embodiment.

Another difference with respect to the first embodiment is the presence of just one, single source line SL, in place of the two source lines SL provided for in the first embodiment. Nevertheless, also in this case nothing would prevent the creation of a pair of source lines SL, as in the first embodiment.

Also in this second embodiment, as in the first embodiment, 8 bit lines BL0-BL7 are provided. Each of the 8 bit lines BL0-BL7 overlies a respective row (along the Y direction) of (2) pairs of first pillars P1 and second pillars P2.

Third Embodiment

A third embodiment of a memory cell array architecture for a 3D semiconductor memory is shown in FIGS. 15-21, which correspond, in terms of the views shown, to FIGS. 1A-1F and 3-8 of the first embodiment.

The architecture according to the third embodiment differs from that according to the first embodiment in that in each of the two packets of 8 U-shaped strings each first U-shaped string (i.e., the U-shaped string whose first and second pillars P1 and P2 are spaced apart from each other by a first distance and extend into the substrate S down to a first depth) is aligned in the Y direction to a respective second U-shaped string (i.e., the U-shaped string whose first and second pillars P1 and P2 are spaced apart from each other a second distance, less than the first distance, and extend into the substrate S down to a second depth, less than the first depth), so that every second U-shaped string is enclosed (in the Y direction and also in the Z direction) by a respective first U-shaped string. The two packets of 8 U-shaped strings are also mirrored on the plane parallel to the XZ plane with trace A-A indicated in FIG. 15B. There are therefore, in the Y direction, 4 rows of pillars P1, P2 (2 pillars P1, followed by 2 pillars P2, followed by 2 pillars P2 and finally followed by two pillars P1).

In other words, in the architecture according to the third embodiment, there is no staggering of the pillars P1, P2 of rows along the X direction which are adjacent in the Y direction. Accordingly, the distance Py between rows of pillars P1, P2 adjacent along the direction Y is always at the least equal to the minimum distance D between the centers of the adjacent pillars P1, P2 permitted by the technology constraints, and may never be less than such distance. The compactness of the structure in the Y direction is smaller with respect to both the second embodiment and the first embodiment.

As in the previous embodiments, also in the third embodiment 8 bit lines BL0-BL7 are provided. However, since the rows of pillars P1, P2 along the Y direction are now only 4, each row of pillars P1, P2 along the Y direction is overhung by a pair of adjacent bit lines. Moreover, the width Rp along the X direction of the generic pillar P1, P2 is smaller than the maximum width along the X direction of a pair of adjacent bit lines. To be able to make the bit lines contact the pillars below them, the pillar contacts Pc are made of a width along the direction X greater than the width Rp of the pillars P1 and P2, and the bit line contacts BLc are suitably formed at one end and the other of the pillar contacts Pc, as visible for example in FIG. 19C.

As in the first embodiment, 2 source lines SL are formed, but nothing would prevent forming a single, unique source line SL, as in the second embodiment.

Fourth Embodiment

A fourth embodiment of a memory cell array architecture for a 3D semiconductor memory is shown in FIGS. 22-29; FIGS. 22-28 correspond, in terms of the views shown, to FIGS. 1A-1F and 3-8 of the first embodiment.

Unlike the previously described embodiments, in the architecture according to the fourth embodiment there are no U-shaped strings of memory cells with first and second pillars P1, P2 having different mutual distances along the Y direction and with different depths in Z direction: all the U-shaped strings have equally spaced apart first and second P1 and P2 and with equal depths in Z direction (in other words, all the lower or buried tubular portions of the U-shaped string are at the same depth in the substrate S). The structure of the memory changes in that there is an alternation, in the Y direction, of pairs of first pillar P1 and second pillar P2 of a U-shaped string and of second pillar P2 and first pillar P1 of a subsequent U-shaped string along the Y direction (in other words, starting from one end of the shown matrix portion and moving along the direction Y, there is a first pillar P1, followed by two second pillars P2, followed by two first pillars P1, and so on). The source line selectors (which are associated with the second pillars P2 of the U-shaped strings) are no longer made only at the center of the structure, but there is an alternation (in the direction Y) of bit line selectors and source line selectors, as visible for example in FIG. 26E. Furthermore, there are two source lines SL.

Furthermore, as shown for example in FIG. 22B, there are four zig-zag sequences in the Y direction of U-shaped strings.

FIG. 29A shows a portion of a memory cell array formed by two blocks BLOCK0 and BLOCKn, where each block BLOCK0, BLOCKn includes two of the elementary units of FIG. 26E placed side by side. The generic block BLOCK0, BLOCKn constitutes the smallest individually erasable memory unit. The two blocks are separated by a cut, indicated with the reference numeral SLIT, of the layers of material constituting the bit line selectors BLS0 and the control gates CG7, CG6, CG5 and CG4. The cut SLIT serves to physically and electrically isolate the two blocks arranged side-by-side.

FIG. 29B shows, similarly to FIG. 29A, a portion of memory cell array constituted by two blocks BLOCK0 and BLOCKn, where each block BLOCK0, BLOCKn now includes three of the elementary units of FIG. 26E placed side-by-side.

As a consequence of the arrangement of the pillars P1 and P2, with rows (in the X direction) of first and second pillars P1 and P2 facing each other, the structure according to the fourth embodiment is slightly less compact than the structure according to the first and the second embodiments. In fact, there are only 3 rows of pillars P1, P2 adjacent in the Y direction in which the pillars P1, P2 are offset (staggered) in the X direction. As explained above, only for such 3 rows of pillars the distance Py between them may be less than the minimum distance D between the centers of adjacent pillars P1, P2 allowed by the technology constraints.

The fact of having buried U-shaped string portions all at the same depth in the substrate S reduces the complexity of the manufacturing process.

Fifth Embodiment

A fifth embodiment of a memory cell array architecture for a 3D semiconductor memory is shown in FIGS. 30-37, which correspond, in terms of views shown, to FIGS. 22-29 of the fourth embodiment.

As in the fourth embodiment, also in the fifth embodiment all the U-shaped strings have first and second pillars P1 and P2 equally spaced apart and with equal depths in the Z direction (all the lower tubular or buried U-shaped string portions are at the same depth in the substrate S). There is an alternation, in the Y direction, of first pillars P1 and second pillars P2, and therefore also in the fifth embodiment there is an alternation (in Y direction) of bit line selectors and source line selectors, as visible for example in FIG. 34E.

A difference with respect to the fourth embodiment resides in that (with a certain similarity to the third embodiment) there are not four zig-zag sequences of U-shaped strings in the direction Y, rather four alignments of U-shaped strings, as visible for example in FIG. 30B. Compared to the fourth embodiment, there are no pairs of rows (along the X direction) of adjacent pillars P1, P2 in the direction Y in which the pillars P1, P2 are staggered. As a result, the minimum distance Py between pairs of adjacent pillar rows in the Y direction cannot be less than the minimum distance D allowed by the technology between the centers of adjacent pillars P1, P2.

With this different arrangement of U-shaped strings, the number of bit lines is halved. As visible, for example, in FIG. 34A, there are 4 bit lines BL0-BL3, instead of the 8 bit lines BL0-BL7. In particular, there is a bit line for each of the four alignments (in the Y direction) of U-shaped strings.

FIGS. 37A and 37B show, similarly to FIGS. 29A and 29B, portions of the memory cell array constituted by two blocks BLOCK0 and BLOCKn, where each block BLOCK0, BLOCKn includes two, respectively three of the elementary units of FIG. 34E.

§§§§§

The architectures according to the described solution proposed in this document allow to obtain very compact structures, and consequently memories with high data storage capacity per unit area.

It is possible to make some general remarks.

A first remarks is that those architectures with a greater number of rows (in the X direction) of staggered P1, P2 pillars that are adjacent in the Y direction are those that allow to obtain a greater compactness of the structure, since the distance Py between such rows of adjacent pillars may be smaller than the minimum distance D allowed by the technology between the centers of adjacent pillars.

A second remarks is that those architectures with U-shaped strings having buried U-shaped string portions at different depths in the substrate imply a greater constructive complexity.

What is claimed is:

1. A 3D memory device comprising:
   a substrate;
   a plurality of U-shaped memory cells strings each including a buried string portion formed in the substrate, a first, bit line-side string portion or pillar and a second, source line-side string portion or pillar, wherein the buried string portion is connected to a first end of the first string portion and to a first end of the second string portion, each one of the U-shaped memory cells strings including a stack of memory cells along the first string portion and a stack of memory cells along the second string portion;
   bit line selectors arranged at a second end of the first string portions opposed to the first end, for the selective connection to respective bit lines;
   source line selectors arranged at a second end of the second string portions opposed to the first end, for the selective connection to respective source lines;
   first groups of first string portions, wherein in each first group the first string portions are aligned along a first direction to form a respective first row of first string portions;
   second groups of second string portions, wherein in each second group the second string portions are aligned along the first direction to form a respective second row of second string portions;
   wherein the first rows of first string portions and the second rows of second string portions follow one another, alternately or in pairs, along a second direction transversal to the first direction;
   wherein first rows of first string portions and/or second rows of second string portions consecutive along said second direction are spaced apart from each other a respective distance;
   the 3D memory device comprising a respective slit between a first row of first string portions and a second row of second string portions being consecutive along said second direction and spaced apart a distance equal to or less than a minimum distance allowed by a resolution of the manufacturing technology, wherein said slit extends in a third direction, orthogonal to said first and second directions, from said second end down to the substrate, said slit interrupting layers forming the bit line selectors and the source line selectors and control gates of the memory cells of the memory cells stacks formed along the first and second string portions; and wherein said slit has dimension, along said second direction, less than, equal to or higher than said minimum distance, and walls of the slit lying in planes parallel to said first and third directions delimit the first and second string portions.

2. The memory device of claim 1, wherein:
said plurality of U-shaped memory cells strings comprises first U-shaped memory cells strings whose first and second pillars are spaced apart from each other a first distance in said second direction and extend into the substrate down to a first depth, and second U-shaped memory cells strings whose first and second pillars are spaced apart from each other a second distance in said second direction, less than, for example about half of, the first distance, and extend into the substrate down to a second depth, less than, for example about half of, the first depth.

3. The memory device of claim 1, wherein:
all the U-shaped memory cells strings of said plurality have the first and second pillars spaced apart from each other a same distance in said second direction and extending into the substrate down to a same depth.

4. The memory device of claim 1, wherein:
pairs of first and/or second rows consecutive along said second direction have the respective first and/or second pillars arranged mutually staggered, diagonally with respect to the first and second directions, such that the first or second pillars of a row of the pair of first and/or second rows face the spaces between the first or second pillars of the other row of the pair first and/or second rows.

5. The memory device of claim 1, wherein:
pairs of first and/or second rows consecutive along said second direction have the respective first and/or second pillars arranged aligned in said second direction, such that the first or second pillars of a row of the pair of first and/or second rows face the first or second pillars of the other row of the pair first and/or second rows.

6. The memory device of claim 1, wherein:
said plurality of U-shaped memory cells strings comprises blocks of U-shaped memory cells strings, each block comprising two packets of U-shaped memory cells strings;
wherein a first packet of said two packets comprises, arranged in succession along the second direction:
 a first row of first string portions;
 a second row of second string portions belonging to the same U-shaped memory cells strings as the first string portions of the first row;
 a further second row of second string portions; and
 a further first row of first string portions belonging to the same U-shaped memory cells strings as the second string portions of the further second row; and
wherein a second packet of said two packets, following the first packet in said second direction, comprises, arranged in succession along the second direction:
 a first row of first string portions;
 a second row of second string portions belonging to the same U-shaped memory cells strings as the first string portions of the first row;
 a further second row of second string portions; and
 a further first row of first string portions belonging to the same U-shaped memory cells strings as the second string portions of the further second row.

7. The memory device of claim 1, wherein:
said plurality of U-shaped memory cells strings comprises blocks of U-shaped memory cells strings, each block comprising two packets of U-shaped memory cells strings;
wherein a first packet of said two packets comprises, arranged in succession along the second direction:
 a first row of first string portions;
 a further first row of first string portions belonging to other U-shaped memory cells strings;
 a second row of second string portions belonging to the same U-shaped memory cells strings as the first string portions of the further first row; and
 a further second row of second string portions belonging to the same U-shaped memory cells strings as the first string portions of the first row; and
wherein a second packet of said two packets, following the first packet in said second direction comprises, arranged in succession along the second direction:
 a second row of second string portions;
 a further second row of second string portions;
 a first row of first string portions belonging to the same U-shaped memory cells strings as the second string portions of the further second row; and
 a further first row of first string portions belonging to the same U-shaped memory cells strings as the second string portions of the second row.

8. A method of making a three-dimensional, 3D, memory device, the method comprising:
forming a plurality of U-shaped memory cells strings each including a buried string portion formed in a substrate, a first, bit line-side string portion or pillar and a second, source line-side string portion or pillar, wherein the buried string portion is connected to a first end of the first string portion and to a first end of the second string portion, each one of the U-shaped memory cells strings including a stack of memory cells along the first string portion and a stack of memory cells along the second string portion;
forming layers intended to form bit line selectors and source line selectors and control gates of the memory cells stacks formed along the first and second string portions;
with first groups of first string portions aligned along a first direction to form a respective first row of first string portions;
with second groups of second string portions aligned along the first direction to form a respective second row of second string portions;
wherein the first rows of first string portions and the second rows of second string portions follow one another, alternately or in pairs, along a second direction transversal to the first direction;
wherein first rows of first string portions and/or second rows of second string portions consecutive along said second direction are distant from each other a respective distance;
the method comprising forming, between a first row of first string portions and a second row of second string portions being consecutive along said second direction and distant a distance equal to or less than the minimum distance allowed by a resolution of the manufacturing technology, a respective slit that extends in a third direction, orthogonal to said first and second directions, from said second end to the substrate, said slit interrupting layers forming the bit line selectors and the source line selectors and control gates of the memory cells of the memory cells stacks formed along the first and second string portions, and wherein said slit has dimension, along said second direction, less than, equal to or higher than said minimum distance, and walls of the slit lying in planes parallel to said first and third directions delimit the first and second string portions.

* * * * *